(12) United States Patent
Yoo et al.

(10) Patent No.: US 10,964,794 B2
(45) Date of Patent: Mar. 30, 2021

(54) CRYOGENIC SEMICONDUCTOR DEVICE HAVING BURIED CHANNEL ARRAY TRANSISTOR

(71) Applicant: SK hynix Inc., Icheon (KR)

(72) Inventors: Min-Soo Yoo, Yongin-si (KR);
Sung-Min Park, Incheon (KR)

(73) Assignee: SK hynix Inc., Icheon-si (KR)

(*) Notice: Subject to any disclaimer, the term of this patent is extended or adjusted under 35 U.S.C. 154(b) by 68 days.

(21) Appl. No.: 16/240,111

(22) Filed: Jan. 4, 2019

(65) Prior Publication Data
US 2019/0393320 A1 Dec. 26, 2019

(30) Foreign Application Priority Data
Jun. 26, 2018 (KR) .................. 10-2018-0073177

(51) Int. Cl.
| | |
|---|---|
| *H01L 29/423* | (2006.01) |
| *H01L 29/08* | (2006.01) |
| *H01L 29/06* | (2006.01) |
| *H01L 21/28* | (2006.01) |
| *H01L 21/265* | (2006.01) |
| *H01L 29/49* | (2006.01) |

(52) U.S. Cl.
CPC .. *H01L 29/42376* (2013.01); *H01L 21/26513* (2013.01); *H01L 21/28061* (2013.01); *H01L 21/28114* (2013.01); *H01L 29/0642* (2013.01); *H01L 29/0847* (2013.01); *H01L 29/4236* (2013.01); *H01L 29/4925* (2013.01)

(58) Field of Classification Search
CPC ........... H01L 29/42376; H01L 29/0847; H01L 29/4236; H01L 29/0642; H01L 29/4925; H01L 29/1041; H01L 21/28061; H01L 21/28114; H01L 21/26513; H01L 27/10814; H01L 27/10823; H01L 27/10876
See application file for complete search history.

(56) References Cited

U.S. PATENT DOCUMENTS

| | | | |
|---|---|---|---|
| 5,057,898 A * | 10/1991 | Adan | ................... H01L 21/8221 257/369 |
| 9,356,029 B2 | 5/2016 | Oh et al. | |
| 9,704,961 B2 | 7/2017 | Jang | |
| 9,818,843 B2 | 11/2017 | Oh et al. | |
| 2005/0173744 A1* | 8/2005 | Kim | ................... H01L 27/10876 257/296 |
| 2011/0159679 A1* | 6/2011 | Kim | ................... H01L 29/4236 438/589 |
| 2016/0315088 A1 | 10/2016 | Kang et al. | |
| 2018/0053769 A1* | 2/2018 | Kim | ................... H01L 27/10823 |

\* cited by examiner

*Primary Examiner* — Kyoung Lee
*Assistant Examiner* — Christina A Sylvia

(57) ABSTRACT

A cryogenic semiconductor device includes isolation regions defining an active region having a first P-type ion concentration in a substrate, a gate structure in the substrate, and an ion implantation region having a second P-type ion concentration in the active region below the gate structure, wherein the gate structure includes a gate dielectric layer conformally disposed on inner sidewalls of a gate trench, a lower gate electrode disposed on the gate dielectric layer, and an upper gate electrode disposed on the lower gate electrode, wherein the lower gate electrode has a relatively lower work function than the upper gate electrode.

20 Claims, 52 Drawing Sheets

CRYOGENIC SEMICONDUCTOR DEVICE HAVING BURIED CHANNEL ARRAY TRANSISTOR

CROSS-REFERENCE TO RELATED APPLICATIONS

The present patent application claims priority under 35 U.S.C. § 119(a) to Korean Patent Application No. 10-2018-0073177, filed on Jun. 26, 2018, which is incorporated herein by reference in its entirety.

BACKGROUND

1. Field

The present disclosure relates generally to a cryogenic semiconductor device. More particularly, the present disclosure relates to a cryogenic semiconductor device including a buried channel array transistor.

2. Description of the Related Art

Recently, a cryogenic semiconductor device having a buried channel array transistor has been proposed as a next-generation semiconductor device. A cryogenic semiconductor device has excellent characteristics such as high-speed operation, low power consumption, pattern miniaturization, improvement in degree of integration, increase in data retention time, and extension of a refresh cycle. However, problems can arise such as data damage due to row hammering phenomena attributable to increases in word line access, and such as the rise in threshold voltage when the device operates in a cryogenic range.

SUMMARY

Exemplary embodiments of the present disclosure include cryogenic semiconductor devices, each including gate electrodes having multiple work functions for decreasing a threshold voltage and a buried channel array transistor having an ion implantation region for increasing the threshold voltage, as well as methods for forming cryogenic semiconductor devices.

The present disclosure is not limited to the above-mentioned embodiments, and other embodiments not mentioned may be clearly understood by those skilled in the art from the following description.

In accordance with an embodiment of the present disclosure, a cryogenic semiconductor device may include isolation regions defining an active region having a first P-type ion concentration in a substrate, a gate structure disposed in the substrate, and an ion implantation region having a second P-type ion concentration and disposed in the active region below the gate structure. The gate structure may include a gate dielectric layer conformally disposed on inner sidewalls of a gate trench, a lower gate electrode disposed on the gate dielectric layer, and an upper gate electrode disposed on the lower gate electrode. The lower gate electrode may have a relatively lower work function than the upper gate electrode.

The lower gate electrode may include polysilicon doped with an N-type ion.

The lower gate electrode may be conformally disposed on the gate dielectric layer in a lining shape.

The cryogenic semiconductor device may further include an intermediate gate electrode disposed between the lower gate electrode and the upper gate electrode.

The intermediate gate electrode may include a barrier metal.

The intermediate gate electrode may be conformally disposed on the lower gate electrode in a lining shape.

The upper gate electrode may include a metal, a metal alloy, or a metal compound.

The upper gate electrode may fill the gate trench and have a rail shape extending horizontally.

The cryogenic semiconductor device may further include a capping gate electrode covering an upper surface of the upper gate electrode.

The capping gate electrode may include a lower capping gate electrode, and an upper capping gate electrode disposed on the lower capping gate electrode.

The lower capping gate electrode may include a barrier metal, and the upper capping gate electrode may include polysilicon doped with an N-type ion.

In accordance with an embodiment of the present disclosure, a cryogenic semiconductor device may include isolation regions defining an active region in a substrate, a gate structure disposed in the substrate, and an ion implantation region disposed in the active region below the gate structure. The gate structure may include a gate dielectric layer conformally disposed on inner sidewalls of a gate trench, a lower gate electrode disposed on the gate dielectric layer, an intermediate gate electrode disposed on the lower gate electrode, and an upper gate electrode disposed on the intermediate gate electrode. The lower gate electrode may have a relatively low work function, and the upper gate electrode may have a relatively low resistance.

The active region may have a relatively low P-type ion concentration, and the ion implantation region may have a relatively high P-type ion concentration.

The lower gate electrode may include polysilicon doped with an N-type ion.

The intermediate gate electrode may include a titanium nitride.

The upper gate electrode may include a metal.

The lower gate electrode may be conformally disposed to surround a bottom surface and side surfaces of the intermediate gate electrode.

The intermediate gate electrode may be conformally disposed to surround a bottom surface and side surfaces of the upper gate electrode.

The cryogenic semiconductor device may further include an upper capping gate electrode covering an upper surface of the upper gate electrode. The upper capping gate electrode and the lower gate electrode may include the same material.

The cryogenic semiconductor device may further include a lower capping gate electrode disposed between the upper surface of the upper gate electrode and the upper capping gate electrode. The lower capping gate electrode and the intermediate gate electrode may include the same material.

The details of other embodiments are included in the detailed description and the drawings.

DETAILED DESCRIPTION

Figure 1A:
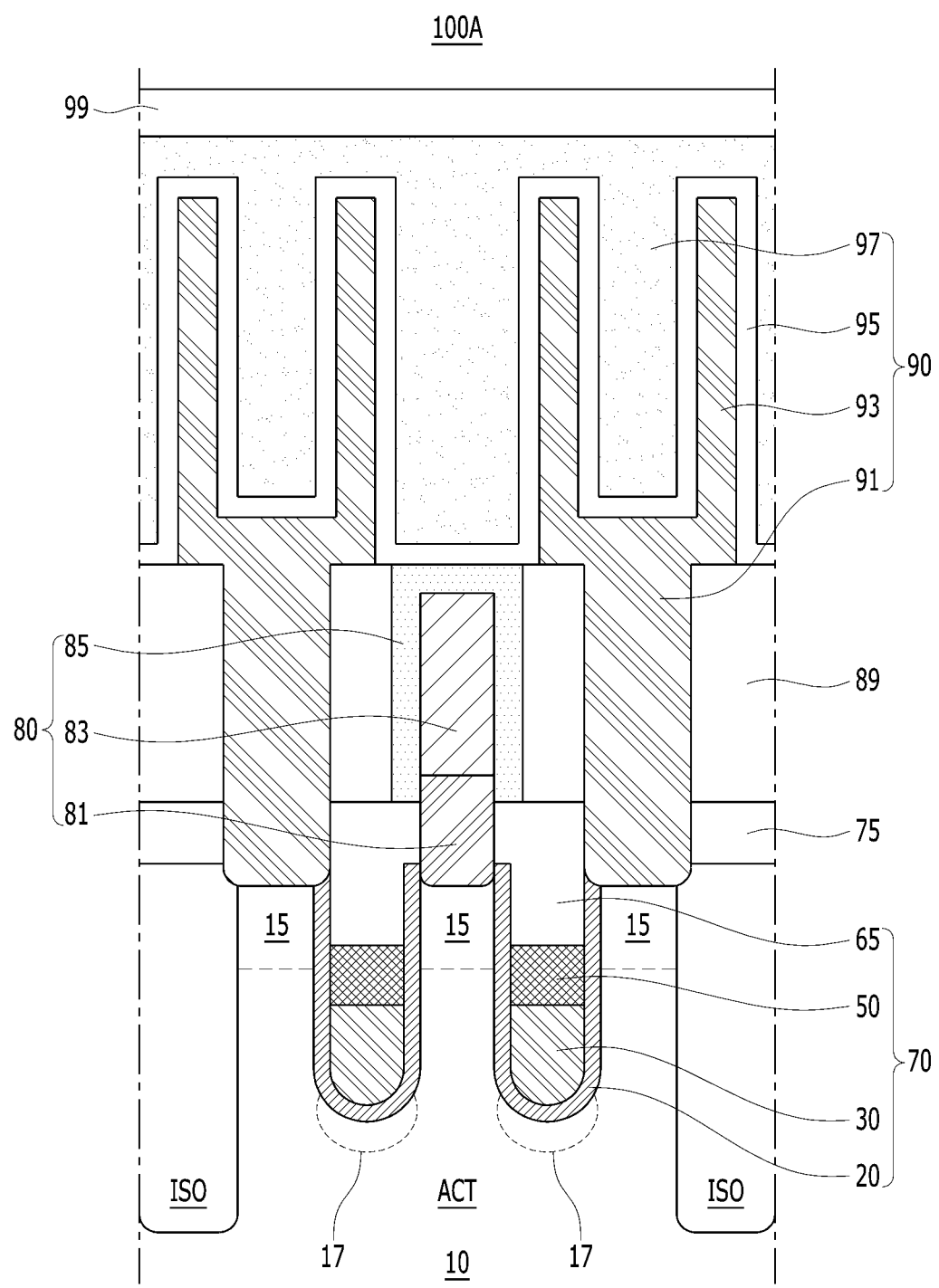
FIGS. 1A to 1F are cross-sectional views illustrating cryogenic semiconductor devices in accordance with various embodiments of the disclosure.

Various embodiments will be described below in more detail with reference to the accompanying drawings. Embodiments of the present disclosure may, however, have different forms and should not be construed as limited to the embodiments set forth herein. Rather, these embodiments are provided so that this disclosure will be thorough and complete, and will fully convey the scope of the claims to those skilled in the art.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

FIGS. 1A to 1F are cross-sectional views illustrating cryogenic semiconductor devices 100A to 100F in accordance with various embodiments of the disclosure.

Referring to FIG. 1A, the cryogenic semiconductor device 100A in accordance with an embodiment may include an isolation region ISO disposed in a substrate 10, which has an active region ACT, a gate structure 70 disposed in the active region ACT of the substrate 10, a lower interlayer dielectric layer 75, a bit line structure 80 and an intermediate interlayer dielectric layer 89 disposed on the lower interlayer dielectric layer 75, a storage structure 90, and an upper interlayer dielectric layer 99.

The substrate 10 may include a silicon wafer, an epitaxially grown monocrystalline silicon layer, a Silicon-On-Insulator (SOI), or a compound semiconductor layer. For purposes of illustration, the substrate 10 will be described below in a manner consistent with a silicon wafer. The substrate 10 may be doped at a low concentration with P-type ions such as boron (B).

The isolation region ISO may include a shallow trench isolation (STI) region. For example, the isolation region ISO may include an insulating material filling an isolation trench disposed in the substrate 10.

The active region ACT may include a well region corresponding to a bulk region, and a source/drain region 15 adjacent to its surface. The bulk region of the active region ACT may include P-type ions, and the source/drain region 15 may include N-type ions.

The gate structure 70 may have a shape or geometry consistent with being buried in or extending into the substrate 10. The gate structure 70 may include a gate dielectric layer 20, a lower gate electrode 30, an upper gate electrode 50 and a gate capping layer 65 that are disposed in a gate trench (e.g., "Tg" shown in FIG. 2C). An ion implantation region 17 can be located below the gate trench Tg in the active region ACT.

The gate dielectric layer 20 may be configured as a layer lining the inner walls of the gate trench Tg. The gate trench Tg may be a cylinder-like well, or as a slot-like element that extends in a linear direction through the substrate 10. In either example, the gate dielectric layer 20 can have a cup-like cross-sectional shape as illustrated in FIG. 1A that follows the same cross-sectional shape of the gate trench Tg. The gate dielectric layer 20 may include an oxidized silicon layer, a silicon oxide layer, or a metal oxide layer having a high dielectric constant such as a hafnium oxide layer ($HfO_x$).

The lower gate electrode 30 may have a rail-like shape or a plug-like shape in the gate trench Tg. A bottom surface and side surfaces of the lower gate electrode 30 may be surrounded by or be in contact with the gate dielectric layer 20. The upper surface of the lower gate electrode 30 may be located at a relatively lower level than the bottom surface of the source/drain region 15. The lower gate electrode 30 may include a conductor having a relatively low work function. For example, the lower gate electrode 30 may include polysilicon doped with an N-type ion such as phosphorous (P) or arsenic (As).

In a cryogenic range, a threshold voltage of a channel region of the gate structure 70 is typically greater than the threshold voltage of same device at room temperature. When the threshold voltage rises, however, a channel is reduced in size and effectiveness, and the channel may be difficult to generate. For this reason, the operation speed of the semiconductor device decreases, while the power consumption of the semiconductor device increases. In an embodiment, the lower gate electrode 30 includes polysilicon doped with an N-type ion having a relatively low work function to compensate for the increase in the threshold voltage of the channel region under cryogenic conditions. The lower gate electrode 30 includes polysilicon doped with the N-type ion has a lower work function, and can be turned on at a lower voltage level. In other words, a threshold voltage may be effectively decreased in the cryogenic range compared to devices with lower gate electrode 30 having material with a relatively higher work function.

The upper gate electrode 50 may have a rail-like shape or a plug-like shape on the lower gate electrode 30 in the gate trench Tg. The side surfaces of the upper gate electrode 50 may be surrounded by the gate dielectric layer 20. The upper surface of the upper gate electrode 50 may be located at a relatively higher level than the bottom surface of the source/drain region 15. The upper gate electrode 50 may include a conductor having a higher work function than the lower gate electrode 30. In some embodiments, the upper gate electrode 50 may include a conductor having a lower resistance than the lower gate electrode 30. For example, the upper gate electrode 50 may include a metal, a metal compound, or a metal alloy. The upper gate electrode 50 may include tungsten (W), as a non-limiting example. In other embodiments, the upper gate electrode 50 may include a conductor having a higher work function and a lower resistance than the lower gate electrode 30 and remain capable of forming an ohmic contact. For example, the upper gate electrode 50 may include a barrier metal, such as titanium nitride (TiN) as a non-limiting example.

The lower gate electrode 30, having polysilicon doped with the N-type ion, has a relatively high resistance compared with the upper gate electrode 50. Accordingly, an electrical resistance of the gate structure 70 may increase. Because the gate structure 70 also includes the upper gate electrode 50 having a relatively low resistance compared with the lower gate electrode 30, however, any increase in the electrical resistance of the gate structure 70 due to lower gate electrode 30 may be compensated for in whole or in part with upper gate electrode 50.

The gate capping layer 65 may be disposed on the upper gate electrode 50 to fully fill the gate trench Tg. Portions of the side surfaces of the gate capping layer 65 may be surrounded by the gate dielectric layer 20. The gate capping layer 65 may include a silicon nitride or a silicon oxide. In an embodiment, the gate capping layer 65 may include a silicon nitride.

The ion implantation region 17 may include P-type ions doped at a higher concentration than that of the well region of the active region ACT. In other words, the active region ACT may have a relatively low P-type ion concentration, and the ion implantation region 17 may have a relatively high P-type ion concentration. The gate structure 70 and the source/drain region 15 may form a buried channel array transistor structure. In the buried channel array transistor structure, the channel region may be formed in the active region ACT along the profile of the gate dielectric layer 20, i.e., common to or near gate dielectric layer 20. The well region of the active region ACT and the ion implantation region 17 may include P-type ions, while the source/drain region 15 may include N-type ions.

The ion implantation region 17 may increase the threshold voltage of the channel region by increasing the P-type ion concentration in the channel region. The polysilicon doped with the N-type ion having a low work function, such as potentially used in lower gate electrode 30, however, may have result in the effect of excessively lowering the threshold voltage. A material which may can be used in lower gate electrode 30 that results in a lower threshold voltage in the cryogenic range, without an excessive reduction in threshold voltage, has not yet been fully developed in connection with acceptable manufacturing processes. Niobium (Ni) or zinc (Zn) may be considered for usage in materials capable of lowering the threshold voltage to a limited degree without derogation to desirable functional characteristics. However, such material may be difficult to obtain or use as lower gate electrodes because stable manufacturing processes have not yet developed for these materials, which can also lead to higher unit prices for the devices. Accordingly, in the cryogenic range, the expected increase in threshold voltage can be addressed by a lower gate electrode with a relatively lower work function, while the risk of reducing threshold voltage excessively may be mitigated by increasing threshold voltage to a desired magnitude using the ion implantation region 17.

The lower interlayer dielectric layer 75 may be disposed on the substrate 10, the isolation region ISO and the gate structure 70. The lower interlayer dielectric layer 75 may include one of a silicon nitride layer, a silicon oxide layer, or a combination thereof. As an example, the lower interlayer dielectric layer 75 may include the same material as the gate capping layer 65.

The bit line structure 80 may include a lower bit line 81, an upper bit line 83, and a bit line capping spacer 85. The lower bit line 81 may be coupled to the central portion of the source/drain region 15 of the active region ACT in substrate 10 by vertically penetrating the lower interlayer dielectric layer 75. The lower bit line 81 may have a rail-like, column-like, or plug-like geometry. The lower bit line 81 may have an upper portion protruding in an upward direction relative to the upper surface of the lower interlayer dielectric layer 75. The lower bit line 81 may be a single layer including doped polysilicon, a metal, a metal silicide or a metal compound, or a multi-layer including any combinations thereof. The upper bit line 83 may have a rail-like shape. The upper bit line 83 may include a metal or a metal compound that is coupled to the lower bit line 81. The bit line capping spacer 85 may conformally cover the side surfaces and upper surface of the upper bit line 83 as well as exposed portions of the lower bit line 81 extending from the lower interlayer dielectric layer 75. The bit line capping spacer 85 may include a silicon nitride.

The intermediate interlayer dielectric layer 89 may be disposed to surround the exposed side surfaces of the bit line structure 80. The upper surface of the intermediate interlayer dielectric layer 89 may be substantially coplanar with the upper surface of the bit line structure 80.

The storage structure 90 may include a storage contact plug 91, a lower storage electrode 93, a storage dielectric layer 95, and an upper storage electrode 97. The storage contact plug 91 may be coupled to the source/drain region 15 of the active region ACT of the substrate 10. The storage contact plug 91 may penetrate through the intermediate interlayer dielectric layer 89 and the lower interlayer dielectric layer 75 to interface with source/drain region 15. The storage contact plug 91 may have a column-like geometry. The lower storage electrode 93 may have a cylinder-like shape. The storage contact plug 91 and the lower storage electrode 93 may include a conductor such as doped polysilicon, a metal, a metal silicide, a metal compound, a metal alloy, or any combinations thereof. The storage dielectric layer 95 may be conformally disposed on surfaces of the lower storage electrode 93 and upper surfaces of the intermediate interlayer dielectric layer 89 and the bit line structure 80. The storage dielectric layer 95 may include a silicon oxide, a silicon nitride, a metal oxide such as a hafnium oxide ($HfO_x$), a high-k material, or any combinations thereof. The upper storage electrode 97 may be disposed on the storage dielectric layer 95 to fill in areas between the lower storage electrodes 93. The upper storage electrode 97 may include doped polysilicon, a metal, a metal silicide, a metal compound, a metal alloy, or any combinations thereof.

The upper interlayer dielectric layer 99 may be disposed on the storage structure 90 and may be substantially flat or planar. The upper interlayer dielectric layer 99 may include a silicon nitride or a silicon oxide.

Figure 1B:
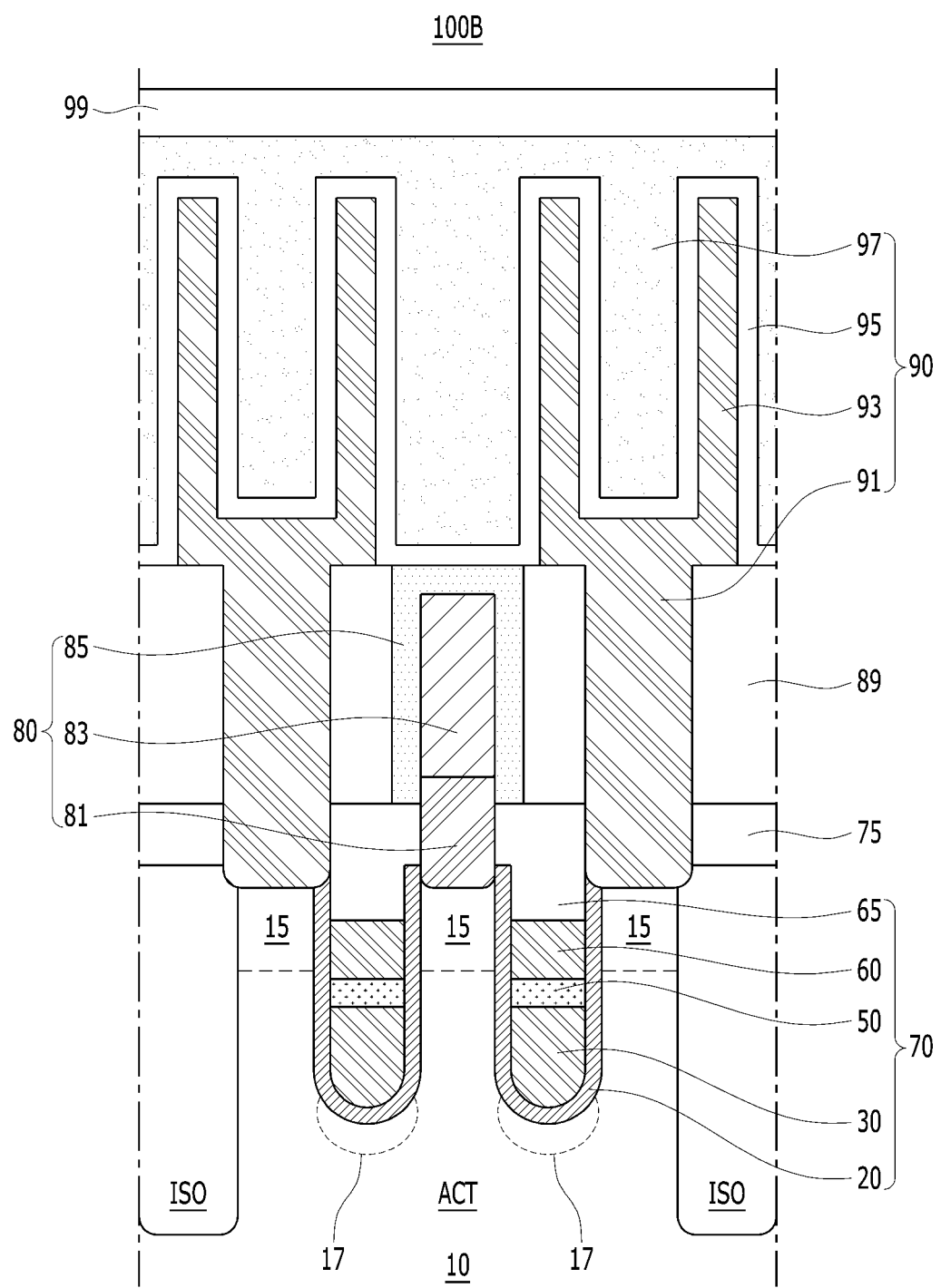

Referring to FIG. 1B, the cryogenic semiconductor device 100B in accordance with an embodiment may include an isolation region ISO located in a substrate 10, which has an active region ACT, a gate structure 70 buried in the active region ACT of the substrate 10, a lower interlayer dielectric layer 75, a bit line structure 80 and an intermediate interlayer dielectric layer 89 disposed on the lower interlayer dielectric layer 75, a storage structure 90, and an upper interlayer dielectric layer 99.

Figure 2A:
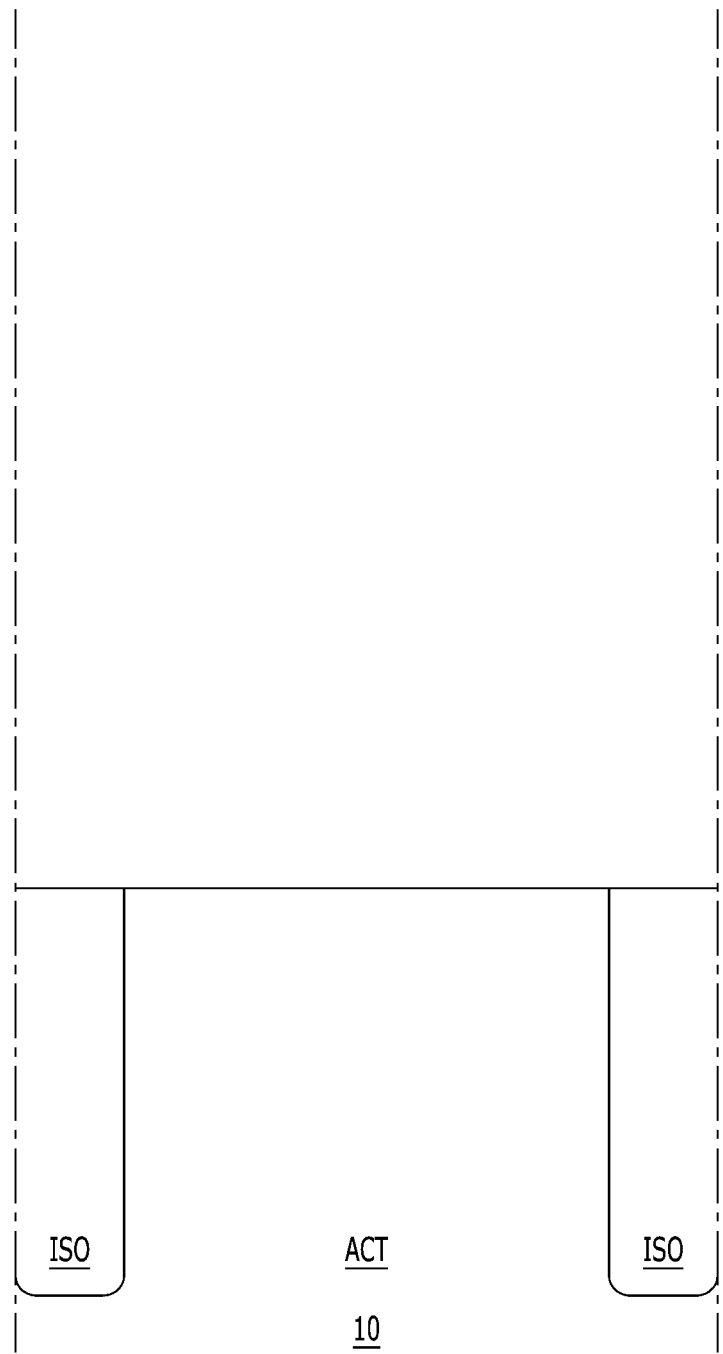
FIGS. 2A to 2Q, 3A to 3D, 4A to 4E, 5A to 5E, 6A to 6D, and 7A to 7I are cross-sectional views illustrating methods for forming semiconductor devices.
Figure 2B:
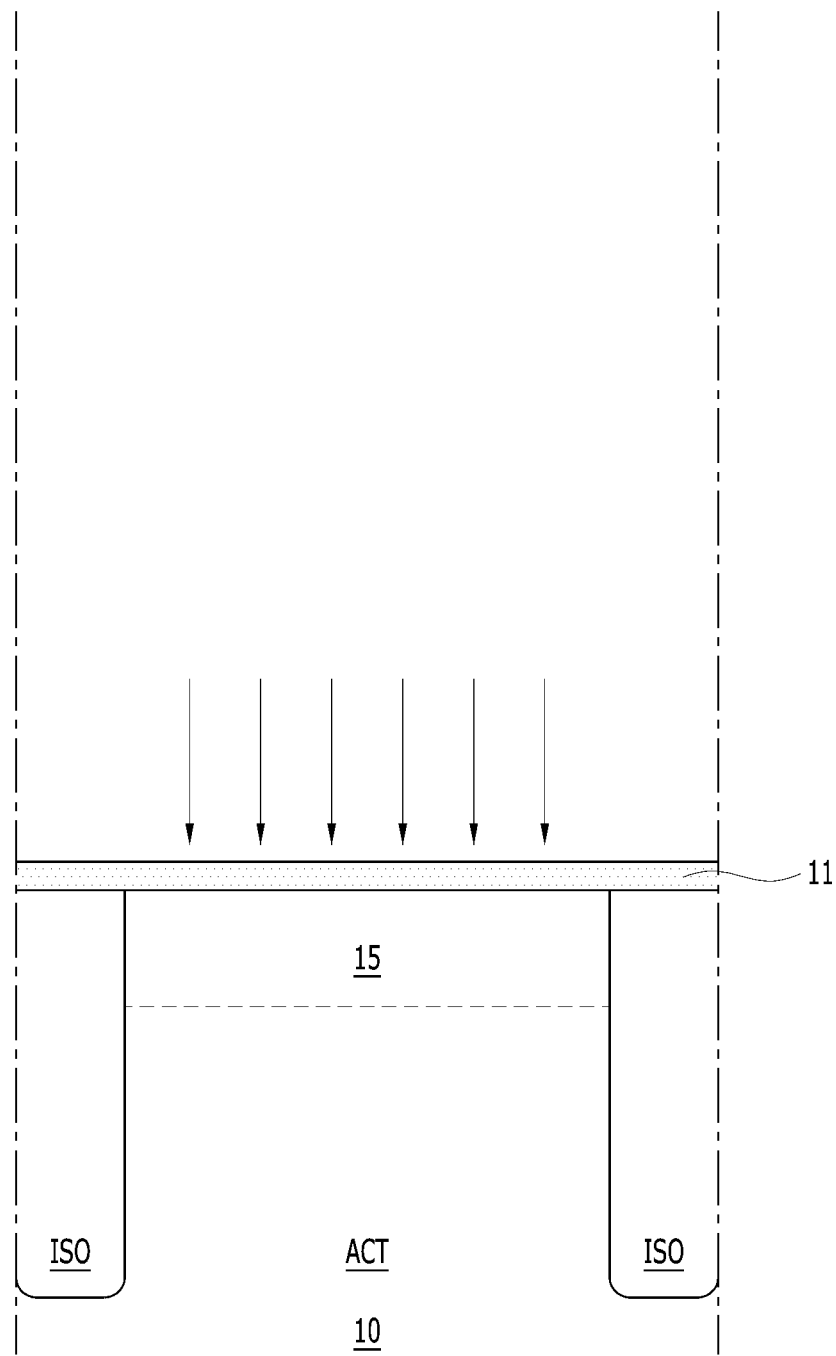
Figure 2C:
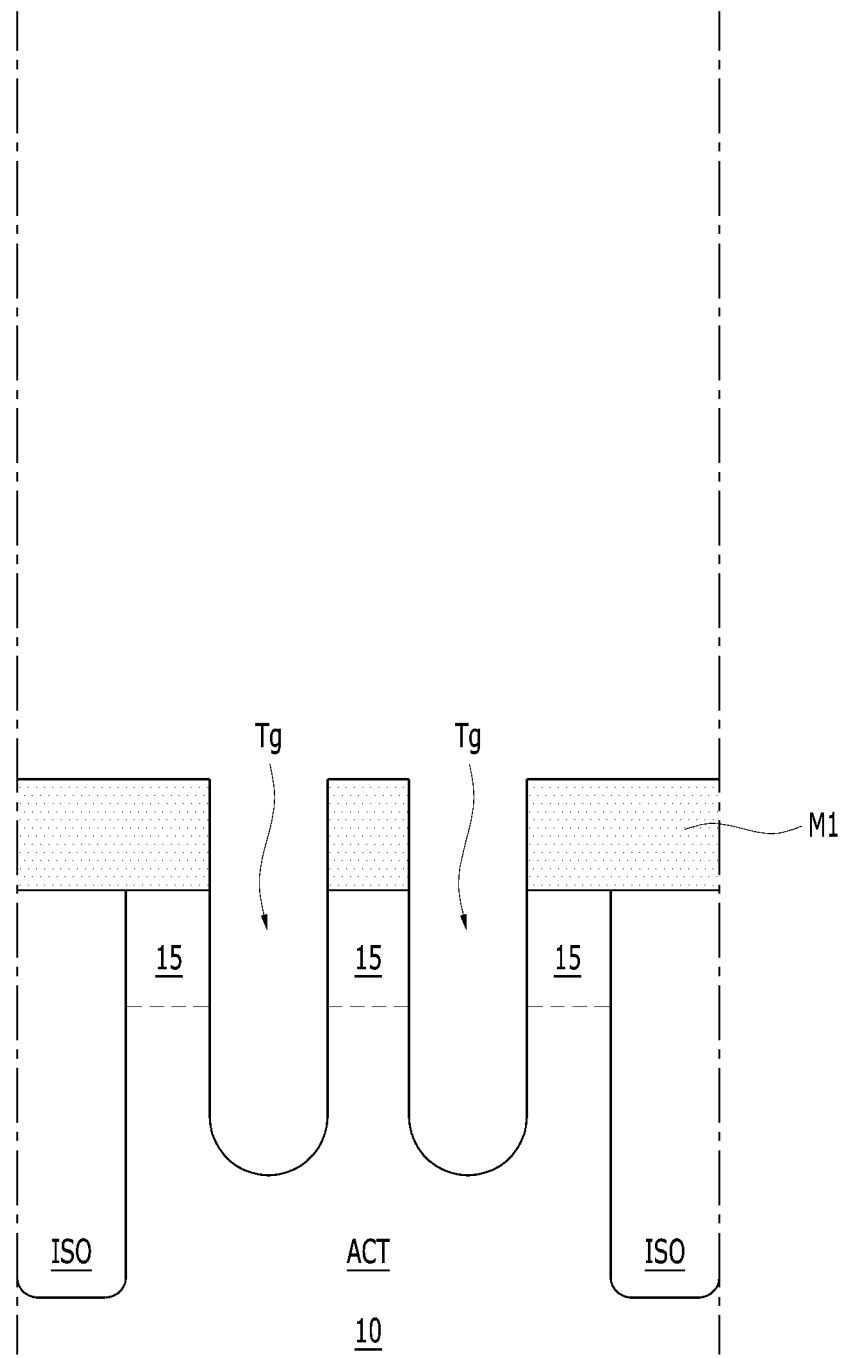

The gate structure 70 may include a gate dielectric layer 20, a lower gate electrode 30, an upper gate electrode 50, a capping gate electrode 60 and a gate capping layer 65 that are disposed in a gate trench (e.g., "Tg" shown in FIG. 2C). An ion implantation region 17 can be located below the gate trench Tg of the active region ACT.

The gate dielectric layer 20 may be conformally disposed on the inner sidewalls of the gate trench Tg in a lining shape. The gate dielectric layer 20 may be configured as a layer lining the inner walls of the gate trench Tg. The gate trench Tg may be a cylinder-like well, or as a slot-like element that extends in a linear direction through the substrate. The gate dielectric layer 20 may include an oxidized silicon layer, a silicon oxide layer, or a metal oxide layer having a high dielectric constant such as a hafnium oxide layer ($HfO_x$).

The lower gate electrode 30 may have a rail-like or plug-like shape on a portion of the gate dielectric layer 20 in the gate trench Tg, and may be positioned with an upper surface lower than a bottom surface of source/drain regions 15. A bottom surface and side surfaces of the lower gate electrode 30 may be surrounded by or be in contact with the gate dielectric layer 20. The lower gate electrode 30 may include a conductor having a relatively low work function. For example, the lower gate electrode 30 may include polysilicon doped with an N-type ion.

The upper gate electrode 50 may have a rail-like or plug-like shape on the lower gate electrode 30 in the gate trench Tg, and may be positioned with an upper surface lower than the bottom surface of the source/drain regions 15. The upper gate electrode 50 may include a conductor having a relatively higher work function than the lower gate electrode 30. In addition, the upper gate electrode 50 may include a conductor having a lower resistance than the lower gate electrode 30. For example, the upper gate electrode 50 may include a metal, a metal compound, or a metal alloy. Specifically, the upper gate electrode 50 may include tungsten (W) as a non-limiting example. In some embodiments, the upper gate electrode 50 may include a conductor having a relatively higher work function and a relatively lower resistance than the lower gate electrode 30 and remain capable of forming an ohmic contact. For example, the upper gate electrode 50 may include a barrier metal, such as a titanium nitride (TiN) as a non-limiting example.

The capping gate electrode 60 may have a rail-like a plug-like shape on the upper gate electrode 50 in the gate trench Tg. The capping gate electrode 60 may include polysilicon, for example, polysilicon doped with an N-type ion. The capping gate electrode 60 may prevent or reduce ion diffusion or ion migration between the upper gate electrode 50 and the gate capping layer 65. The capping gate electrode 60 may also improve the adhesion of the upper gate electrode 50 and the gate capping layer 65. For example, when the upper gate electrode 50 includes a metal and the gate capping layer 65 includes a silicon oxide, an oxygen atom may migrate from the gate capping layer 65 and diffuse into the upper gate electrode 50, causing metal oxidization. Or, a metal atom may migrate from the upper gate electrode 50 and diffuse into the gate capping layer 65, causing an electro-migration phenomenon. In addition, when the adhesion between the upper gate electrode 50 and the gate capping layer 65 is poor, a layer separation or a delamination defect may occur. The inclusion of the capping gate electrode 60 may prevent or limit the effect of these phenomena.

The gate capping layer 65 may be disposed on the capping gate electrode 60 to fill the gate trench Tg. Detailed descriptions of components, features and configurations of the cryogenic semiconductor device 100B that are the same as or similar to those of the cryogenic semiconductor device 100A described above may be applicable to but not repeated here with respect to the embodiments described herein with reference to FIG. 1B.

In FIG. 1B, the capping gate electrode 60 having a relatively low work function is located in a region of gate trench Tg common to or close to the source/drain region 15. As a result, a gate induced drain leakage (GIDL) may be mitigated.

Figure 1C:
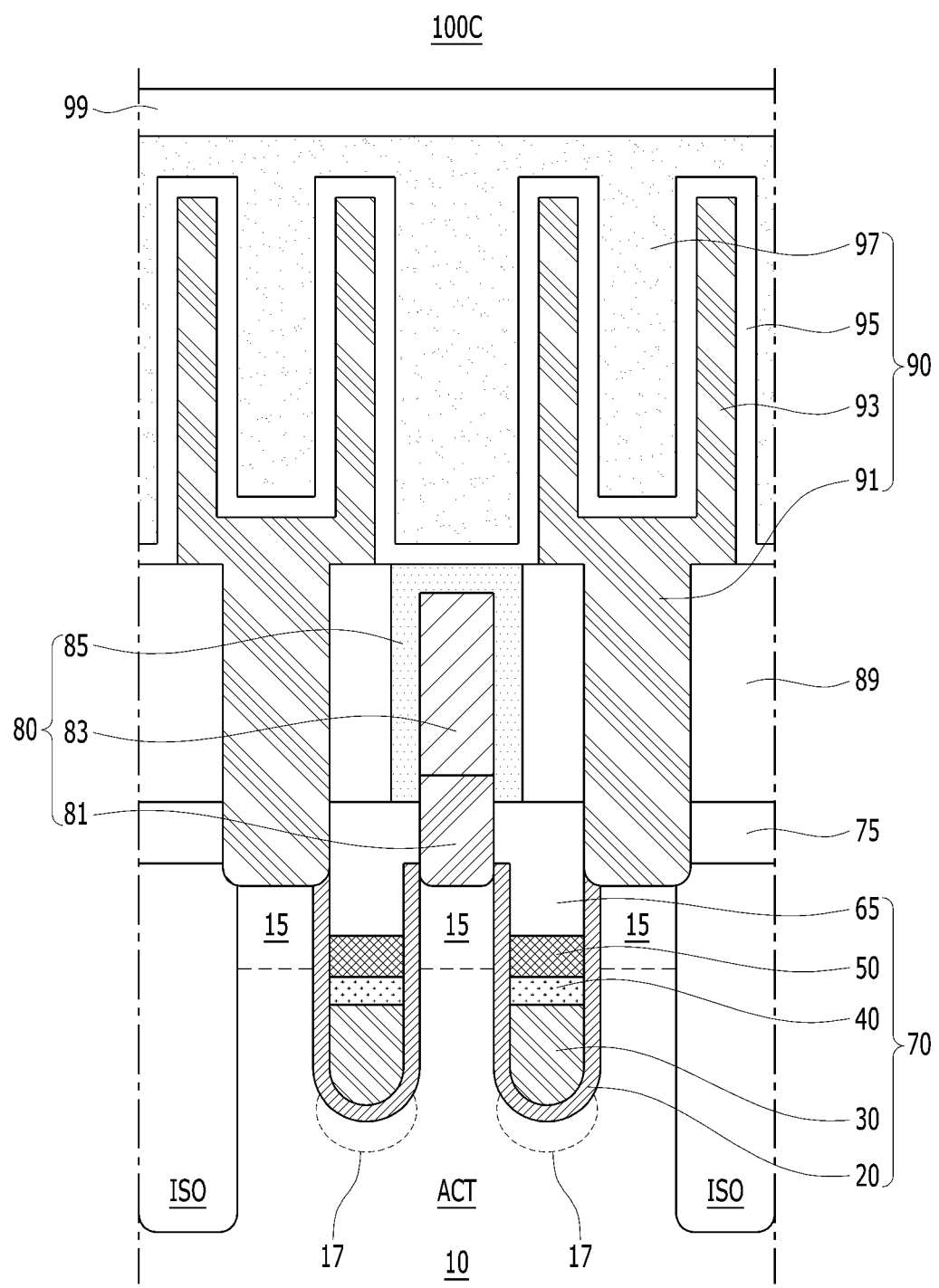

Referring to FIG. 1C, the cryogenic semiconductor device 100C in accordance with an embodiment may include an isolation region ISO in a substrate 10, which has an active region ACT, a gate structure 70 in the active region ACT of the substrate 10, a lower interlayer dielectric layer 75, a bit line structure 80 and an intermediate interlayer dielectric layer 89 disposed on the lower interlayer dielectric layer 75, a storage structure 90, and an upper interlayer dielectric layer 99.

The gate structure 70 may include a gate dielectric layer 20, a lower gate electrode 30, an intermediate gate electrode 40, an upper gate electrode 50 and a gate capping layer 65 that are disposed in a gate trench (e.g., "Tg" shown in FIG. 2C). An ion implantation region 17 can be located below the gate trench Tg of the active region ACT.

The gate dielectric layer 20 may be conformally disposed on the inner sidewalls of the gate trench Tg in a lining shape. The gate dielectric layer 20 may include an oxidized silicon layer, a silicon oxide layer, or a metal oxide layer having a high dielectric constant such as a hafnium oxide layer ($HfO_x$).

The lower gate electrode 30 may have a rail-like shape or a plug-like shape on a portion of the gate dielectric layer 20 in the gate trench Tg, and may be positioned with an upper surface lower than a bottom surface of the source/drain region 15. The lower gate electrode 30 may include a conductor having a relatively low work function. For example, the lower gate electrode 30 may include polysilicon doped with an N-type ion.

The intermediate gate electrode 40 may have a rail-like shape or a plug-like shape on the lower gate electrode 30 in the gate trench Tg, and may be positioned with an upper surface lower than the bottom surface of the source/drain region 15. The intermediate gate electrode 40 may include a conductor capable of forming an ohmic contact that prevents physical and chemical reactions between the lower gate electrode 30 and the upper gate electrode 50. For example, the intermediate gate electrode 40 may include a barrier metal such as a titanium nitride (TiN). The intermediate gate electrode 40 may have a work function that is relatively higher than the work function of the lower gate electrode 30 and relatively lower than the work function of the upper gate electrode 50. The intermediate gate electrode 40 may have a resistance that is relatively lower than the resistance of the lower gate electrode 30 and relatively higher than the resistance of the upper gate electrode 50.

The upper gate electrode 50 may have a rail-like or plug-like shape or geometry on the intermediate gate electrode 40 in the gate trench Tg. The upper gate electrode 50 may include a conductor having a relatively high work function and a relatively low resistance compared to both the intermediate gate electrode 40 and the lower gate electrode 30. For example, the upper gate electrode 50 may include a metal.

The gate capping layer 65 may be disposed on the upper gate electrode 50 to fill the gate trench Tg. The gate capping layer 65 may include a dielectric material that does not physically and chemically react with the upper gate electrode 50. For example, the gate capping layer 65 may include a silicon nitride. Detailed descriptions of the components, features and configurations of the cryogenic semiconductor device 100C that are the same as or similar to those of the cryogenic semiconductor device 100A described above may be applicable to but not repeated here with respect to the embodiments described herein with reference to FIG. 1C.

Figure 1D:
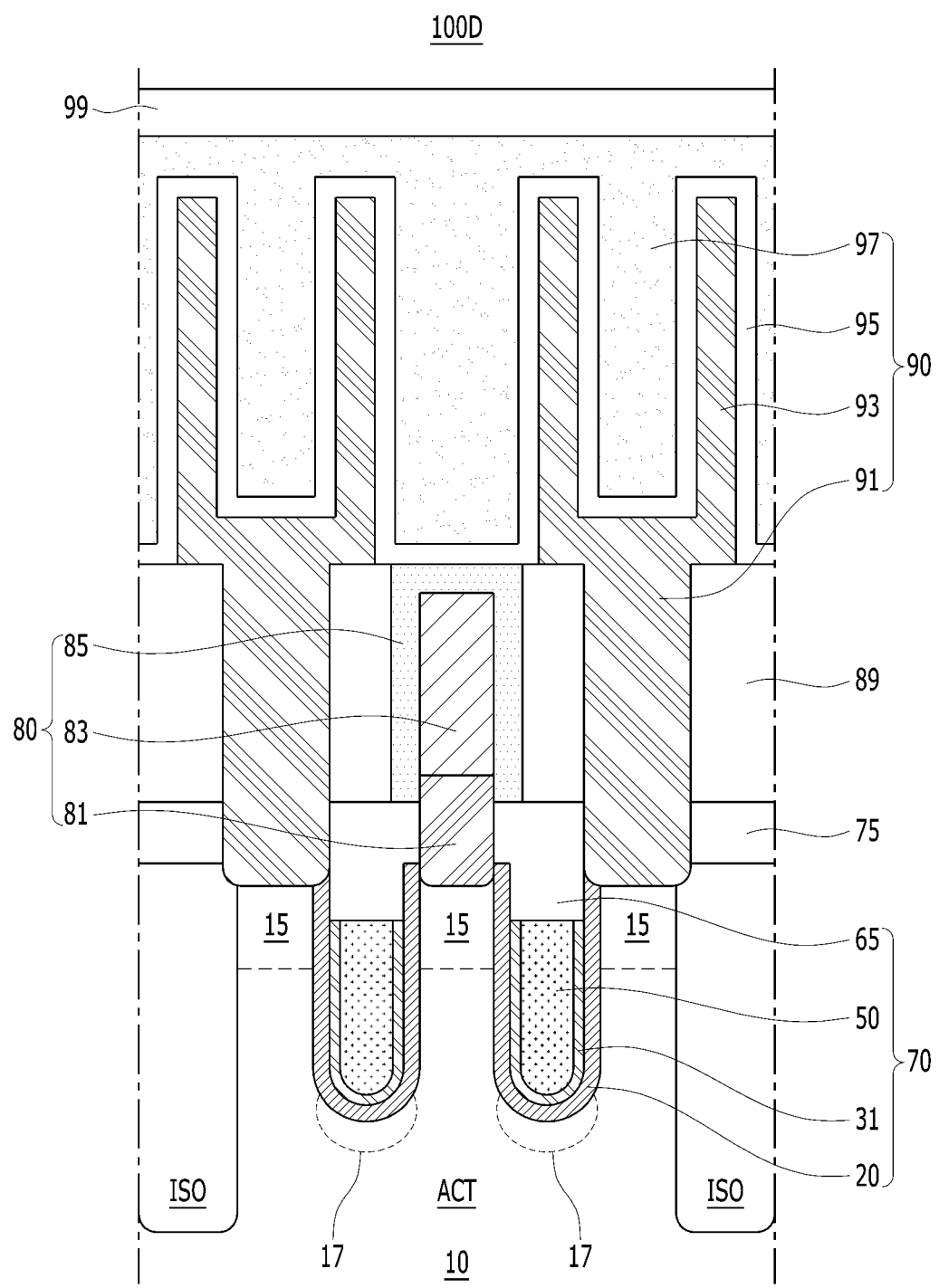

Referring to FIG. 1D, the cryogenic semiconductor device 100D in accordance with an embodiment may include an isolation region ISO in a substrate 10, which has an active region ACT, a gate structure 70 in the active region ACT of the substrate 10, a lower interlayer dielectric layer 75, a bit line structure 80 and an intermediate interlayer dielectric layer 89 disposed on the lower interlayer dielectric layer 75, a storage structure 90, and an upper interlayer dielectric layer 99. The gate structure 70 may include a gate dielectric layer 20, a lower gate electrode 31, an upper gate electrode 50 and a gate capping layer 65 that are disposed in a gate trench (e.g., "Tg" shown in FIG. 2C). An ion implantation region 17 can be located below the gate trench Tg of the active region ACT.

The gate dielectric layer 20 may be conformally disposed on the sidewalls of the gate trench Tg in a lining shape. The gate dielectric layer 20 may include an oxidized silicon layer, a silicon oxide layer, or a metal oxide layer having a high dielectric constant such as a hafnium oxide layer ($HfO_x$).

The lower gate electrode 31 may be conformally disposed on at least a portion of the gate dielectric layer 20 in the gate trench Tg. As an example, both of the gate dielectric layer 20 and the lower gate electrode 31 can have a cup-like or bowl-like cross-sectional shape as illustrated in FIG. 1D. The lower gate electrode 31 may include a conductor having a relatively low work function. For example, the lower gate electrode 31 may include polysilicon doped with an N-type ion.

The upper gate electrode 50 may have a rail-like or plug-like shape on the lower gate electrode 31 in the gate trench Tg. The upper gate electrode 50 may include a conductor having a relatively high work function and a relatively low resistance. For example, the upper gate electrode 50 may include a metal. In some embodiments, the upper gate electrode 50 may include a conductor having a lower resistance than the lower gate electrode 31. For example, the upper gate electrode 50 may include a metal, a metal compound, or a metal alloy. Specifically, the upper gate electrode 50 may include tungsten (W) as a non-limiting example. In other embodiments, the upper gate electrode 50 may include a conductor having a higher work function and a lower resistance than the lower gate electrode 31 and remain capable of forming an ohmic contact. For example, the upper gate electrode 50 may include a barrier metal, such as a titanium nitride (TiN) as a non-limiting example.

The gate capping layer 65 may be disposed on the upper gate electrode 50 to fill the gate trench Tg. The gate capping layer 65 may include a dielectric material that does not physically and chemically react with the upper gate electrode 50. For example, the gate capping layer 65 may include a silicon nitride. When the upper gate electrode 50 includes a barrier metal, the gate capping layer 65 may include a silicon oxide.

The upper surfaces of the lower gate electrode 31 and the upper gate electrode 50 may be located at a relatively higher level than the bottom or lowest portion of the source/drain region 15. A channel region of the gate structure 70 develop in the substrate 10 in an area spaced apart from lower gate electrode 31 by gate dielectric layer 20. Detailed descriptions of the components, features and configurations of the cryogenic semiconductor device 100D that are the same as or similar to those of the cryogenic semiconductor device 100A described above may be applicable to but not repeated here with respect to the embodiments described herein with reference to FIG. 1D.

In FIG. 1D, the lower gate electrode 31 having a relatively low work function is located in a region of gate trench Tg common to or close to the source/drain region 15, so a gate induced drain leakage (GIDL) may be mitigated or blocked.

Figure 1E:
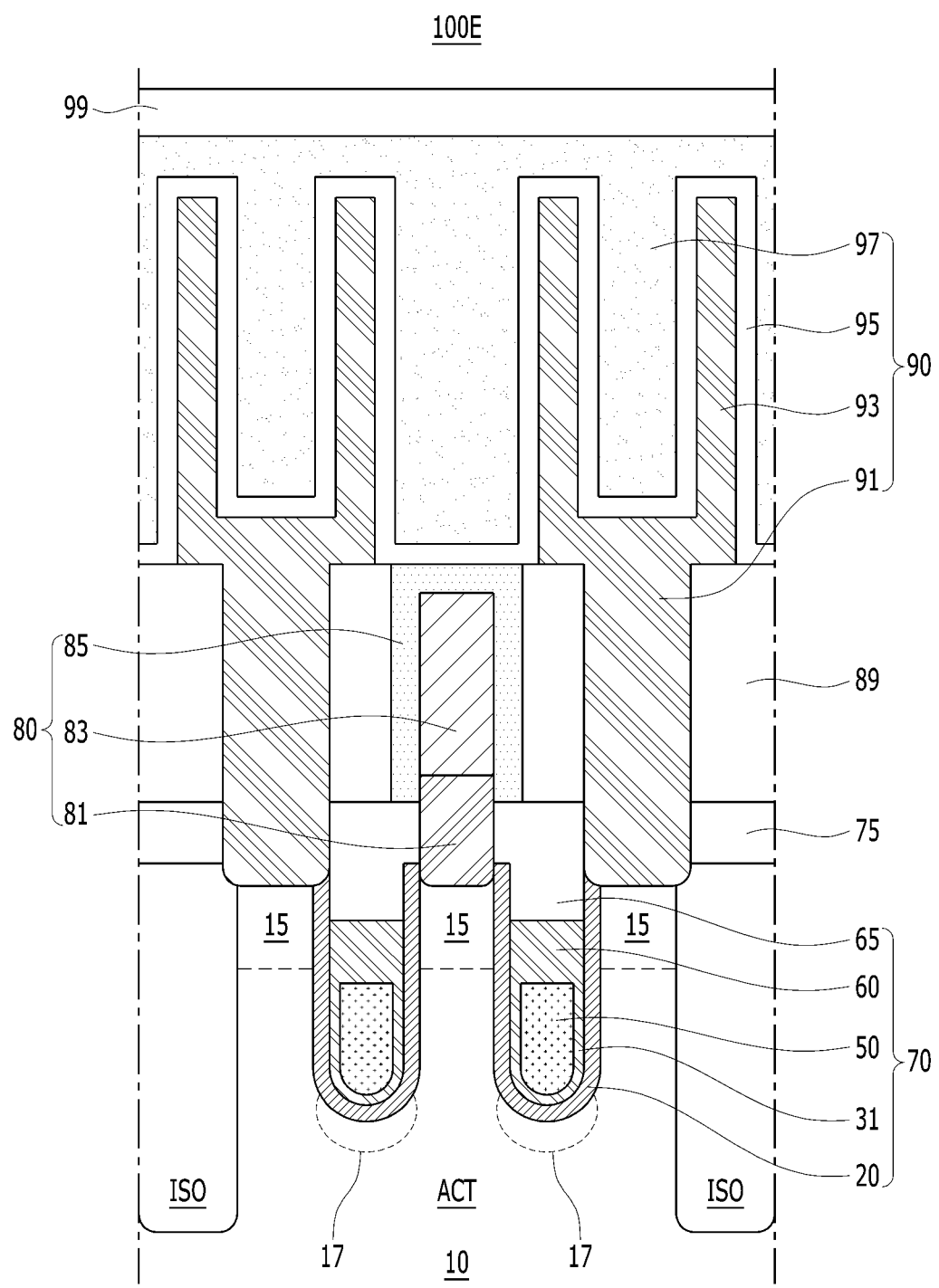

Referring to FIG. 1E, the cryogenic semiconductor device 100E in accordance with an embodiment may include an isolation region ISO in a substrate 10, which has an active region ACT, a gate structure 70 disposed in the active region ACT of the substrate 10, a lower interlayer dielectric layer 75, a bit line structure 80 and an intermediate interlayer dielectric layer 89 disposed on the lower interlayer dielectric layer 75, a storage structure 90, and an upper interlayer dielectric layer 99. The gate structure 70 may include a gate dielectric layer 20, a lower gate electrode 31, an upper gate electrode 50, a capping gate electrode 60 and a gate capping layer 65 that are disposed in a gate trench (e.g., "Tg" shown in FIG. 2C).

The lower gate electrode 31 may include a conductor having a relatively low work function. For example, the lower gate electrode 31 may include polysilicon doped with an N-type ion.

The upper gate electrode 50 may include a conductor having a relatively high work function and a relatively low resistance. For example, the upper gate electrode 50 may include a metal. The upper gate electrode 50 may include a conductor capable of forming an ohmic contact with the lower gate electrode 31. For example, the upper gate electrode 50 may include a barrier metal such as a titanium nitride (TiN). The upper gate electrode 50 may have a higher work function and a lower resistance than the lower gate electrode 31.

The capping gate electrode 60 may include polysilicon doped with an N-type ion. The capping gate electrode 60 may prevent or mitigate an ion diffusing or migrating between the upper gate electrode 50 and the gate capping layer 65. The capping gate electrode 60 may also improve the adhesion of the upper gate electrode 50 and the gate capping layer 65. Detailed descriptions of the capping gate electrode 60 are provided above and with reference to FIG. 1B.

In FIG. 1E, the capping gate electrode 60 having a relatively low work function is located in a region of gate trench Tg common to or close to the source/drain region 15, so that a gate induced drain leakage (GIDL) may be mitigated or prevented. Detailed descriptions of the components, features and configurations of the cryogenic semiconductor device 100E that are the same as or similar to those of the cryogenic semiconductor device 100A described above may be applicable to but not repeated here with respect to the embodiments described herein with reference to FIG. 1E.

Figure 1F:
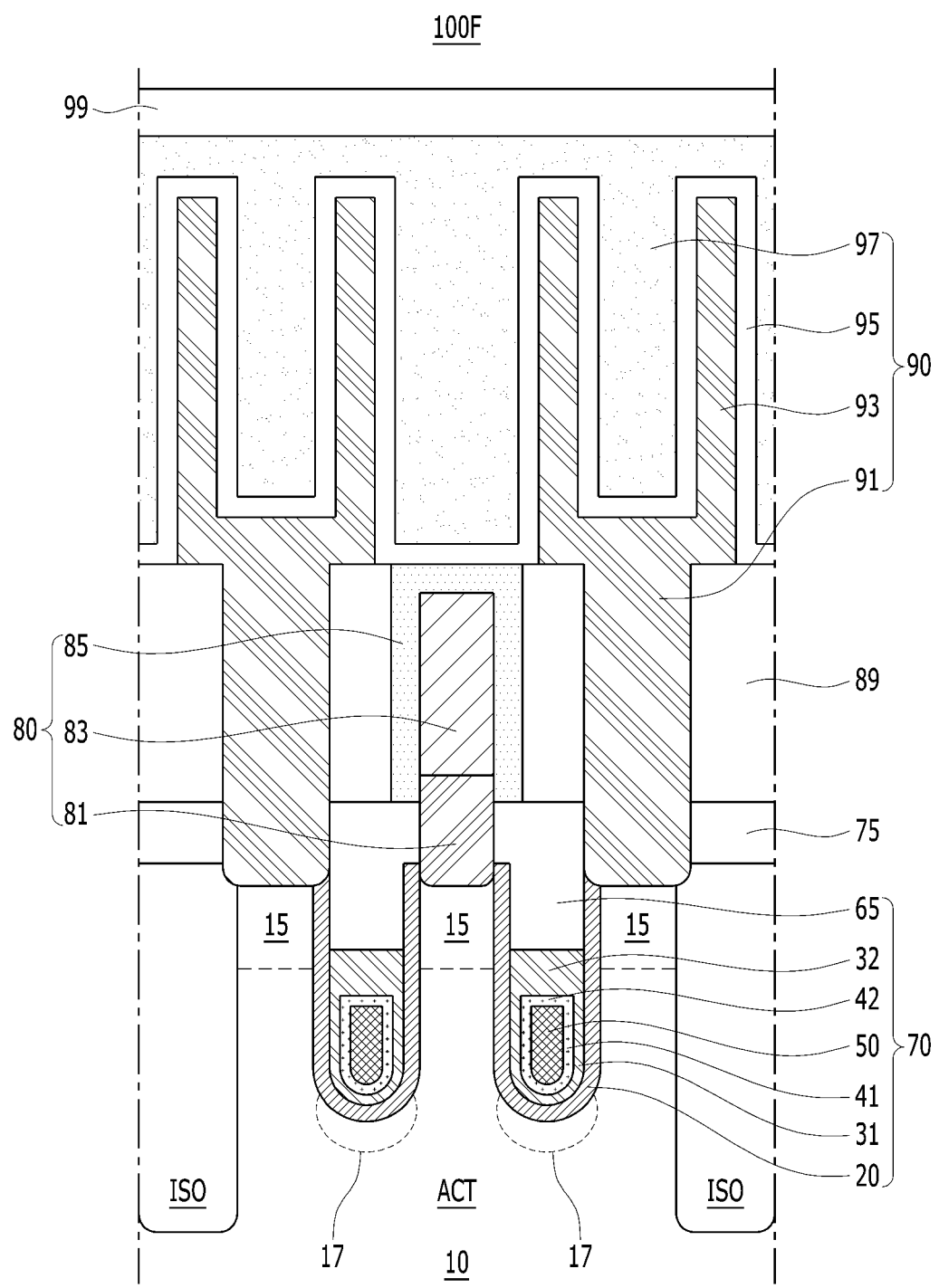

Referring to FIG. 1F, the cryogenic semiconductor device 100F in accordance with an embodiment may include an isolation region ISO in a substrate 10, which has an active region ACT, a gate structure 70 in the active region ACT of the substrate 10, a lower interlayer dielectric layer 75, a bit line structure 80 and an intermediate interlayer dielectric layer 89 disposed on the lower interlayer dielectric layer 75, a storage structure 90, and an upper interlayer dielectric layer 99. The gate structure 70 may include a gate dielectric layer 20, a lower gate electrode 31, an intermediate gate electrode 41, an upper gate electrode 50, a lower capping gate electrode 42, an upper capping gate electrode 32, and a gate capping layer 65 that are in a gate trench (refer to "Tg" shown in FIG. 2C).

The gate dielectric layer 20 may be conformally disposed on the sidewalls of the gate trench Tg. The gate dielectric layer 20 may include an oxidized silicon layer, a silicon oxide layer, or a metal oxide layer having a high dielectric constant such as a hafnium oxide layer ($HfO_x$).

The lower gate electrode 31 may be conformally disposed on at least a portion of the gate dielectric layer 20 in the gate trench Tg. The lower gate electrode 31 may include a conductor having a relatively low work function. For example, the lower gate electrode 31 may include polysilicon doped with an N-type ion. The intermediate gate electrode 41 may be conformally disposed on at least a portion of the lower gate electrode 31. The intermediate gate electrode 41 may include a conductor capable of forming an ohmic contact that prevents physical and chemical reactions between the lower gate electrode 31 and the upper gate electrode 50. For example, the intermediate gate electrode 41 may include a barrier metal such as a titanium nitride (TiN). The intermediate gate electrode 41 may have a work function that is relatively higher than the work function of the lower gate electrode 31 and relatively lower than the work function of the upper gate electrode 50. The intermediate gate electrode 41 may have a resistance that is relatively lower than the resistance of the lower gate electrode 31 and relatively higher than the resistance of the upper gate electrode 50.

The upper gate electrode 50 may have a rail-like or plug-like shape on the intermediate gate electrode 41. The upper gate electrode 50 may include a conductor having a relatively high work function and a relatively low resistance. For example, the upper gate electrode 50 may include a metal. In addition, the upper gate electrode 50 may include a conductor having a relatively lower resistance than the lower gate electrode 31 and the intermediate gate electrode 41. For example, the upper gate electrode 50 may include a metal, a metal compound, or a metal alloy. Specifically, the upper gate electrode 50 may include tungsten (W) as a non-limiting example.

The lower capping gate electrode 42 may have a rail-like or plate-like shape on the upper gate electrode 50 to cover the upper surface of the upper gate electrode 50. The lower capping gate electrode 42 may include the same material as that included in the intermediate gate electrode 41. The lower capping gate electrode 42 and the intermediate gate electrode 41 may be coupled to each other. Accordingly, the upper gate electrode 50 may be surrounded or enveloped by the intermediate gate electrode 41 and the lower capping gate electrode 42.

The upper capping gate electrode 32 may have a rail-like or plate-like shape on the lower capping gate electrode 42. The upper capping gate electrode 32 may include the same material as that used in the lower gate electrode 31. The upper capping gate electrode 32 may be coupled to the lower gate electrode 31. Accordingly, a coupling structure of the intermediate gate electrode 41 and the lower capping gate electrode 42 may be surrounded by the lower gate electrode 31 and the upper capping gate electrode 32.

The cryogenic semiconductor devices 100A to 100F, in accordance with the various embodiments disclosed herein, may include a gate structure 70 having an effect of lowering the threshold voltage of the buried gate channel array transistor, and ion implantation regions 17 having an effect of increasing the same threshold voltage. Accordingly, the cryogenic semiconductor devices 100A to 100F may have a threshold voltage that is appropriately adjusted to have a good operational performance in the cryogenic range as compared to other devices.

In accordance with the embodiments disclosed herein, the lower gate electrodes 30 and 31, having relatively low work functions, may be located close to or near a channel region. When a material having a low work function is located close to the channel region, the threshold voltage may be maximized through the use of the material in the lower gate electrodes. When a material having a high work function is located close to the channel region, the threshold voltage can not be sufficiently lowered.

In accordance with the various embodiments, when the lower gate electrode 31 having a relatively low work function and the upper capping gate electrode 32 are located close to the source/drain region 15, a gate induced drain leakage (GIDL) may be mitigated.

Figure 2D:
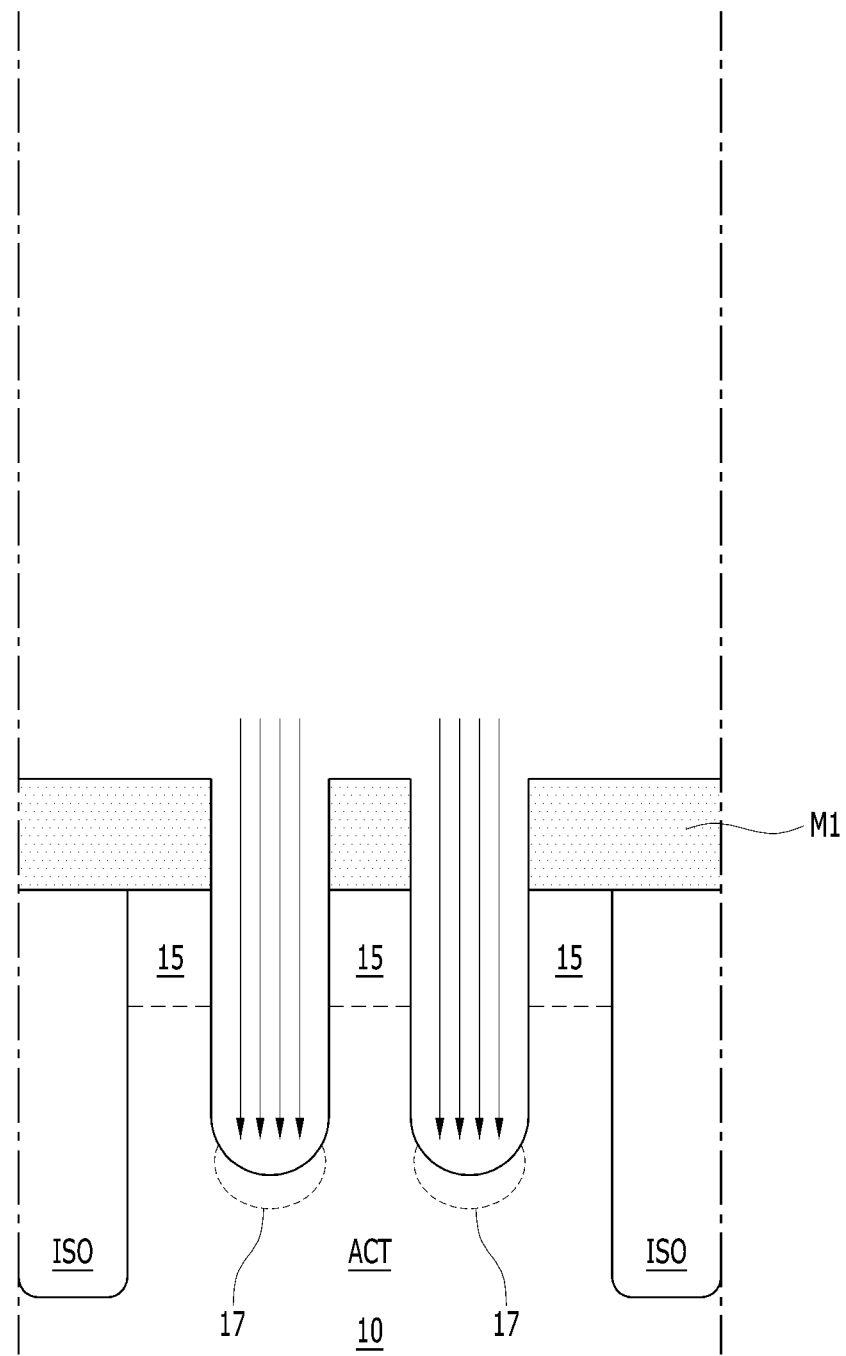
Figure 2E:
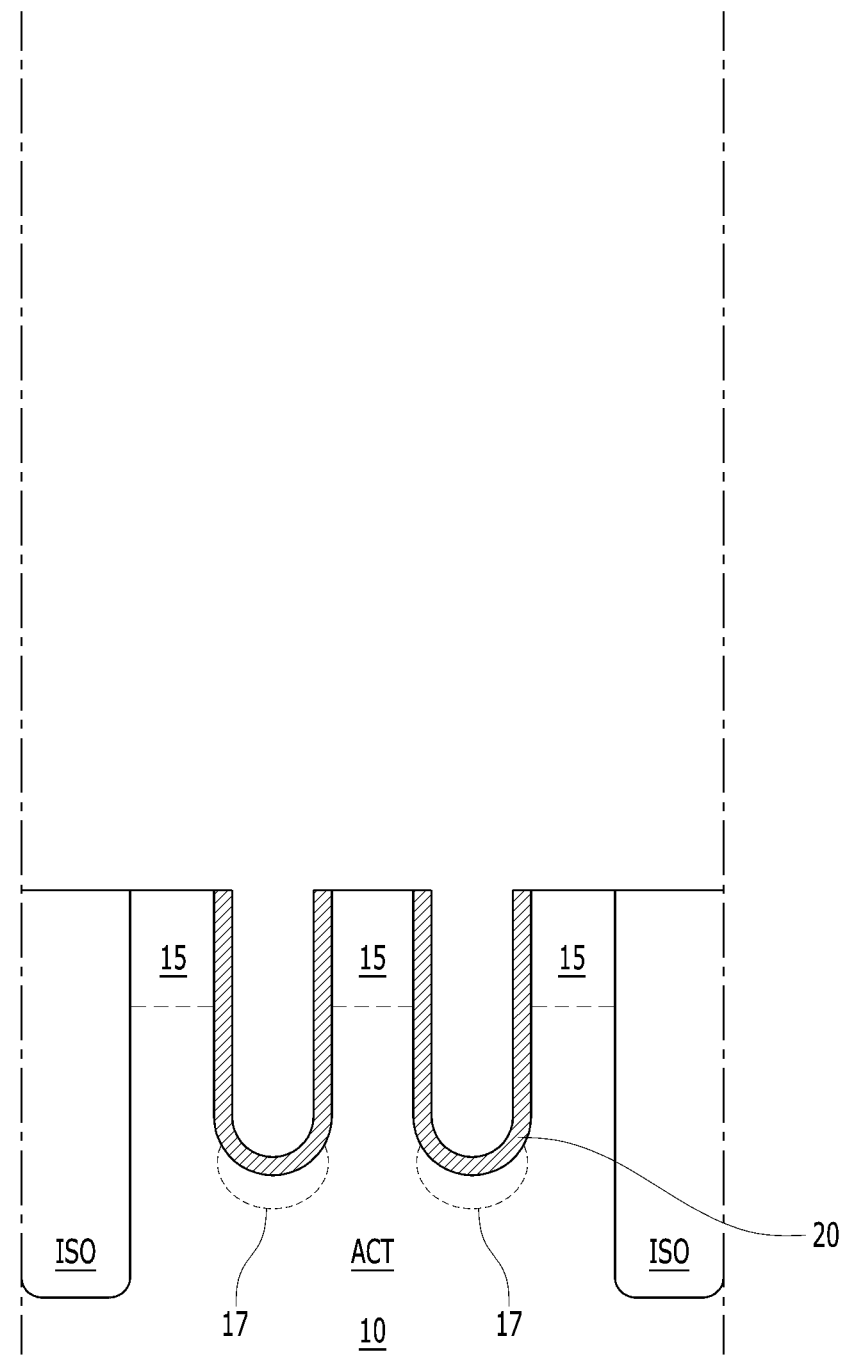
Figure 2F:
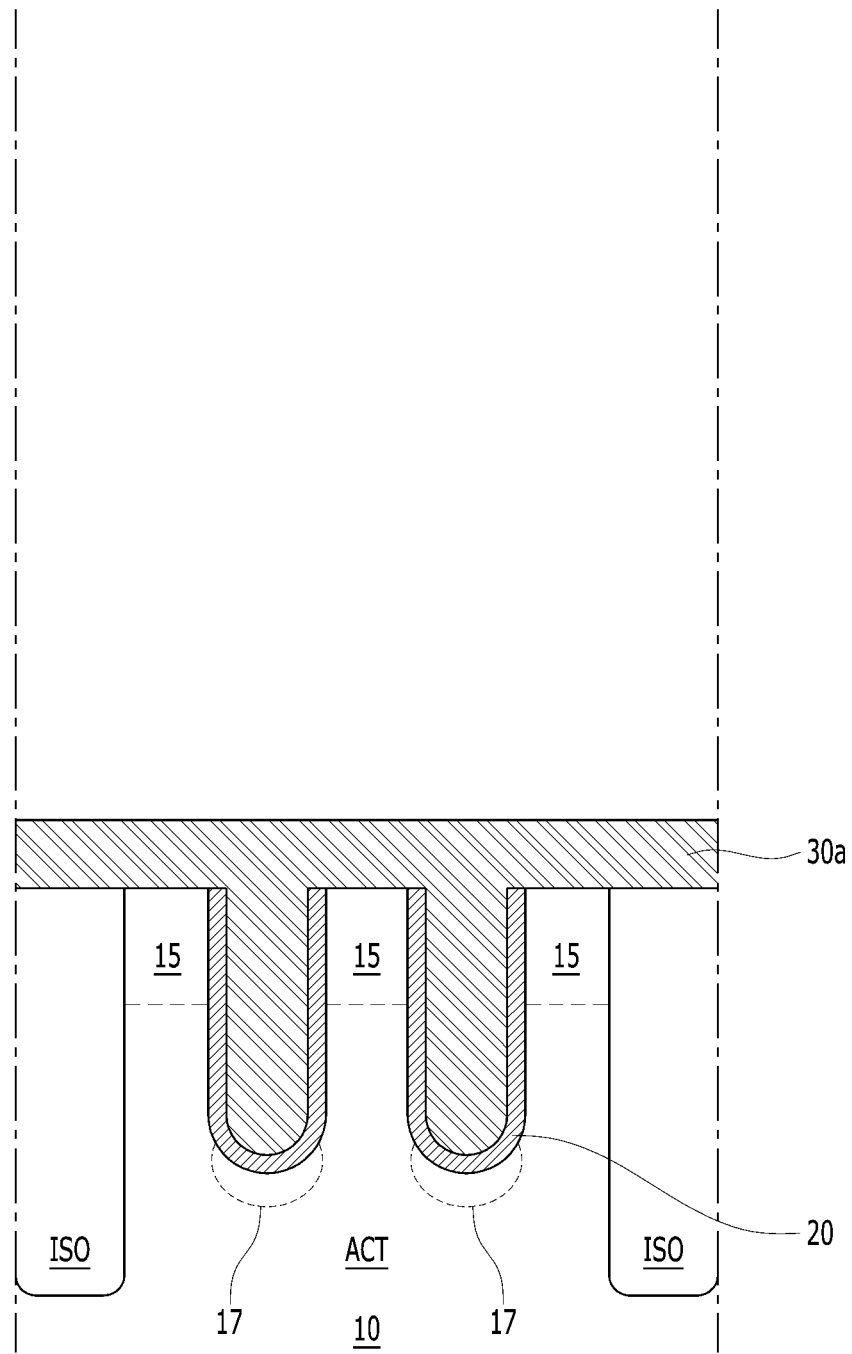
Figure 2G:
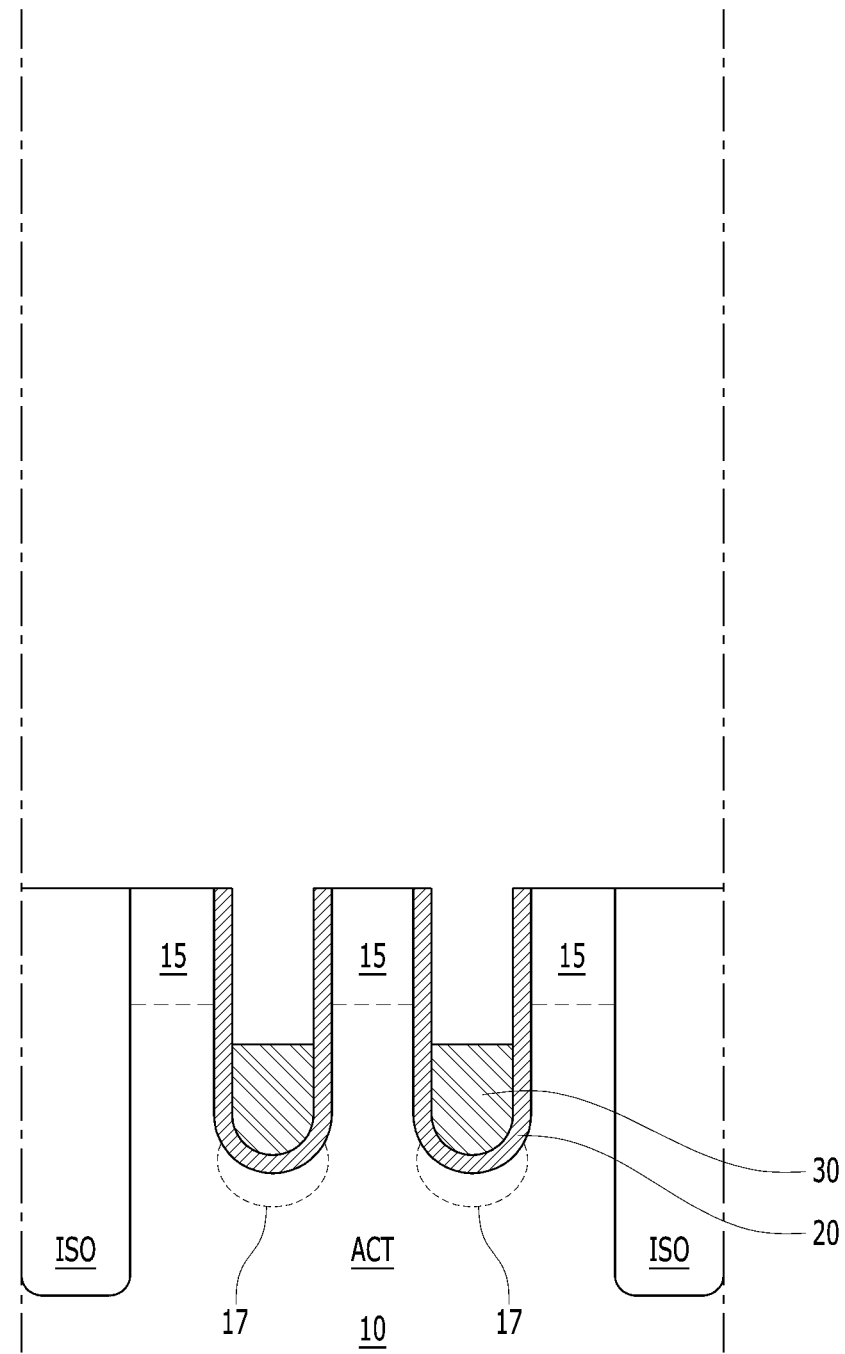
Figure 2H:
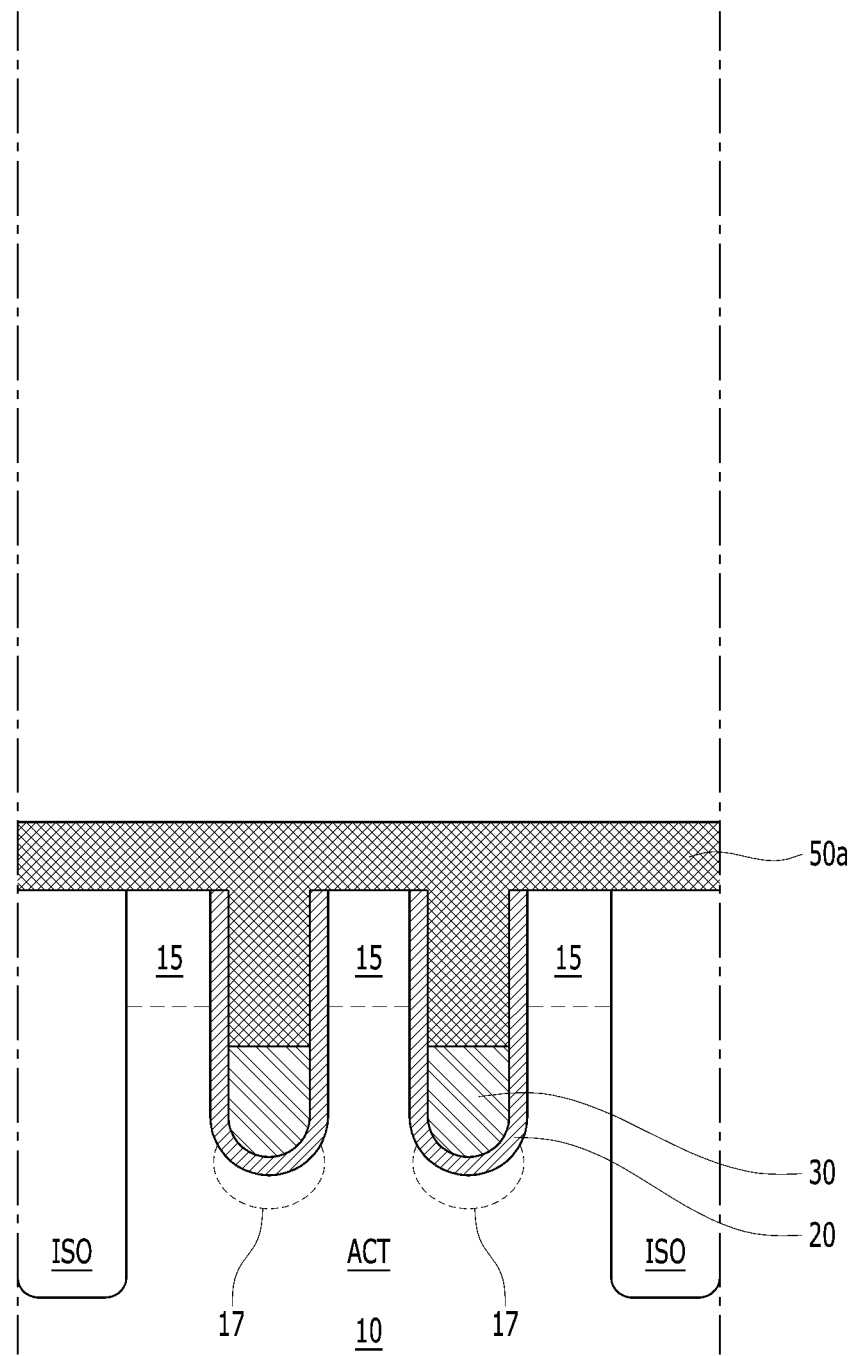
Figure 2I:
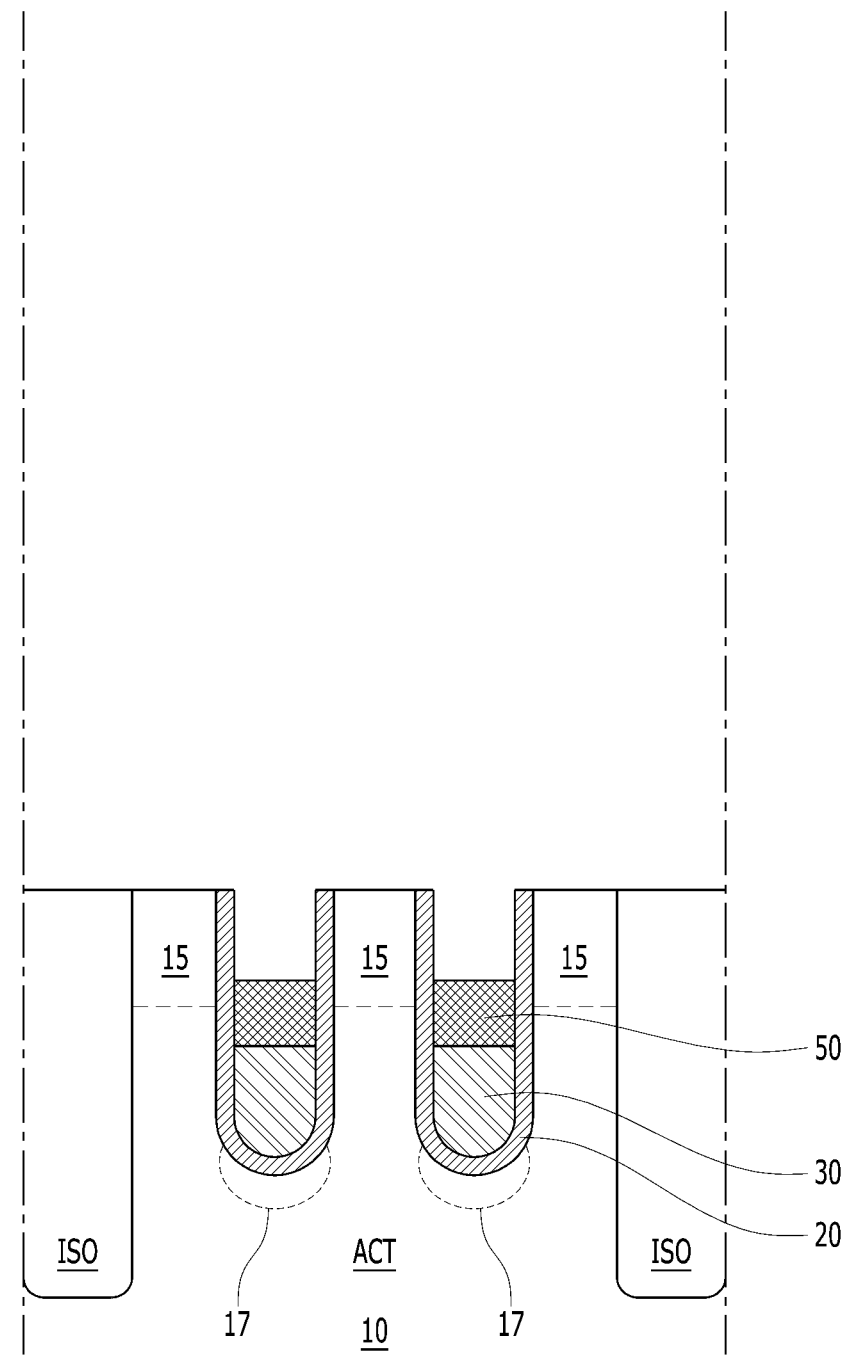
Figure 2J:
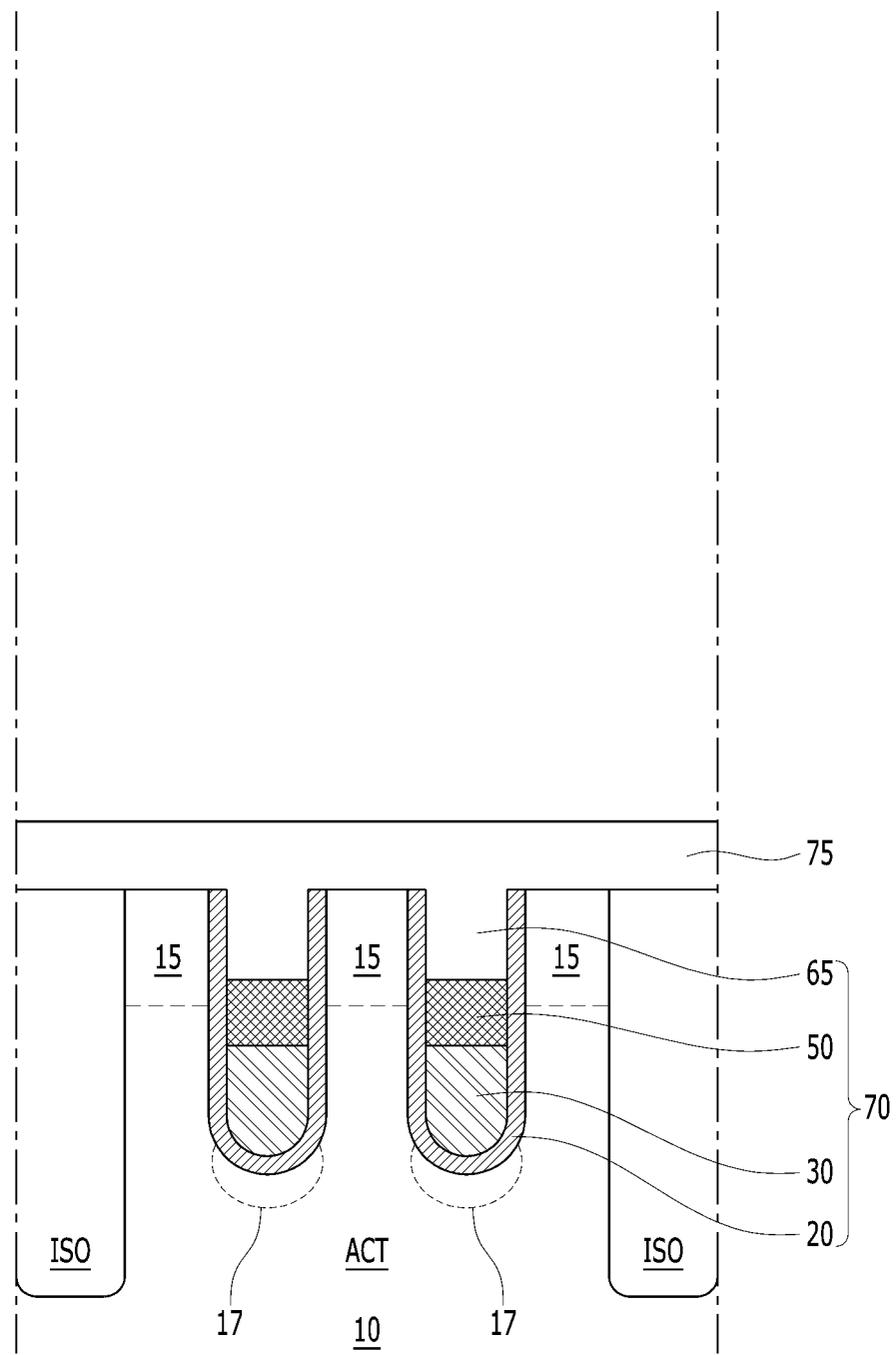
Figure 2K:
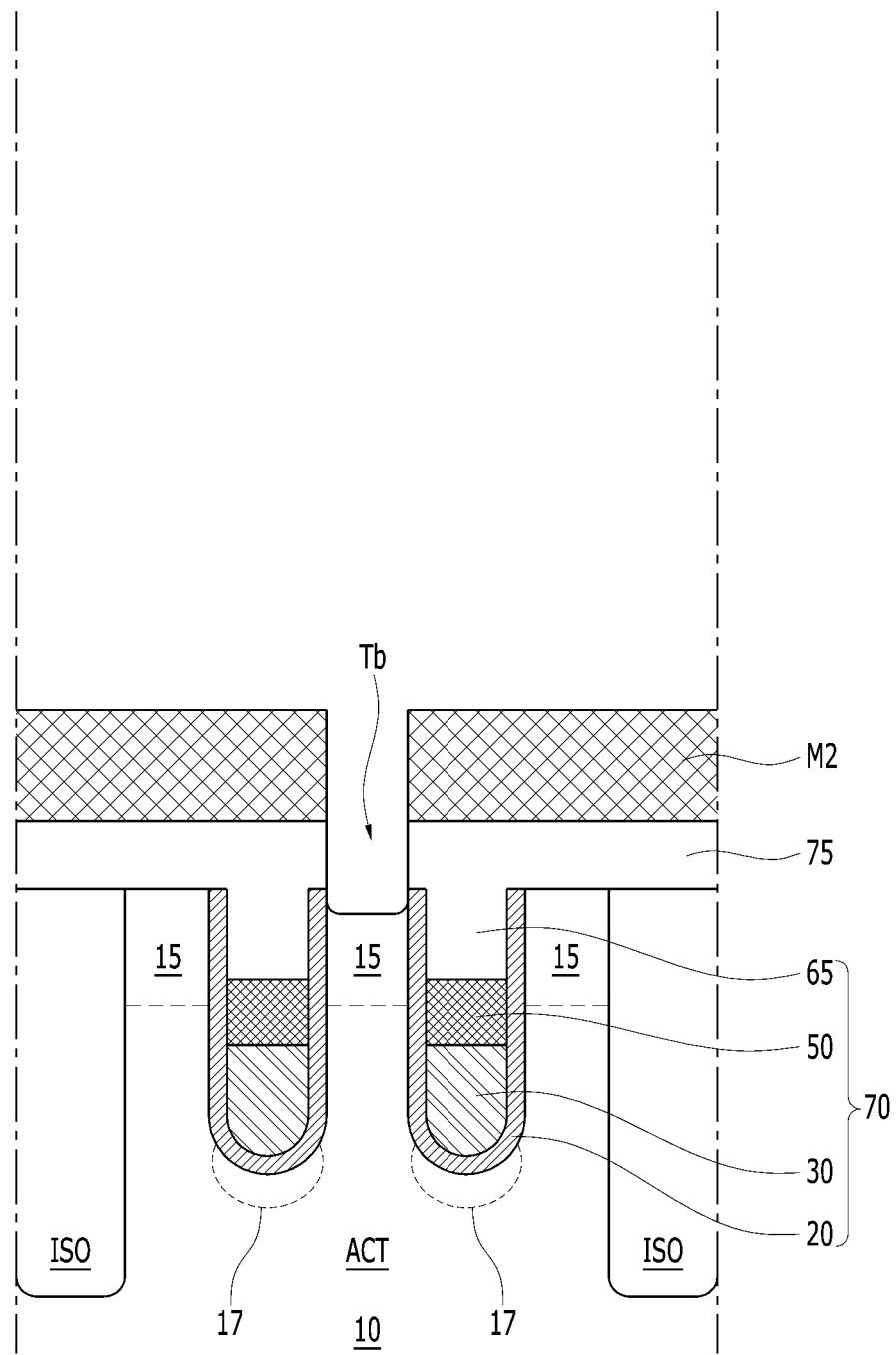
Figure 2L:
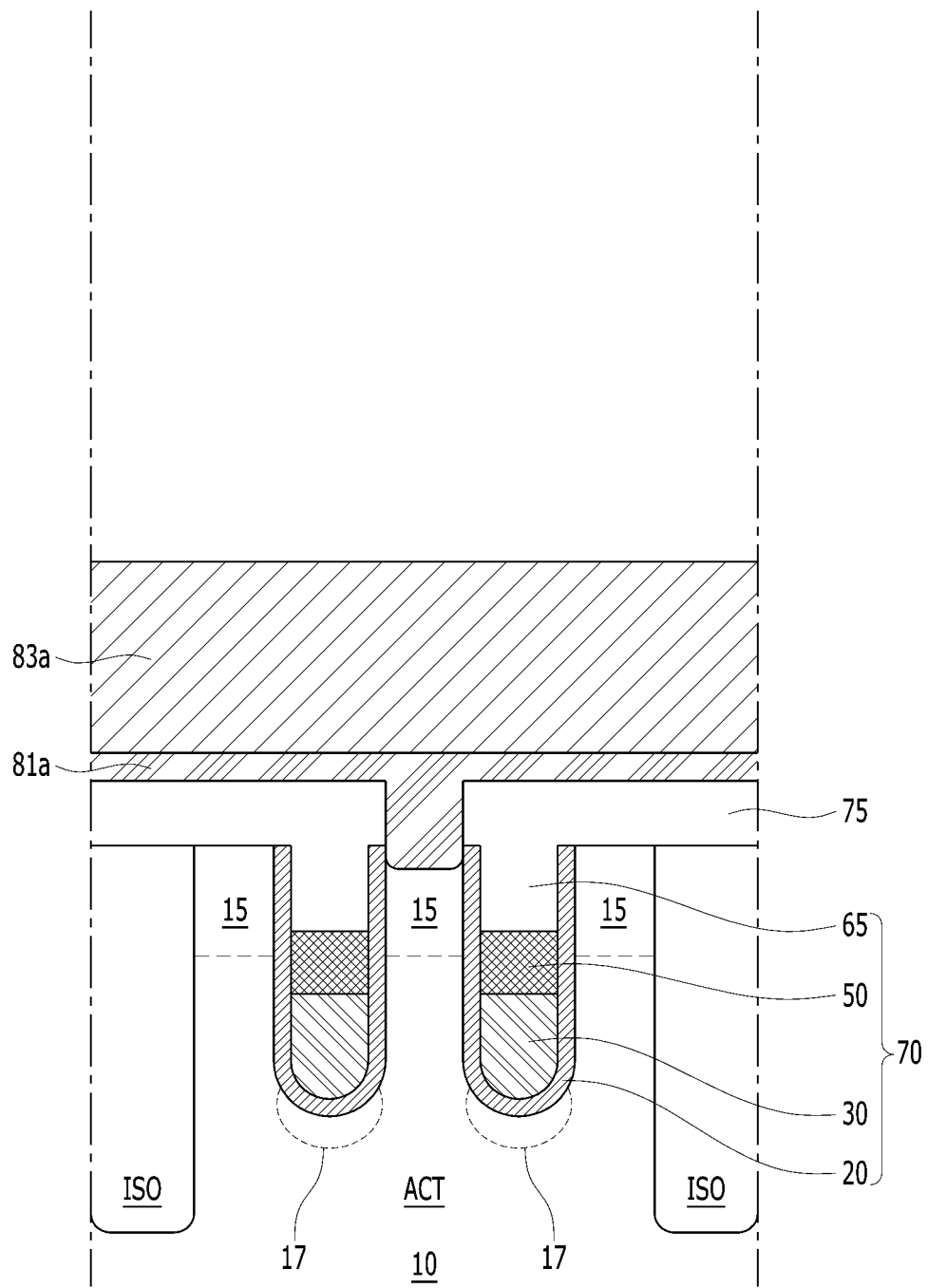
Figure 2M:
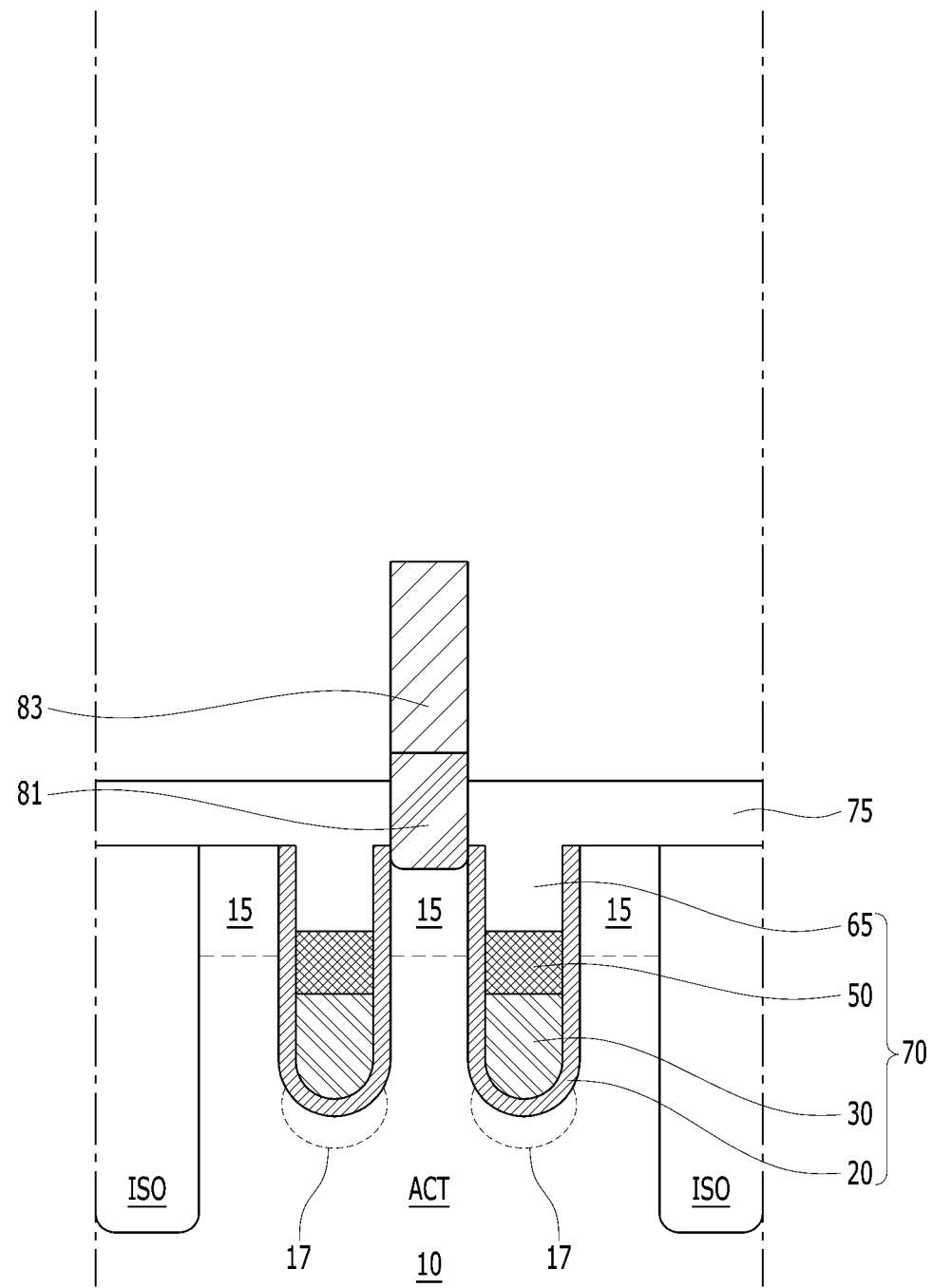
Figure 2N:
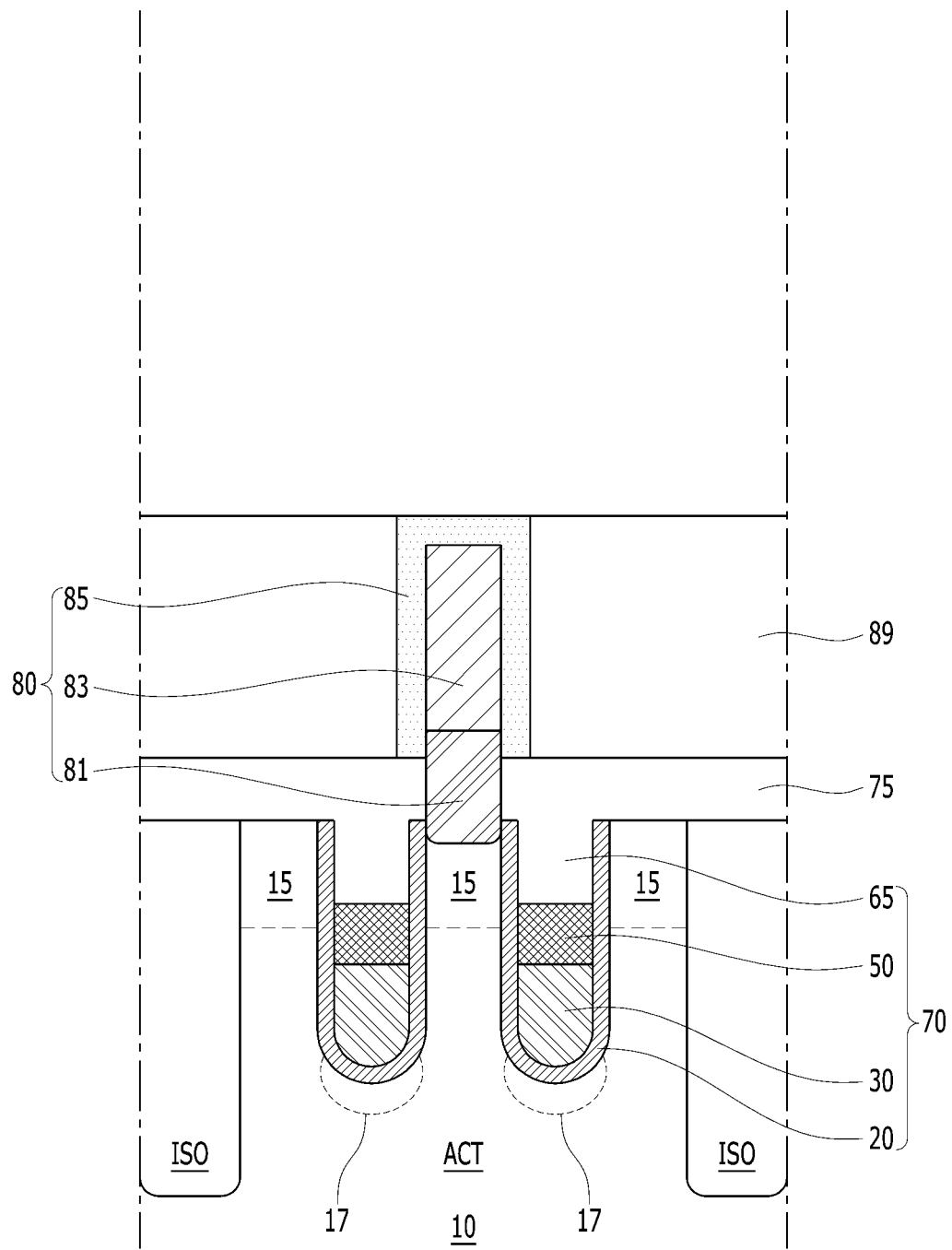
Figure 2O:
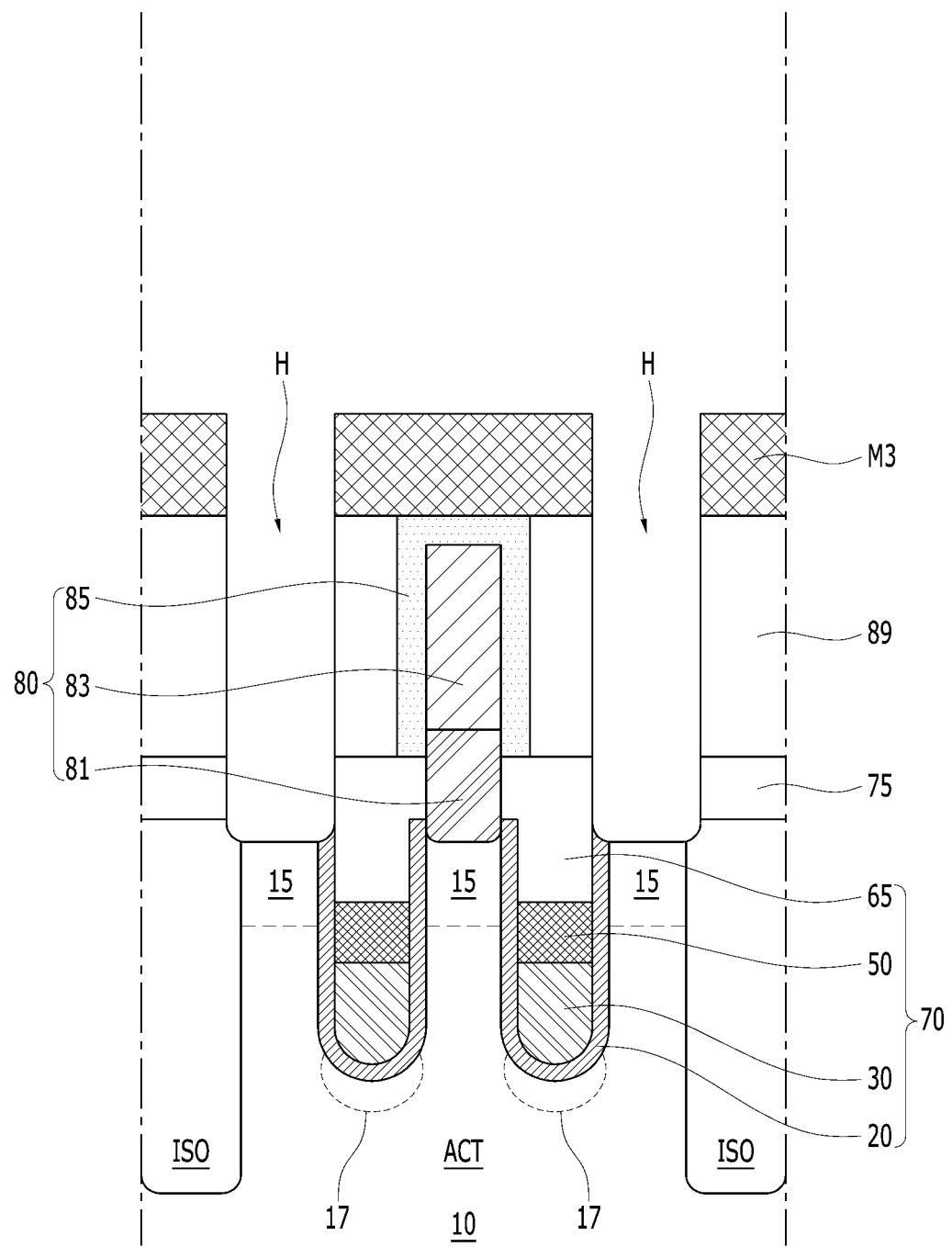
Figure 2P:
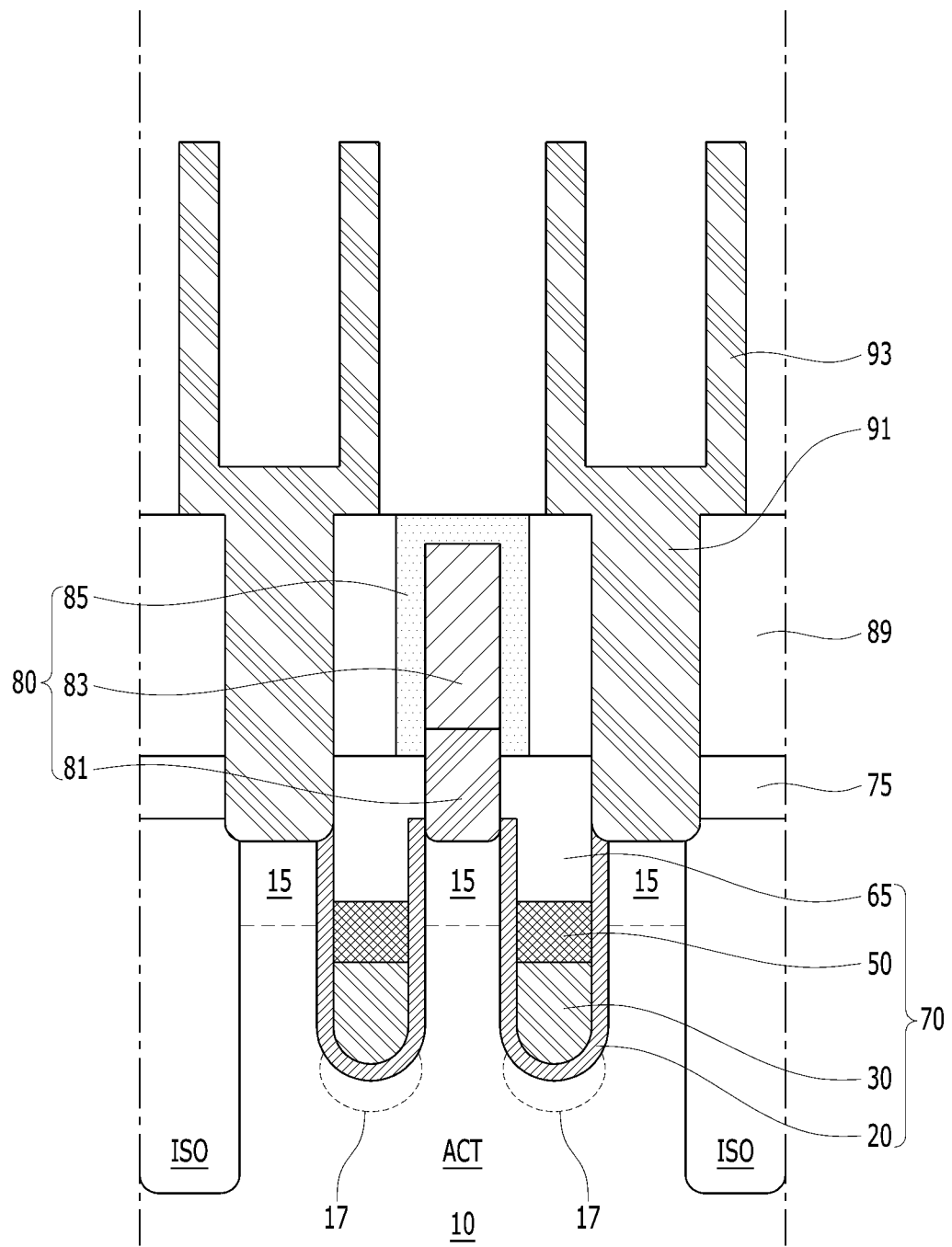
Figure 2Q:
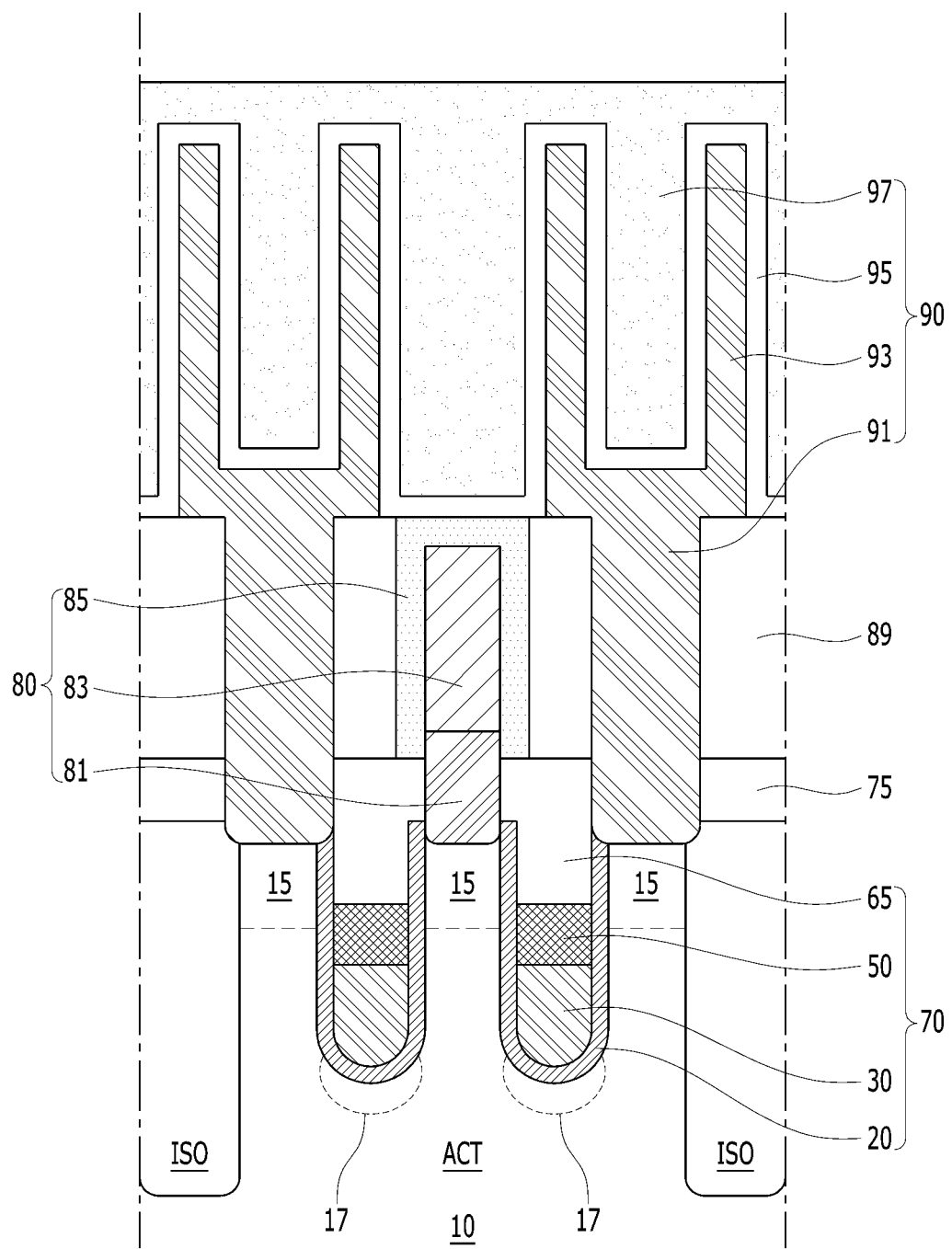

FIGS. 2A to 2Q are cross-sectional views illustrating a method for forming or manufacturing a semiconductor device.

Referring to FIG. 2A, the method may include forming an isolation region ISO that defines an active region ACT in a substrate 10. The substrate 10 may include a monocrystalline silicon layer that is lightly doped with a P-type ion such as boron (B). The forming the isolation region ISO may include performing a shallow trench isolation (STI) process.

Referring to FIG. 2B, the method may include forming a buffer layer 11 on the surface of the substrate 10, and forming a source/drain region 15 in the active region ACT of the substrate 10 through an ion implantation process. The forming the buffer layer 11 may include thinly oxidizing the surface of the substrate 10 or thinly depositing a silicon oxide on the substrate of the substrate 10. The forming the source/drain region 15 may include performing an ion implantation process to implant N-type ions such as phosphorous (P) or arsenic (As) in the active region ACT of the substrate 10. Subsequently, the buffer layer 11 may be removed.

Referring to FIG. 2C, the method may include forming a first mask pattern M1 on the surfaces of the substrate 10 and the isolation region ISO through a photolithography process, and forming a gate trench Tg through an etch process using the first mask pattern M1 as an etch mask. Although not illustrated in the cross-sectional FIGS. 2A through 2Q, the gate trench Tg may be formed as a cylinder-like well, or as a slot-like element that extends in a linear direction through the substrate 10, and may have the same cross-sectional configuration in either case. The first mask pattern M1 may include a photoresist, a silicon oxide, a silicon nitride, a spin-on-hard mask (SOH), or one of combinations thereof.

Referring to FIG. 2D, the method may include forming an ion implantation region 17 through an ion implantation process of implanting boron (B) in the active region ACT of the substrate 10, particularly at the bottom of exposed gate trench Tg. The forming the ion implantation region 17 may include implanting boron fluoride ions ($BF_3^+$ and $BF_2^{2+}$) in the active region ACT through a local channel ion implantation method. The local channel ion implantation method may include implanting the boron fluoride ions in the active region ACT of the substrate 10 to an ion concentration of approximately 1E12 ($1\times10^{12}$) to 1E13 ($1\times10^{13}$) ion/cm$^2$ in an acceleration energy of approximately 20 to 30 KeV. The ion implantation energy and ion implantation concentration of the boron fluoride ions, which are used to increase a threshold voltage of a channel, may be adjusted and changed in various manners depending on operation conditions and operation characteristics of the channel. Subsequently, the first mask pattern M1 may be removed.

Thereafter, a cleaning process for curing the surface of the substrate 10 exposed in the gate trench Tg may be performed. The cleaning process may include extremely thinly peeling out the surface of the substrate 10 exposed in the gate trench Tg. In some embodiments, the ion implantation region 17 may have a pocket or bowl-like shape surrounding the bottom of the gate trench Tg. In other words, the ion implantation region 17 may be formed not only on the bottom surface of the gate trench Tg but also partially on the sidewalls of the gate trench Tg. However, the ion implantation region 17 may be spaced apart from the source/drain region 15.

Referring to FIG. 2E, the method may include conformally forming a gate dielectric layer 20 on the inner sidewalls and bottom surface of the gate trench Tg. The forming the gate dielectric layer 20 may include a silicon oxidation process. That is, the surface of the substrate 10 exposed in the gate trench Tg may be oxidized. In some embodiments, the method may include disposing a high-k dielectric layer such as a hafnium oxide ($HfO_x$) layer on the substrate 10 exposed in the gate trench Tg through a deposition process to form gate dielectric layer 20. The silicon oxidation process may include a thermal oxidation process. Accordingly, a separate thermal treatment process (e.g., an anneal process) for diffusing the boron fluoride ions ($BF_3^+$ and $BF_2^{2+}$) in the active region ACT may not be necessary because diffusion can be performed simultaneously in the silicon oxidation process. That is, the thermal treatment process may need to be performed only once. Since it is desirable that the thermal treatment process is performed as few times as possible, deterioration in characteristics of the cryogenic semiconductor device attributable to frequent thermal treatment processes may be mitigated or reduced.

Referring to FIG. 2F, the method may include forming a lower gate electrode material layer 30a on the gate dielectric layer 20 inside the gate trench Tg and on the surface of the substrate 10 through a deposition process. The lower gate electrode material layer 30a may include a conductor having a relatively low work function. For example, the lower gate electrode material layer 30a may include polysilicon doped with N-type ions. Accordingly, the deposition process may include an N-type doping process and an N-type deposition process for depositing doped silicon. A separate N-type doping process may not need to be performed because N-type ions may be supplied in a gaseous form during the deposition process.

Referring to FIG. 2G, the method may include forming a lower gate electrode 30 by removing an upper portion of the lower gate electrode material layer 30a through an etch-back process. As the upper portion of the lower gate electrode material layer 30a is removed, the upper surface of the lower gate electrode 30 may be located at a half of the depth of the gate trench Tg or less. For example, the upper surface of the lower gate electrode 30 may be located at a lower level than the bottom of the source/drain region 15.

Referring to FIG. 2H, the method may include forming an upper gate electrode material layer 50a in the gate trench Tg and on the surface of the substrate 10 through a deposition process. The upper gate electrode material layer 50a may include a conductor having a relatively higher work function than the lower gate electrode 30.

The upper gate electrode material layer 50a may include a material capable of forming an ohmic contact with the lower gate electrode 30. For example, the upper gate electrode material layer 50a may include a barrier metal. The upper gate electrode material layer 50a may include a titanium nitride (TiN), as an example.

In some embodiments of the present disclosure, the upper gate electrode material layer 50a may include a material having a higher work function than the lower gate electrode 30 to a degree sufficient to modify the threshold voltage of a device at low or cryogenic temperatures. For example, the upper gate electrode material layer 50a may include a metal, a metal compound, or a metal alloy. For example, the upper gate electrode material layer 50a may include tungsten (W).

Referring to FIG. 2I, the method may include forming an upper gate electrode 50 by removing the upper portion of the upper gate electrode material layer 50a through an etch-back process. The upper portion of the upper gate electrode material layer 50a is removed so that the upper surface of the upper gate electrode 50 may be located in the gate trench Tg.

The upper surface of the upper gate electrode 50 may be located at a higher level than the bottom surface of the source/drain region 15.

Referring to FIG. 2J, the method may include forming a gate structure 70 by forming a dielectric gate capping layer 65 to fill the gate trench Tg through a deposition process, and forming a lower interlayer dielectric layer 75 to be stacked on the upper surface of the substrate 10. The gate structure 70 may include the gate dielectric layer 20, the lower gate electrode 30, the upper gate electrode 50, and the gate capping layer 65. For example, the gate capping layer 65 may include a silicon nitride, and the lower interlayer dielectric layer 75 may include a silicon oxide. In some embodiments of the present disclosure, the gate capping layer 65 and the lower interlayer dielectric layer 75 may be the same material. For example, the gate capping layer 65 and the lower interlayer dielectric layer 75 may be a silicon nitride or a silicon oxide. When the gate capping layer 65 and the lower interlayer dielectric layer 75 are the same material, the gate capping layer 65 and the lower interlayer dielectric layer 75 may be successively formed during a single process. When the gate capping layer 65 and the lower interlayer dielectric layer 75 are the same material, a chemical mechanical polishing (CMP) process may be performed to planarize the upper surface of the lower interlayer dielectric layer 75. During the CMP process, the gate structure 70 including the gate dielectric layer 20, the lower gate electrode 30, the upper gate electrode 50 and the gate capping layer 65 may be formed.

Referring to FIG. 2K, the method may include forming a second mask pattern M2 on the lower interlayer dielectric layer 75 through a photolithography process, and forming a bit line trench Tb through an etch process using the second mask pattern M2 as an etch mask. The bit line trench Tb may expose the source/drain region 15 in the active region ACT. Subsequently, the second mask pattern M2 may be removed. In some embodiments of the present disclosure, the bit line trench Tb may have a hole-like or well-like shape. That is, the bit line trench Tb may have the hole-like or well-like shape instead of a trench-like shape. In such cases, the bit line trench Tb may be referred to as a bit line contact hole.

Referring to FIG. 2L, the method may include forming a conductive lower bit line material layer 81a in the bit line trench Tb and on the lower interlayer dielectric layer 75 through a deposition process, and forming a conductive upper bit line material layer 83a on the lower bit line material layer 81a. The lower bit line material layer 81a may be a single layer including doped polysilicon, a metal, a metal silicide or a metal compound, or it may be a multi-layer including any combination of the above materials. The upper bit line material layer 83a may include a metal or a metal compound.

Referring to FIG. 2M, the method may include forming a lower bit line 81 and an upper bit line 83 by successively patterning the upper bit line material layer 83a and the lower bit line material layer 81a through an etch process. The lower bit line 81 may have a line shape extending horizontally in a one-dimensional way, or a plug-like or pillar-like shape. The upper bit line 83 may have a line shape extending horizontally in a one-dimensional way.

Referring to FIG. 2N, the method may include forming a bit line stack 80 by disposing a bit line capping spacer 85 that surrounds the exposed surfaces of the lower bit line 81 and the upper bit line 83. The method may include forming an intermediate interlayer dielectric layer 89 formed on the lower interlayer dielectric layer 75 and the side surfaces of the bit line stack 80. The forming the bit line capping spacer 85 may include conformally forming a dielectric layer such as a silicon nitride layer on the exposed surfaces of lower bit line 81, the upper bit line 83 and the lower interlayer dielectric layer 75, and performing an etch-back process. The forming the intermediate interlayer dielectric layer 89 may include depositing a silicon oxide on the bit line stack 80 and the lower interlayer dielectric layer 75, and then performing a CMP process. The upper surface of the bit line capping spacer 85 may be substantially coplanar with the upper surface of the intermediate interlayer dielectric layer 89.

Referring to FIG. 2O, the method may include forming a third mask pattern M3 on the intermediate interlayer dielectric layer 89 through a photolithography process. The mask pattern M3 can protect, for example, bit line stack 80. The method may include forming storage contact holes H that expose the source/drain regions 15 of the active region ACT are formed by vertically penetrating the intermediate interlayer dielectric layer 89 through an etch process, using the third mask pattern M3 as an etch mask. Subsequently, the third mask pattern M3 may be removed.

Referring to FIG. 2P, the method may include forming storage contact plugs 91 to fill the storage contact holes H, and forming lower storage electrodes 93 on the storage contact plugs 91. The storage contact plugs 91 may have a pillar-like shape, and the lower storage electrodes 93 may have a cylinder-like shape. The storage contact plugs 91 and the lower storage electrodes 93 may include a conductive material. For example, the storage contact plugs 91 and the lower storage electrodes 93 may include doped polysilicon, a metal, a metal silicide, a metal compound, a metal alloy, or any combinations thereof.

Referring to FIG. 2Q, the method may include conformally forming a storage dielectric layer 95 on the exposed surfaces of the lower storage electrodes 93 through a deposition process. The method may include forming a storage structure 90 by forming an upper storage electrode 97 on the storage dielectric layer 95. The storage dielectric layer 95 may include a silicon oxide, a silicon nitride, a metal oxide such as a hafnium oxide ($HfO_x$), a high-k material, or any combinations thereof. The upper storage electrode 97 may include doped polysilicon, a metal, a metal silicide, a metal compound, a metal alloy, or any combinations thereof.

Subsequently, referring back to FIG. 1A, the method may include forming an upper interlayer dielectric layer 99 on the storage structure 90 through a deposition process. The upper interlayer dielectric layer 99 may include a dielectric material such as a silicon nitride or a silicon oxide.

FIGS. 3A to 3D are cross-sectional views illustrating a method for forming a cryogenic semiconductor device.

Figure 3A:
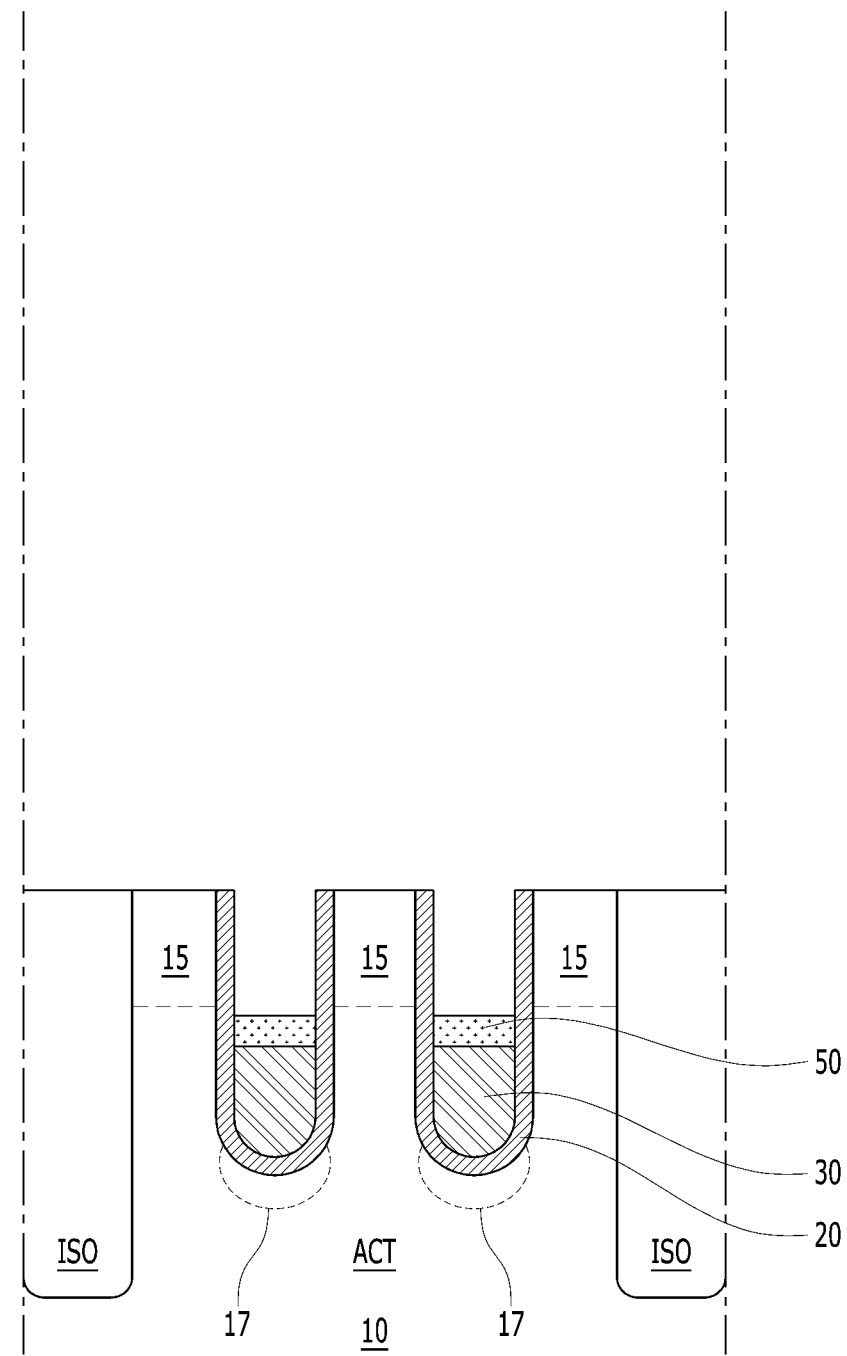

Referring to FIG. 3A, the method may include forming an isolation region ISO that defines an active region ACT in a substrate 10, forming a source/drain region 15, forming a gate trench Tg, forming an ion implantation region 17 in the gate trench Tg, forming a gate dielectric layer 20 in the gate trench Tg, forming a lower gate electrode 30 on the gate dielectric layer 20, and forming an upper gate electrode 50 on the lower gate electrode 30, through the series of processes described above and with reference to FIGS. 2A to 2I. The upper surface of the upper gate electrode 50 may be located at a lower level than the bottom surface of the source/drain region 15.

Figure 3B:
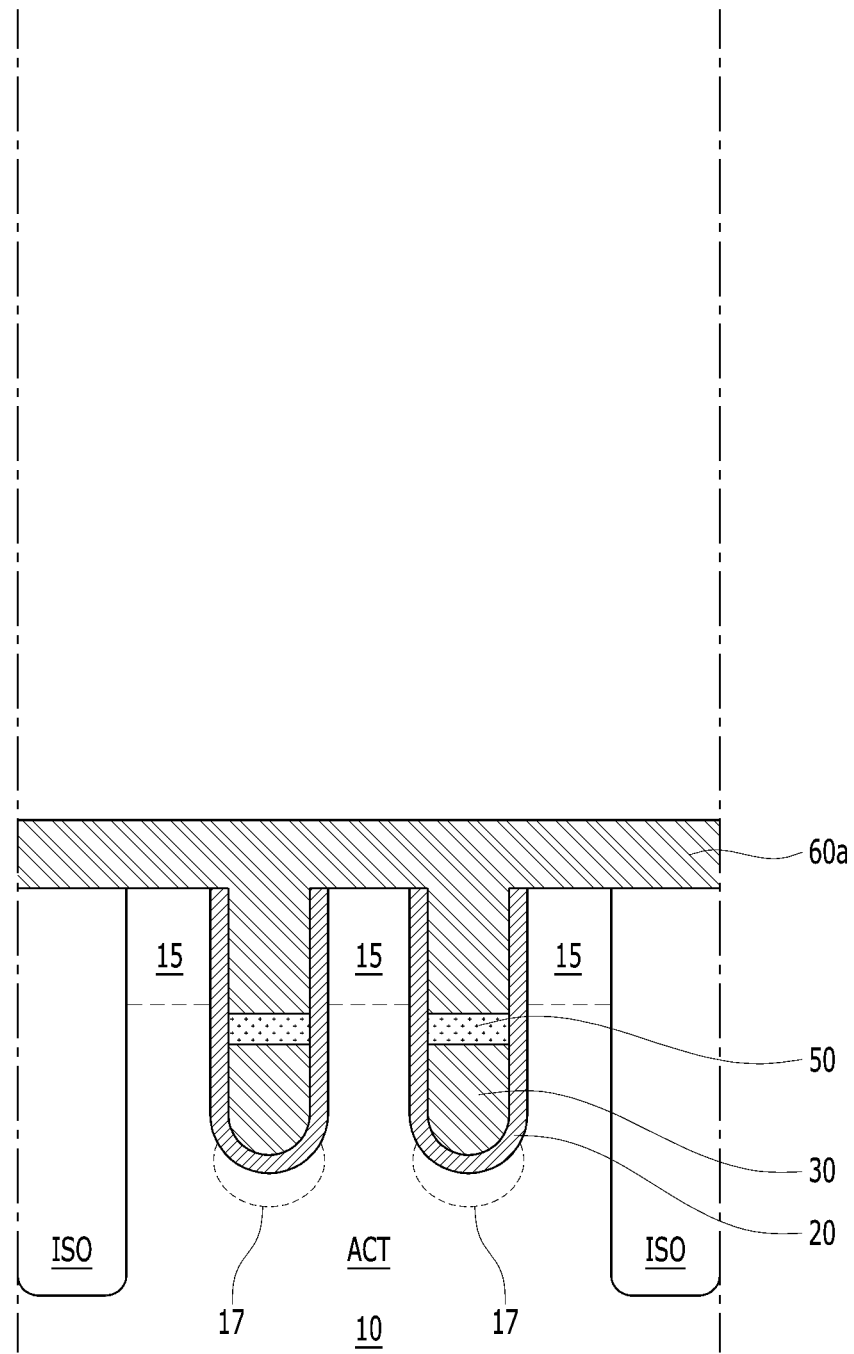

Referring to FIG. 3B, the method may include forming a capping gate electrode material layer 60a on the upper gate electrode 50 in the gate trench Tg and the surface of the substrate 10. The capping gate electrode material layer 60a may include a conductor having a relatively lower work function than the upper gate electrode 50. For example, the capping gate electrode material layer 60a may include the same material as the lower gate electrode 30. Specifically, the capping gate electrode material layer 60a may include polysilicon doped with an N-type ion.

Figure 3C:
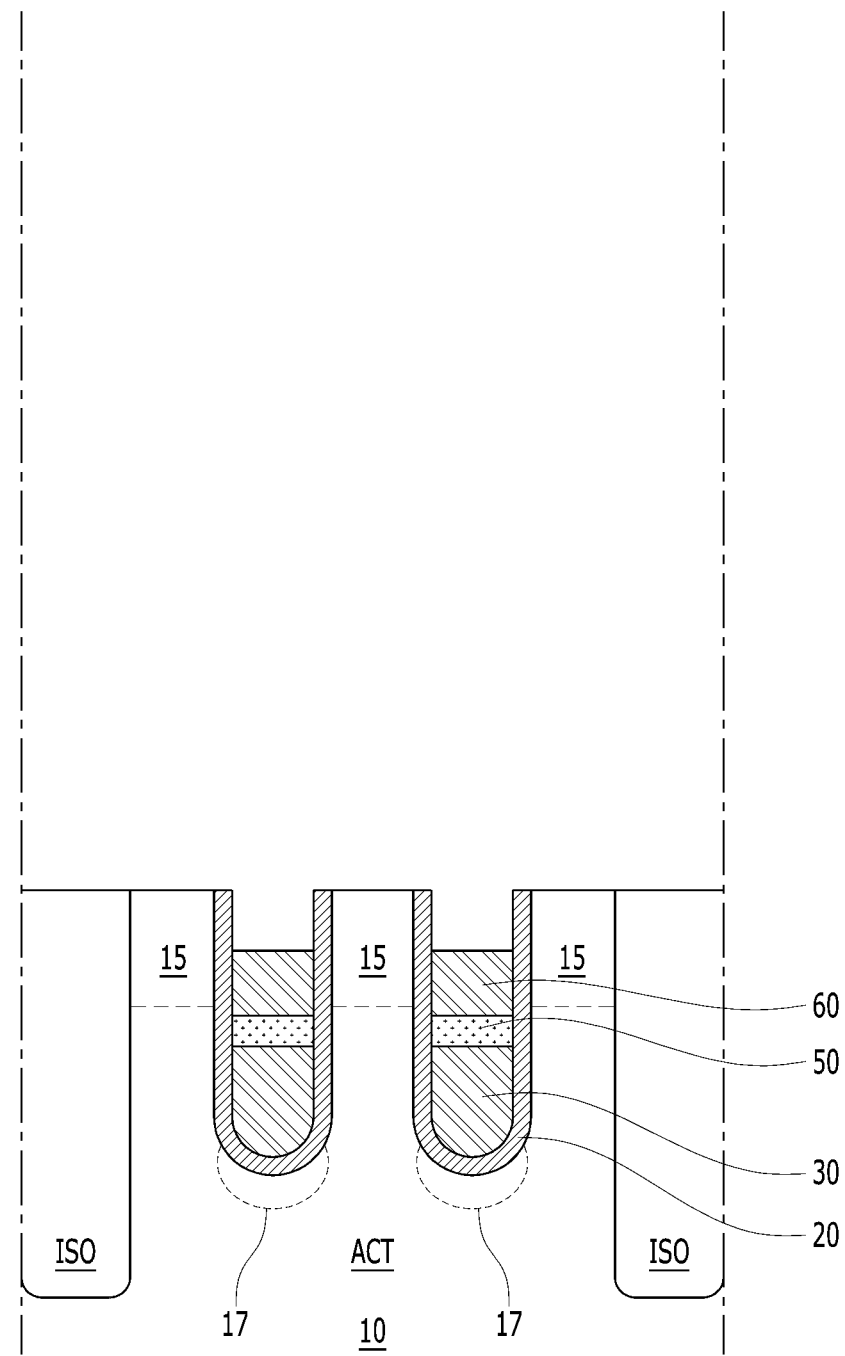

Referring to FIG. 3C, the method may include forming a capping gate electrode 60 by removing the upper portion of the capping gate electrode material layer 60a through an etch-back process. The upper surface of the capping gate electrode 60 may be located in the gate trench Tg. For example, the upper surface of the capping gate electrode 60 may be located at a higher level than the bottom or lowest portion of the source/drain region 15.

Figure 3D:
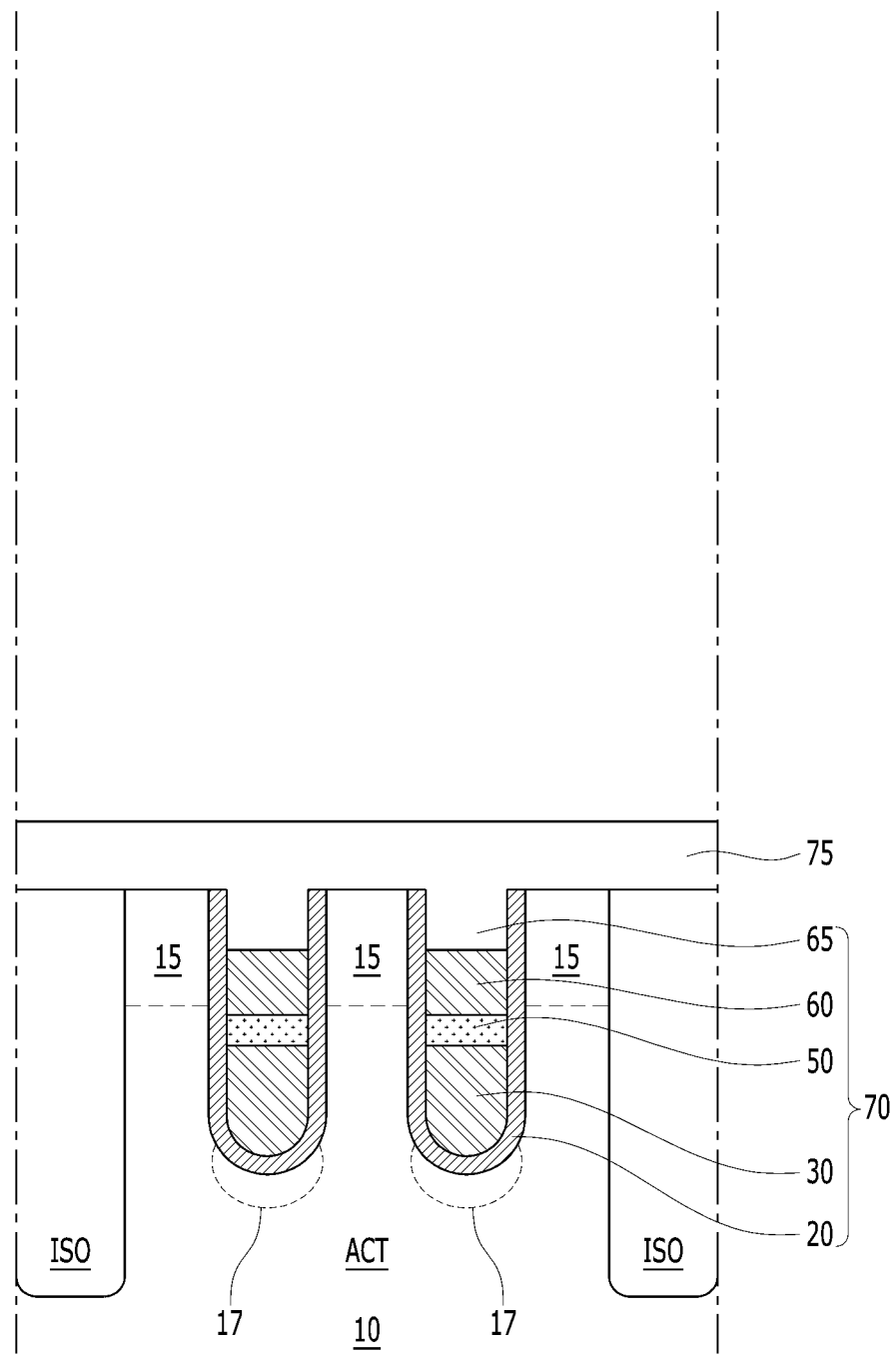

Referring to FIG. 3D, the method may include forming a gate structure 70 by forming a dielectric gate capping layer 65 to fill the gate trench Tg through a deposition process, and forming a lower interlayer dielectric layer 75 to be stacked on the upper surface of the substrate 10. The gate structure 70 may include the gate dielectric layer 20, the lower gate electrode 30, the upper gate electrode 50, the capping gate electrode 60, and the gate capping layer 65.

Subsequently, the method may include forming a bit line stack 80, forming an intermediate interlayer dielectric layer 89, and forming a storage structure 90, through the series of processes described above and with reference to FIGS. 2K to 2Q. Referring back to FIG. 1B, the method may further include forming an upper interlayer dielectric layer 99 on the storage structure 90.

FIGS. 4A to 4E are cross-sectional views illustrating a method for forming a semiconductor device.

Figure 4A:
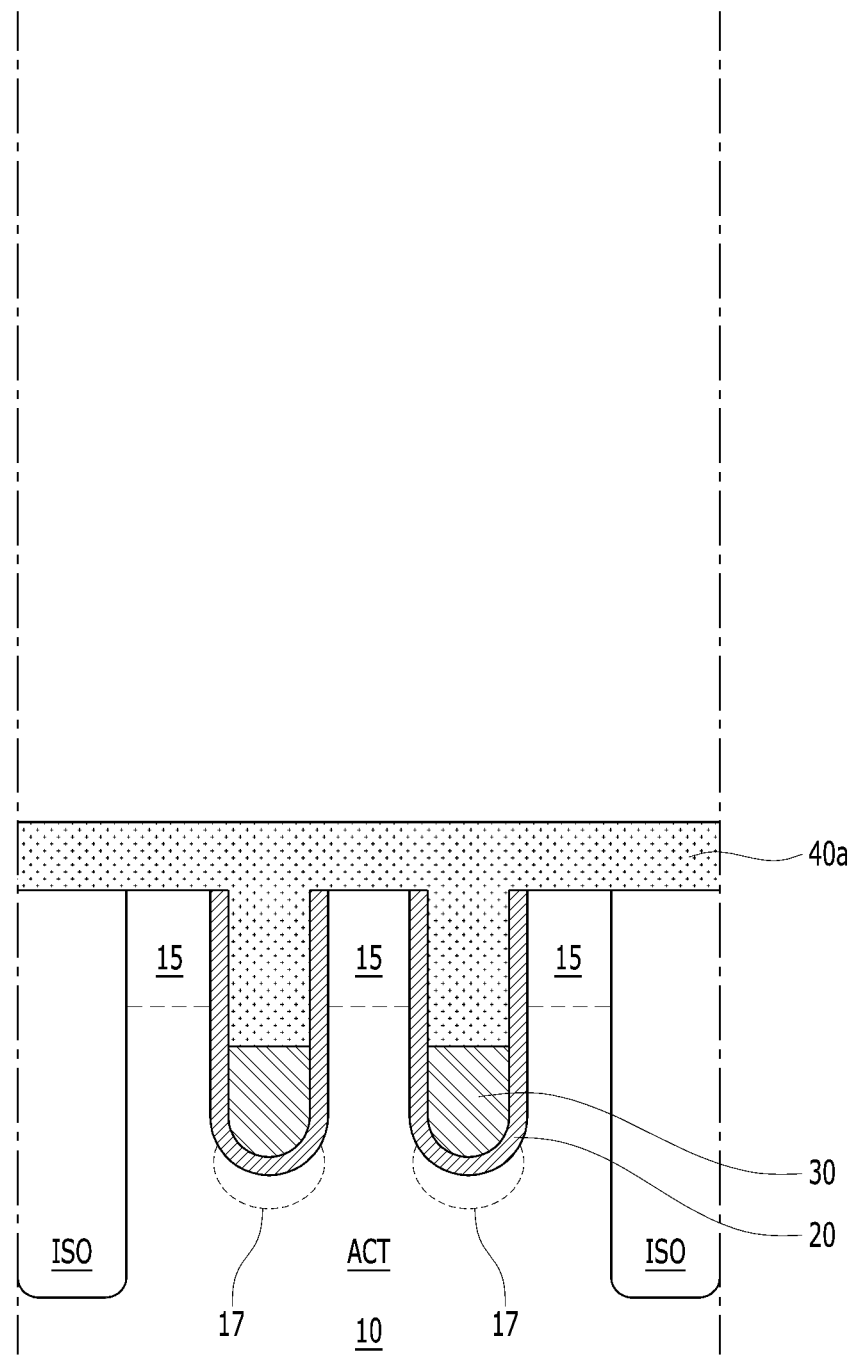

Referring to FIG. 4A, the method may include forming an isolation region ISO that defines an active region ACT in a substrate 10, forming a source/drain region 15, forming a gate trench Tg, forming an ion implantation region 17 in the active region ACT exposed at the bottom of the gate trench Tg, forming a gate dielectric layer 20 in the gate trench Tg, forming a lower gate electrode 30 on the gate dielectric layer 20, and forming an intermediate gate electrode material layer 40a on the lower gate electrode 30 in the gate trench Tg through the series of processes described above with reference to FIGS. 2A to 2G. The intermediate gate electrode material layer 40a may be also formed on the surface of substrate 10. The intermediate gate electrode material layer 40a may include a conductor having a relatively higher work function than the lower gate electrode 30. The intermediate gate electrode material layer 40a may include a conductor capable of forming an ohmic contact with the lower gate electrode 30. For example, the intermediate gate electrode material layer 40a may include a barrier metal. Specifically, the intermediate gate electrode material layer 40a may include a titanium nitride (TiN) as an example.

Figure 4B:
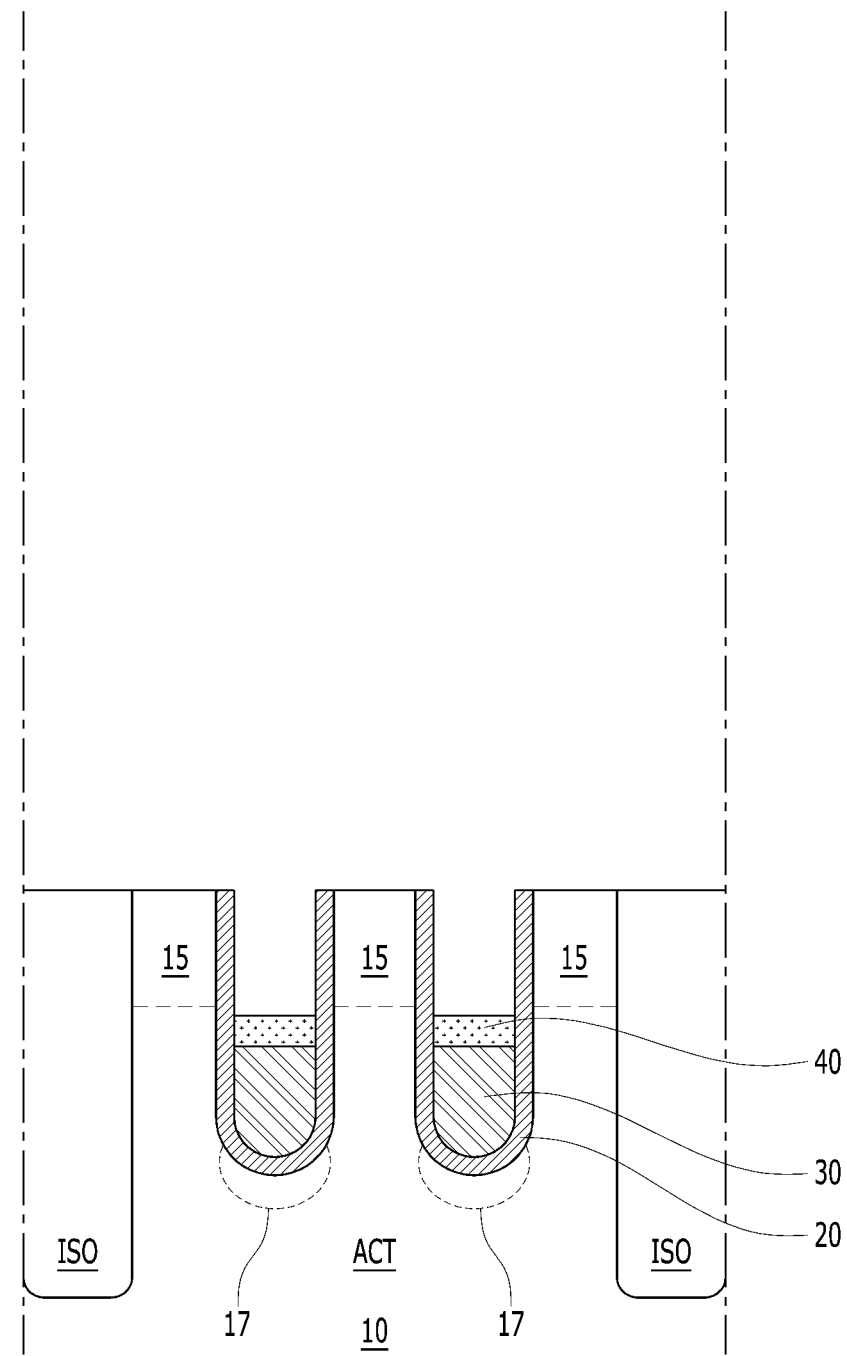

Referring to FIG. 4B, the method may include forming an intermediate gate electrode 40 by removing the upper portion of the intermediate gate electrode material layer 40a through an etch-back process. The intermediate gate electrode 40 may be located approximately in the middle of the gate trench Tg. The upper surface of the intermediate gate electrode 40 may be located at a lower level than the bottom or lowermost region of the source/drain region 15.

Figure 4C:
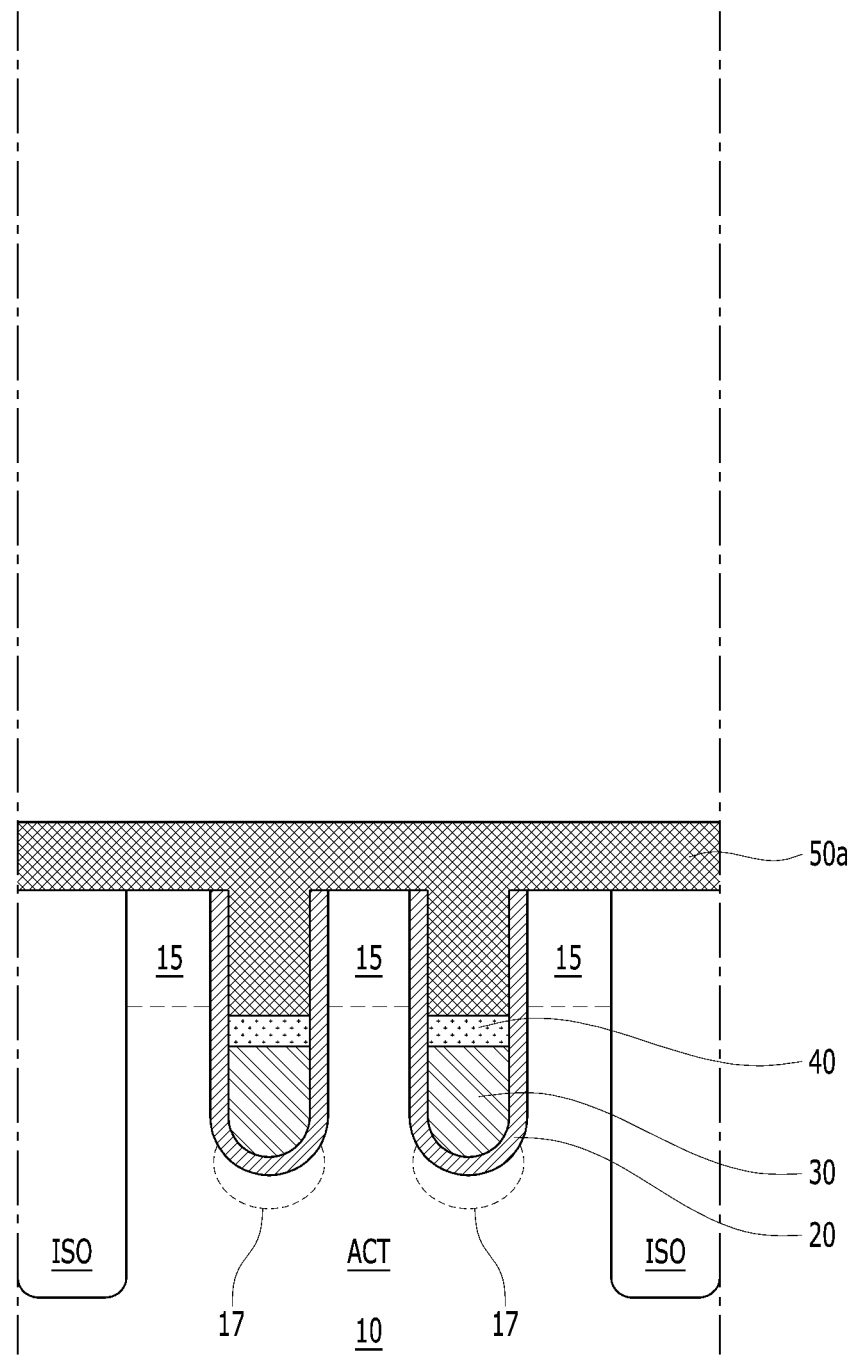

Referring to FIG. 4C, the method may include forming an upper gate electrode material layer 50a on the intermediate gate electrode 40 to fill the gate trench Tg and on the surface of substrate 10. The upper gate electrode material layer 50a may include a conductor having a relatively higher work function than the intermediate gate electrode 40. For example, the upper gate electrode material layer 50a may include a metal, a metal compound, or a metal alloy.

Specifically, the upper gate electrode material layer 50a may include tungsten (W), as an example.

Figure 4D:
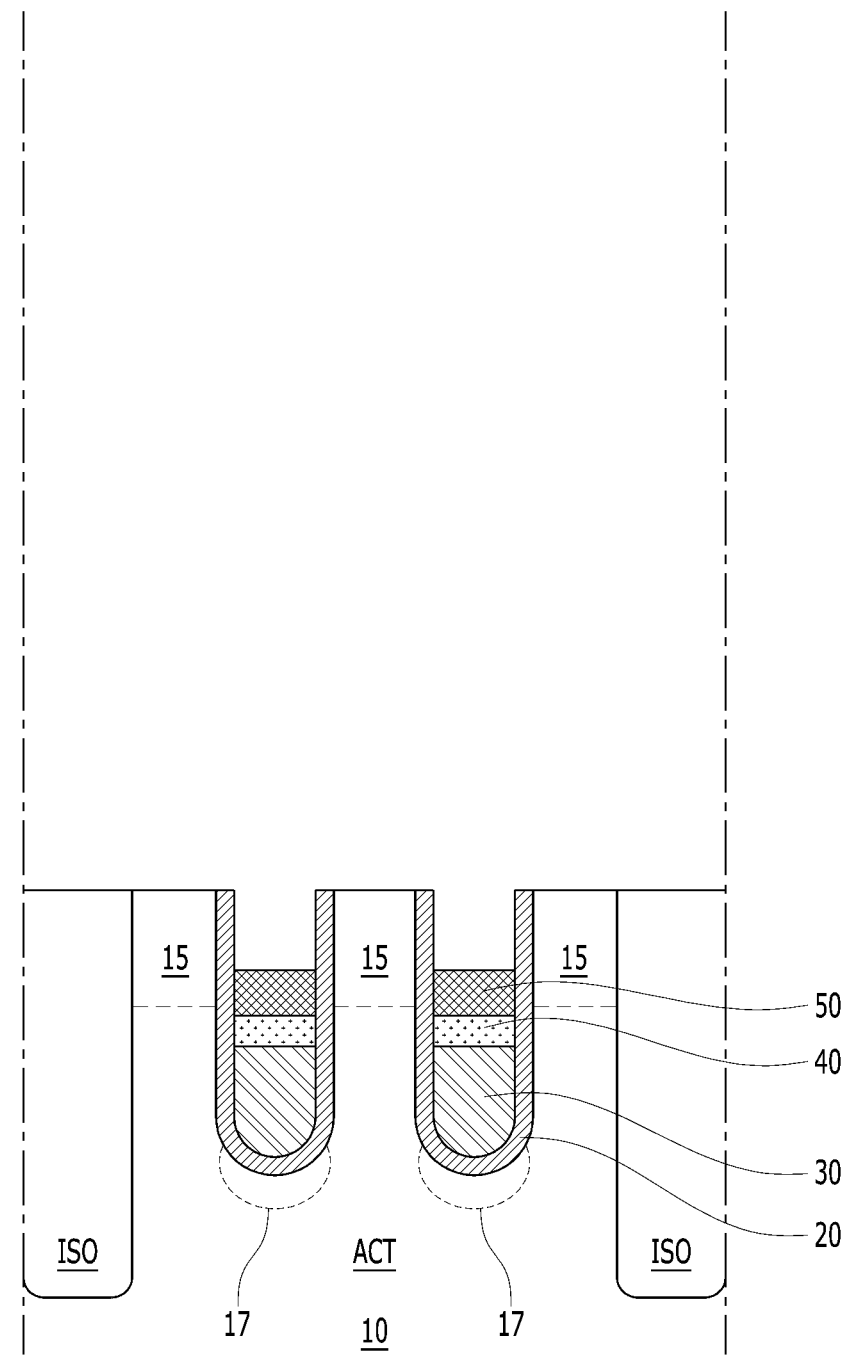

Referring to FIG. 4D, the method may include forming an upper gate electrode 50 by removing the upper portion of the upper gate electrode material layer 50a through an etch-back process. The upper gate electrode 50 may be located in the gate trench Tg. The upper surface of the upper gate electrode 50 may be located at a higher level or above than the bottom surface of the source/drain region 15.

Figure 4E:
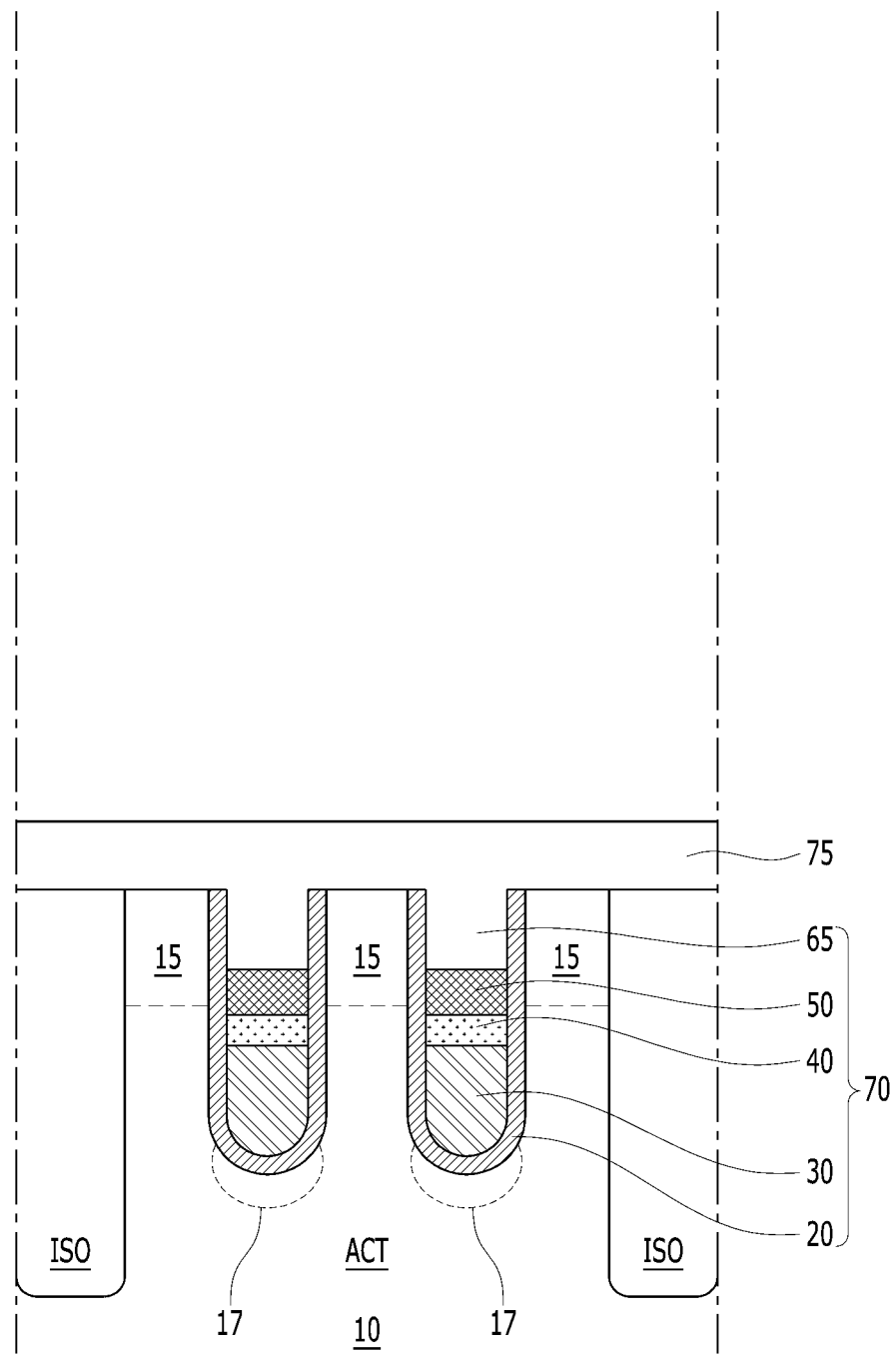

Referring to FIG. 4E, the method may include forming a gate structure 70 by forming a dielectric gate capping layer 65 to fill the gate trench Tg through a deposition process, and forming a lower interlayer dielectric layer 75 to be stacked on or formed on the upper surface of the substrate 10. The gate structure 70 may include the gate dielectric layer 20, the lower gate electrode 30, the intermediate gate electrode 40, the upper gate electrode 50, and the gate capping layer 65.

Subsequently, the method may include forming a bit line stack 80, forming an intermediate interlayer dielectric layer 89, and forming a storage structure 90, through the series of processes described above and with reference to FIGS. 2K to 2Q. Referring back to FIG. 1C, the method may further include forming an upper interlayer dielectric layer 99 on the storage structure 90.

FIGS. 5A to 5E are cross-sectional views illustrating a method for forming a cryogenic semiconductor device.

Figure 5A:
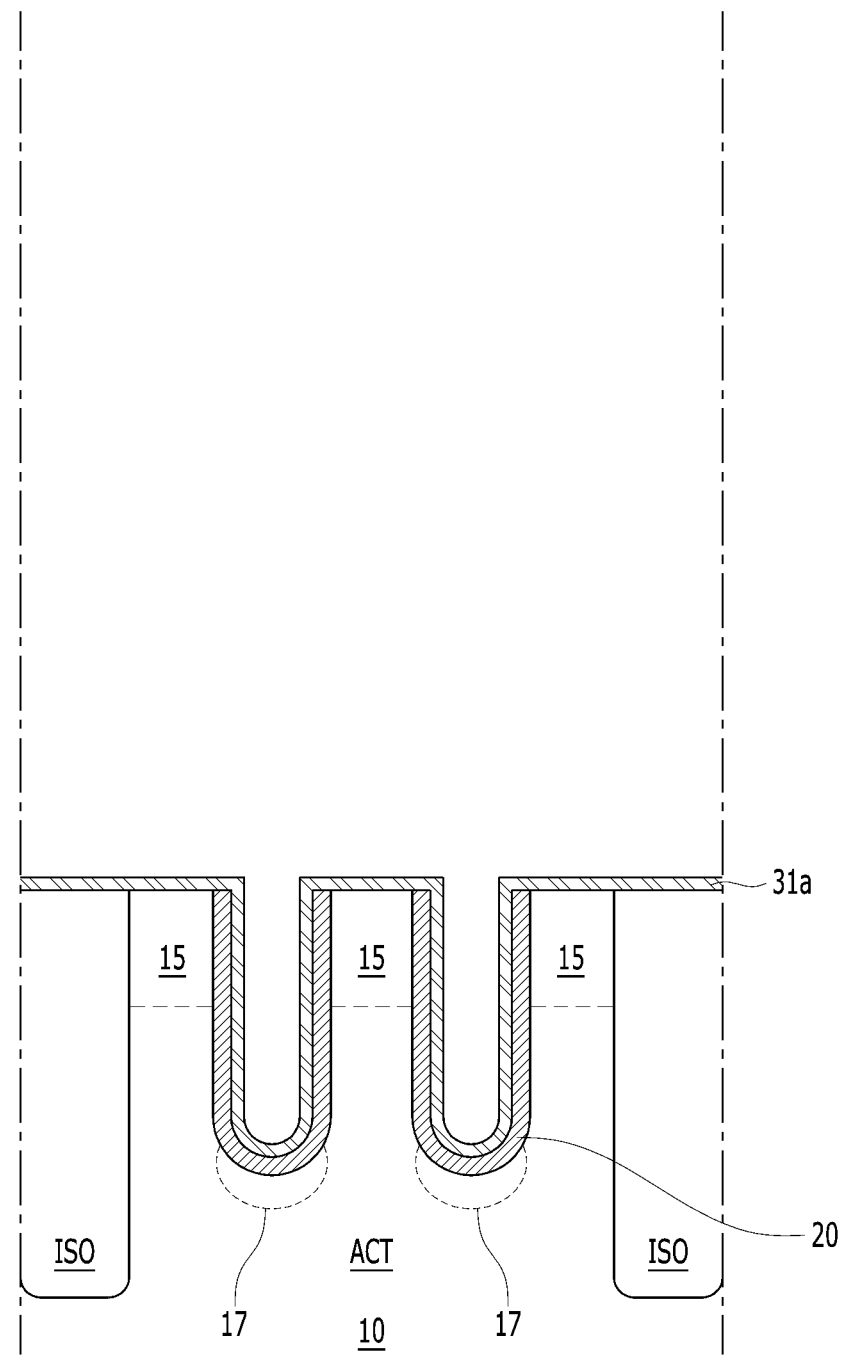

Referring to FIG. 5A, the method may include forming an isolation region ISO that defines an active region ACT in a substrate 10, forming a source/drain region 15, forming a gate trench Tg, forming an ion implantation region 17 in the gate trench Tg, forming a gate dielectric layer 20 in the gate trench Tg, and forming a lower gate electrode material layer 31a on the gate dielectric layer 20 in the gate trench Tb, through the series of processes described above and with reference to FIGS. 2A to 2E. The lower gate electrode material layer 31a may be also formed on the upper surfaces of substrate 10. The lower gate electrode material layer 31a may include a conductor having a relatively low work function. For example, the lower gate electrode material layer 31a may include polysilicon doped with an N-type ion.

Figure 5B:
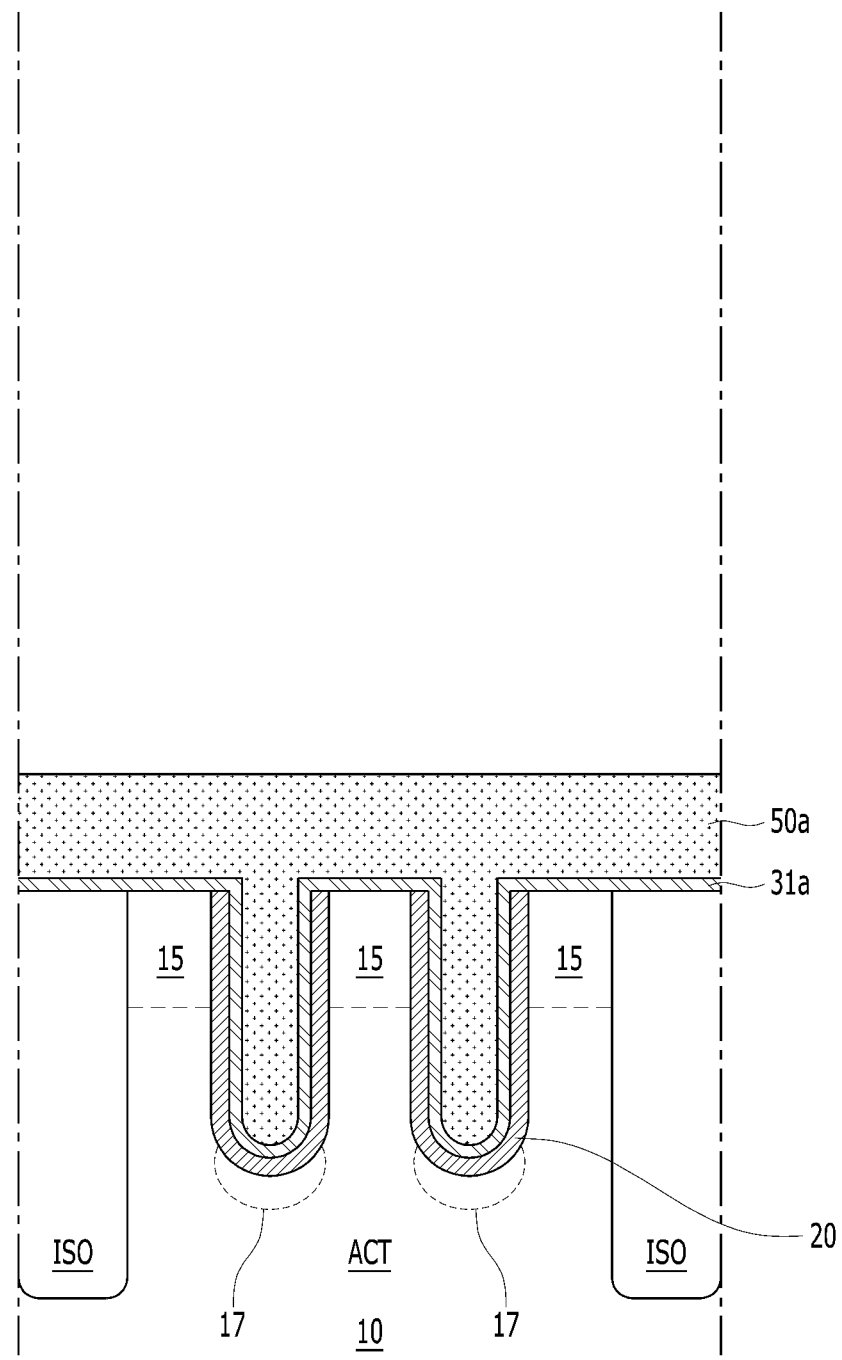

Referring to FIG. 5B, the method may include forming an upper gate electrode material layer 50a on the lower gate electrode material layer 31a and filling the gate trench Tg. The upper gate electrode material layer 50a may include a conductor having a relatively higher work function than the lower gate electrode material layer 31a. For example, the upper gate electrode material layer 50a may include a conductor capable of forming an ohmic contact with the lower gate electrode material layer 31a. For example, the upper gate electrode material layer 50a may include a barrier metal. Specifically, the upper gate electrode material layer 50a may include a titanium nitride (TiN) as an example.

In some embodiments, the upper gate electrode material layer 50a may include a material having a higher work function than the lower gate electrode material layer 31a to a degree sufficient to modify the threshold voltage of a device at low or cryogenic temperatures. The upper gate electrode material layer 50a may include a metal, a metal compound, or a metal alloy. For example, the upper gate electrode material layer 50a may include tungsten (W).

Figure 5C:
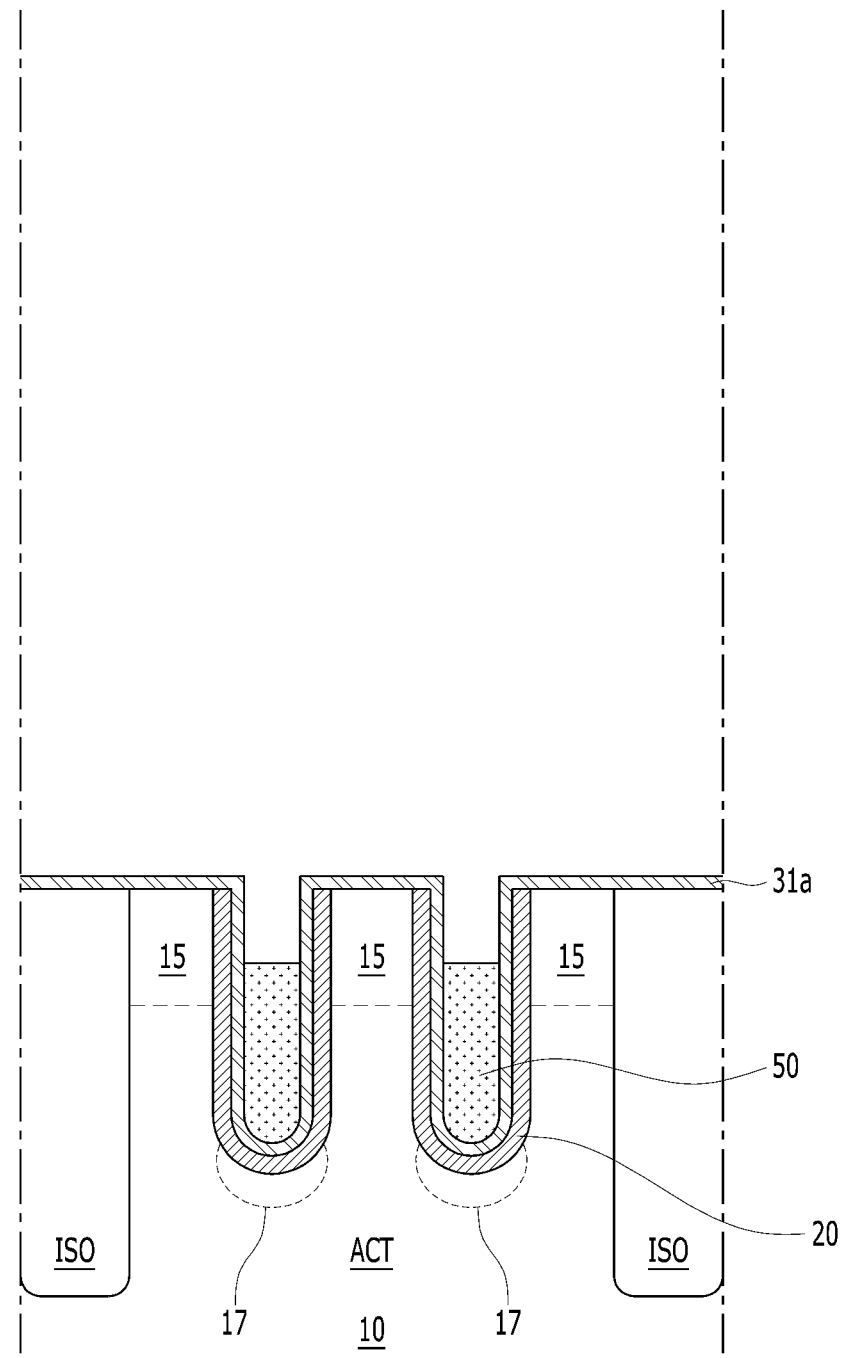

Referring to FIG. 5C, the method may include forming an upper gate electrode 50 in the gate trench Tg by removing the upper portion of the upper gate electrode material layer 50a through an etch-back process. The upper portion of the upper gate electrode material layer 50a is removed so that the upper surface of the upper gate electrode 50 may be located in the gate trench Tg. The upper surface of the upper gate electrode 50 may be located at a higher level than or above the bottom surface or lowermost region of the source/drain region 15.

Figure 5D:
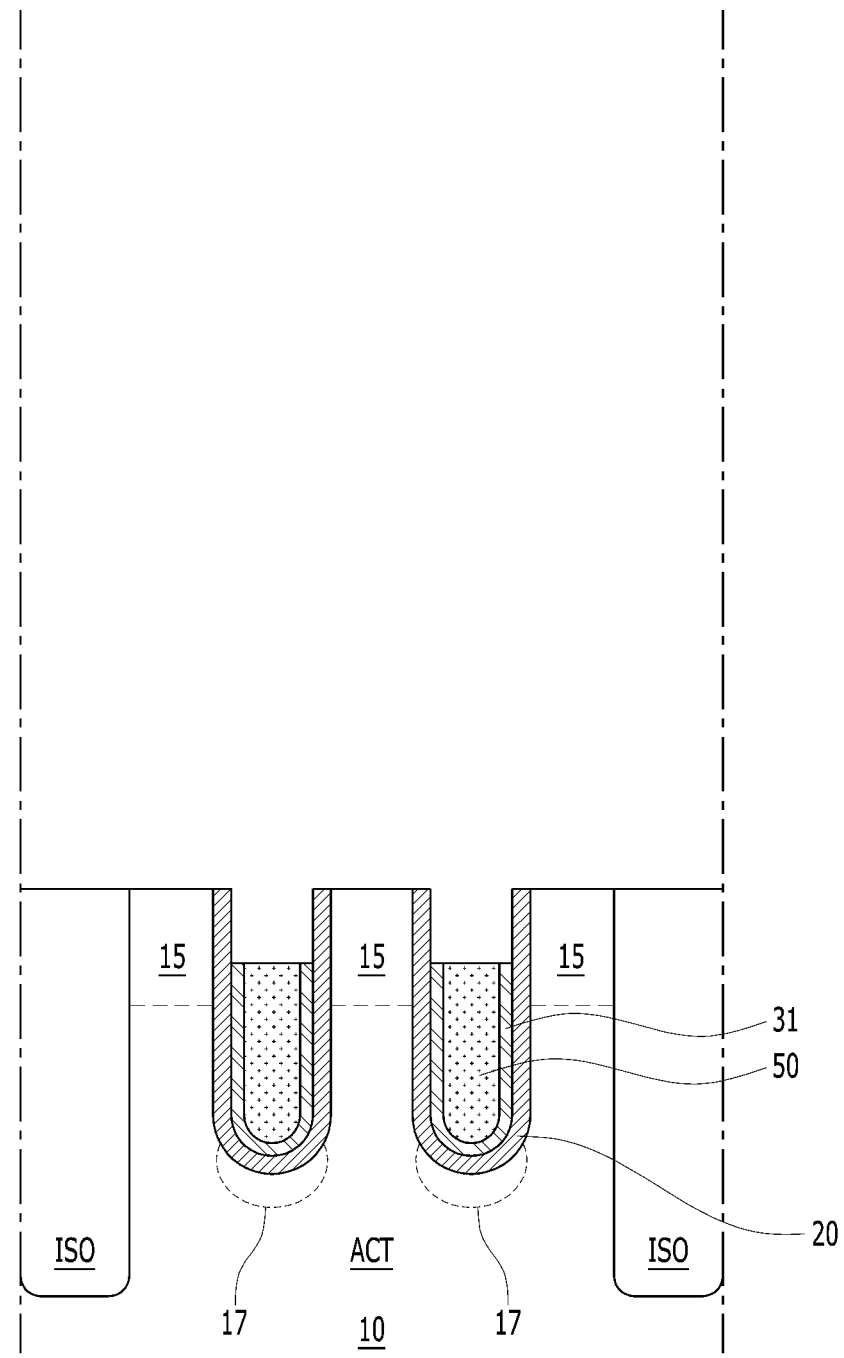

Referring to FIG. 5D, the method may include forming a lower gate electrode 31 in the gate trench Tg by removing portions of the lower gate electrode material layer 31a through an etch-back process. The lower gate electrode 31 can have a cup-like shaped cross section common to the bottom surface and side surfaces of the upper gate electrode 50. The upper surface of the lower gate electrode 31 and the upper surface of the upper gate electrode 50 may be located at a substantially similar level.

Figure 5E:
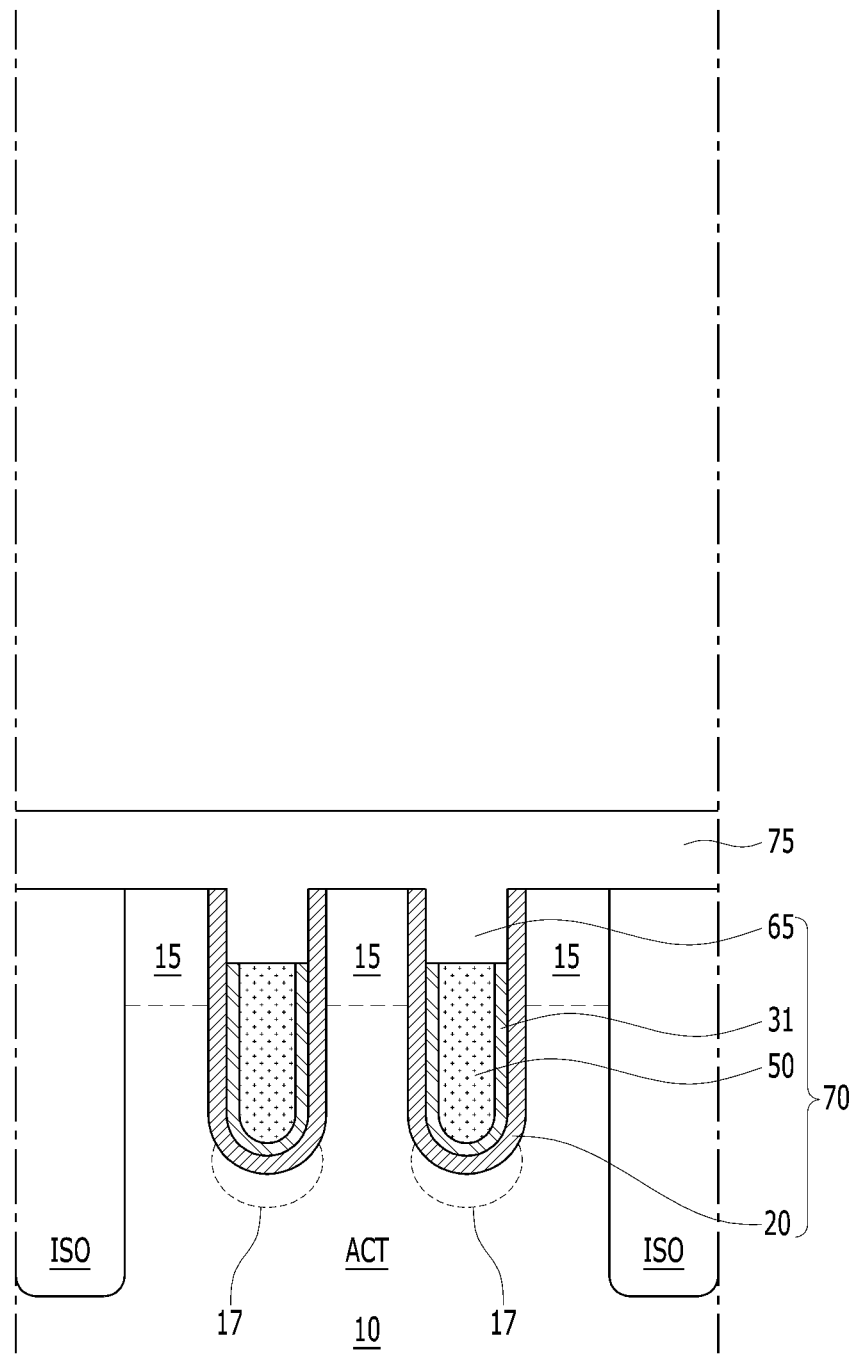

Referring to FIG. 5E, the method may include forming a gate structure 70 by forming a dielectric gate capping layer 65 to fill the gate trench Tg through a deposition process, and forming a lower interlayer dielectric layer 75 to be stacked on the upper surface of the substrate 10. The gate structure 70 may include the gate dielectric layer 20, the cup-like shaped lower gate electrode 31, the upper gate electrode 50, and the gate capping layer 65.

Subsequently, the method may include forming a bit line stack 80, forming an intermediate interlayer dielectric layer 89, and forming a storage structure 90, through the series of processes described above and with reference to FIGS. 2K to 2Q. Referring back to FIG. 1D, the method may further include forming an upper interlayer dielectric layer 99 on the storage structure 90.

FIGS. 6A to 6D are cross-sectional views illustrating a method for forming a cryogenic semiconductor device in accordance with an embodiment.

Figure 6A:
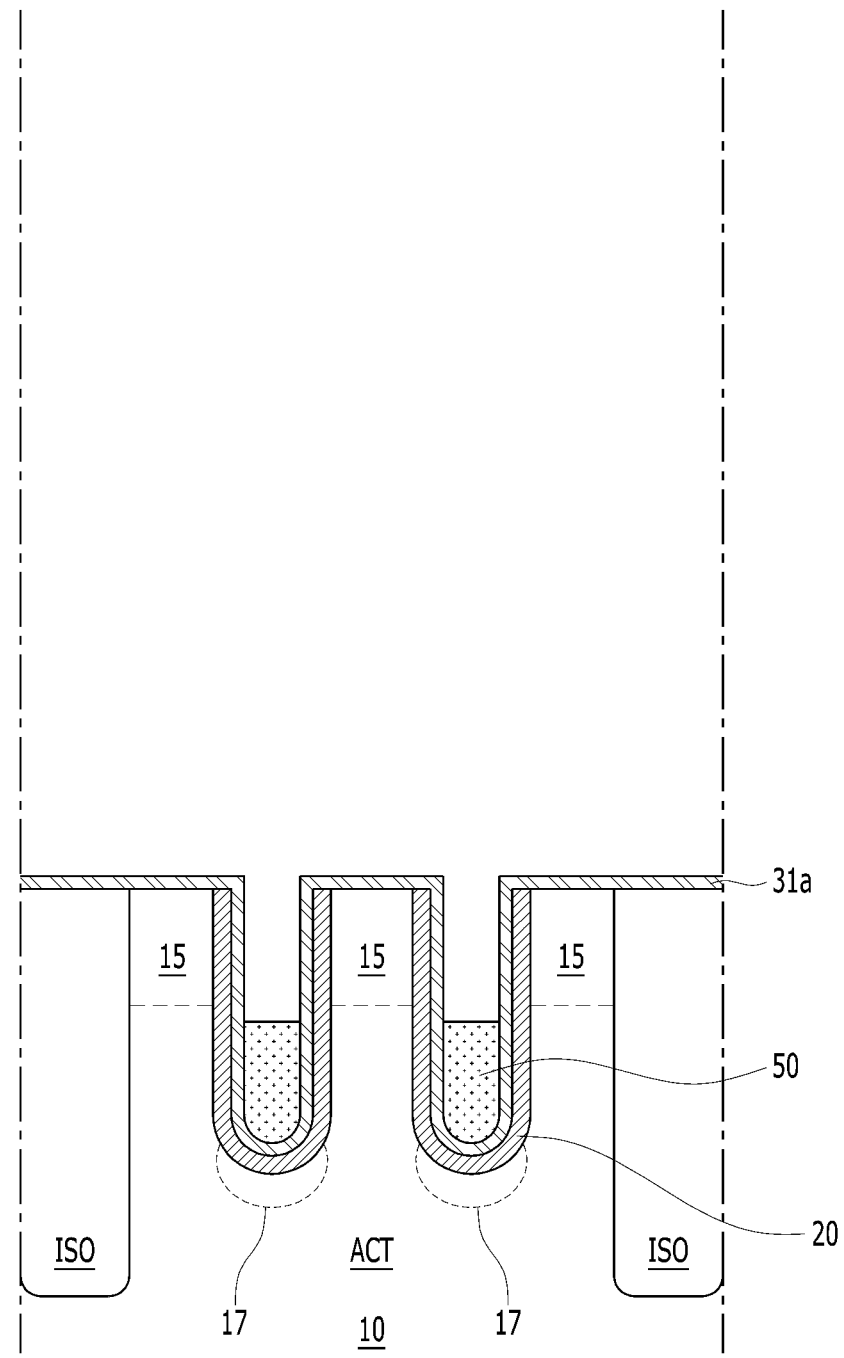

Referring to FIG. 6A, the method may include forming an isolation region ISO that defines an active region ACT in a substrate 10, forming a source/drain region 15, forming a gate trench Tg, forming an ion implantation region 17, forming a gate dielectric layer 20, and conformally forming a lower gate electrode material layer 31a, forming an upper gate electrode material layer 50a, and forming an upper gate electrode 50 in the gate trench Tg by removing the upper portion of the upper gate electrode material layer 50a through an etch-back process, through the series of processes described above with reference to FIGS. 2A to 2E and 5A to 5C. Unlike the method illustrated in FIG. 5C, however, the upper surface of the upper gate electrode 50 in FIG. 6A may be located at a lower level than or below the bottom surface of the source/drain region 15.

The lower gate electrode material layer 31a may include a conductor having a relatively low work function. For example, the lower gate electrode material layer 31a may include polysilicon doped with an N-type ion. The upper gate electrode 50 may include a conductor having a relatively higher work function than the lower gate electrode material layer 31a. For example, the upper gate electrode 50 may include a conductor capable of forming an ohmic contact with the lower gate electrode material layer 31a. For example, the upper gate electrode 50 may include a barrier metal. Specifically, the upper gate electrode 50 may include a titanium nitride (TiN) as an example. In some embodiments, the upper gate electrode 50 may include a material having a sufficiently higher work function than the lower gate electrode material layer 31a to a degree sufficient to modify the threshold voltage of a device at low or cryogenic temperatures. The upper gate electrode 50 may include a metal, a metal compound, or a metal alloy. Specifically, the upper gate electrode 50 may include tungsten (W) as an example.

Figure 6B:
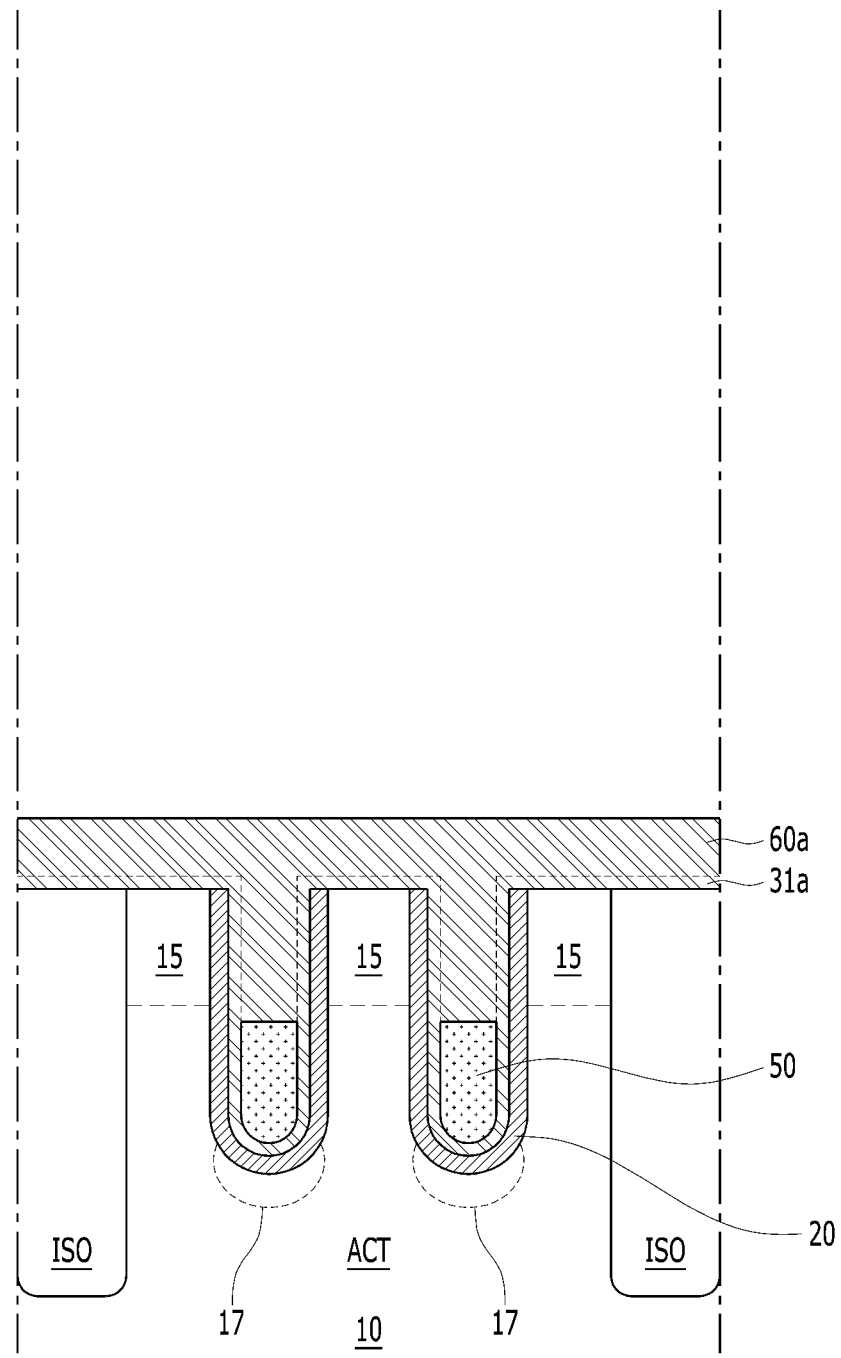

Referring to FIG. 6B, the method may include forming a capping gate electrode material layer 60a on the upper gate electrode 50 and the lower gate electrode material layer 31a and filling the gate trench Tg. The capping gate electrode material layer 60a may include a conductor having a relatively lower work function than the upper gate electrode 50. For example, the capping gate electrode material layer 60a may include the same material as the lower gate electrode material layer 31a. Specifically, the capping gate electrode material layer 60a may include polysilicon doped with an N-type ion. When the lower gate electrode material layer 31a and the capping gate electrode material layer 60a include the same material, an interface between the lower gate electrode material layer 31a and the capping gate electrode material layer 60a is indicated by a dotted line in FIG. 6B.

Figure 6C:
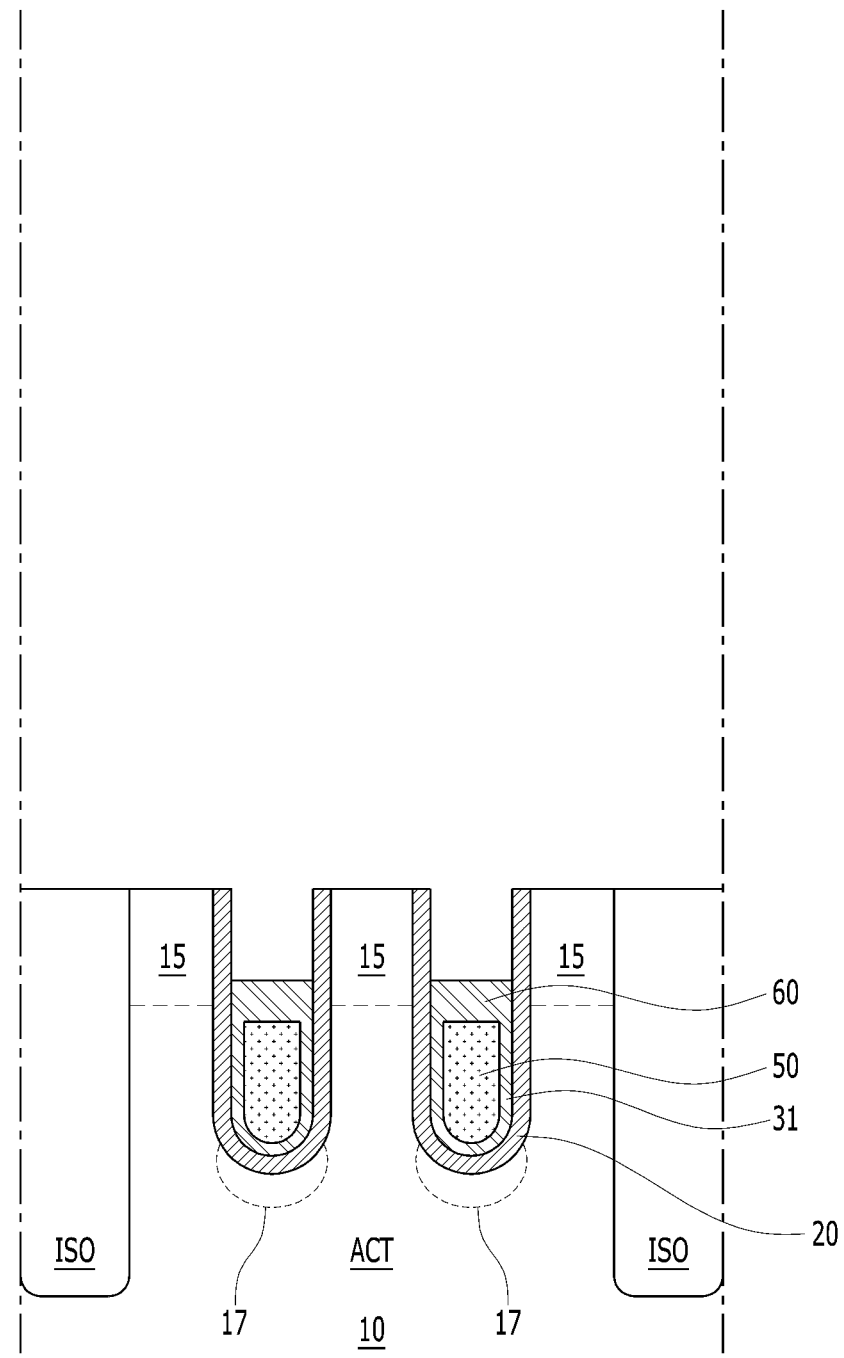

Referring to FIG. 6C, the method may include forming a capping gate electrode 60 and a lower gate electrode 31 in the gate trench Tg by removing the upper portions of the capping gate electrode material layer 60a and the lower gate electrode material layer 31a, respectively, through an etch-back process. The resulting combination of the lower gate electrode 31 and the capping gate electrode 60 may surround the upper gate electrode 50. The lower gate electrode 31 may surround the bottom and the side surfaces of the upper gate electrode 50, while the capping gate electrode 60 may cover the upper surface of the upper gate electrode 50.

Figure 6D:
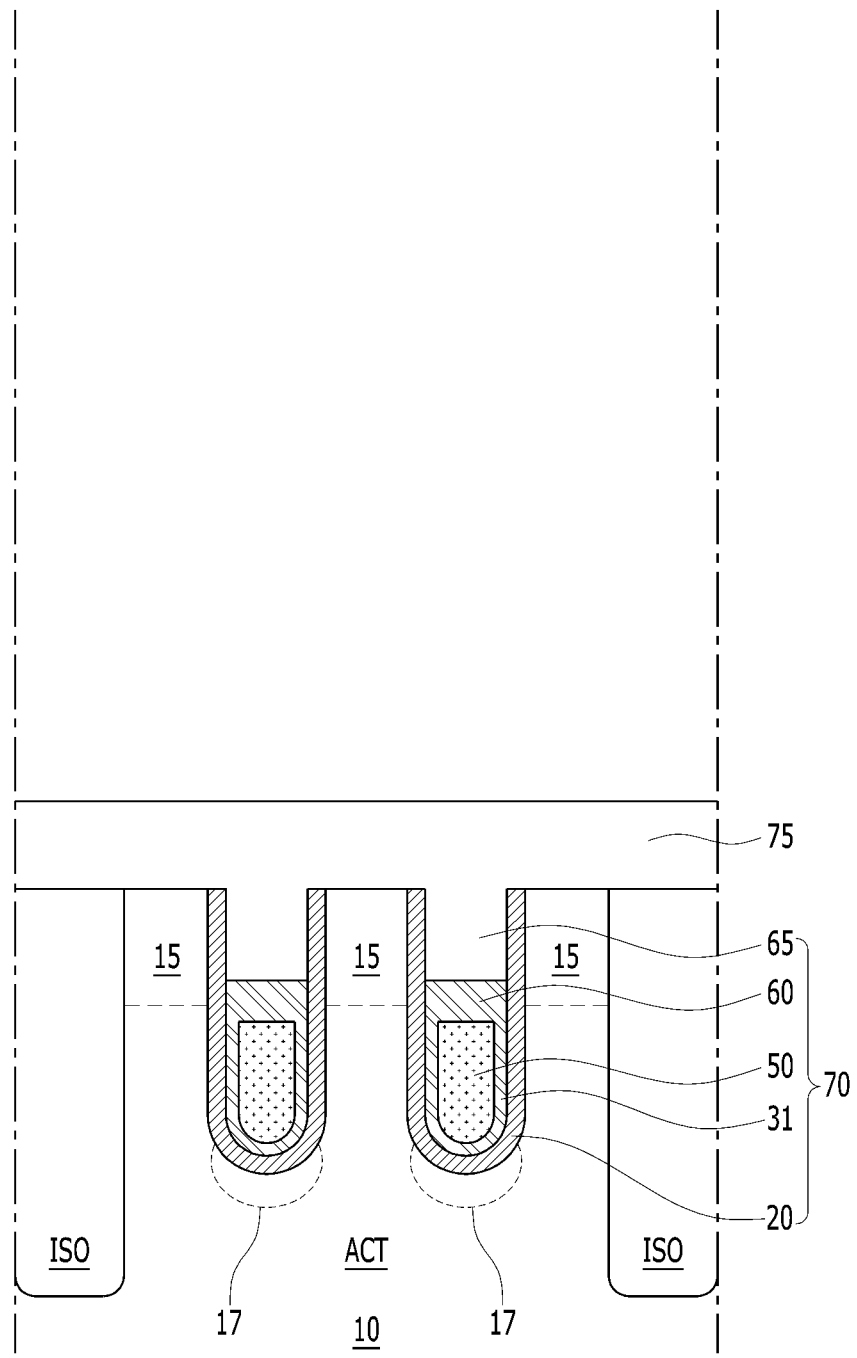

Referring to FIG. 6D, the method may include forming a gate structure 70 by forming a dielectric gate capping layer 65 to fill the gate trench Tg through a deposition process, and forming a lower interlayer dielectric layer 75 to be stacked on the upper surface of the substrate 10. The gate structure 70 may include the gate dielectric layer 20, the cup-like shaped lower gate electrode 31, the upper gate electrode 50, the capping gate electrode 60, and the gate capping layer 65.

Subsequently, the method may include forming a bit line stack 80, forming an intermediate interlayer dielectric layer 89, and forming a storage structure 90, through the series of processes described above and with reference to FIGS. 2K to 2Q. Referring back to FIG. 1E, the method may further include forming an upper interlayer dielectric layer 99 on the storage structure 90.

FIGS. 7A to 7I are cross-sectional views illustrating a method for forming a cryogenic semiconductor device.

Figure 7A:
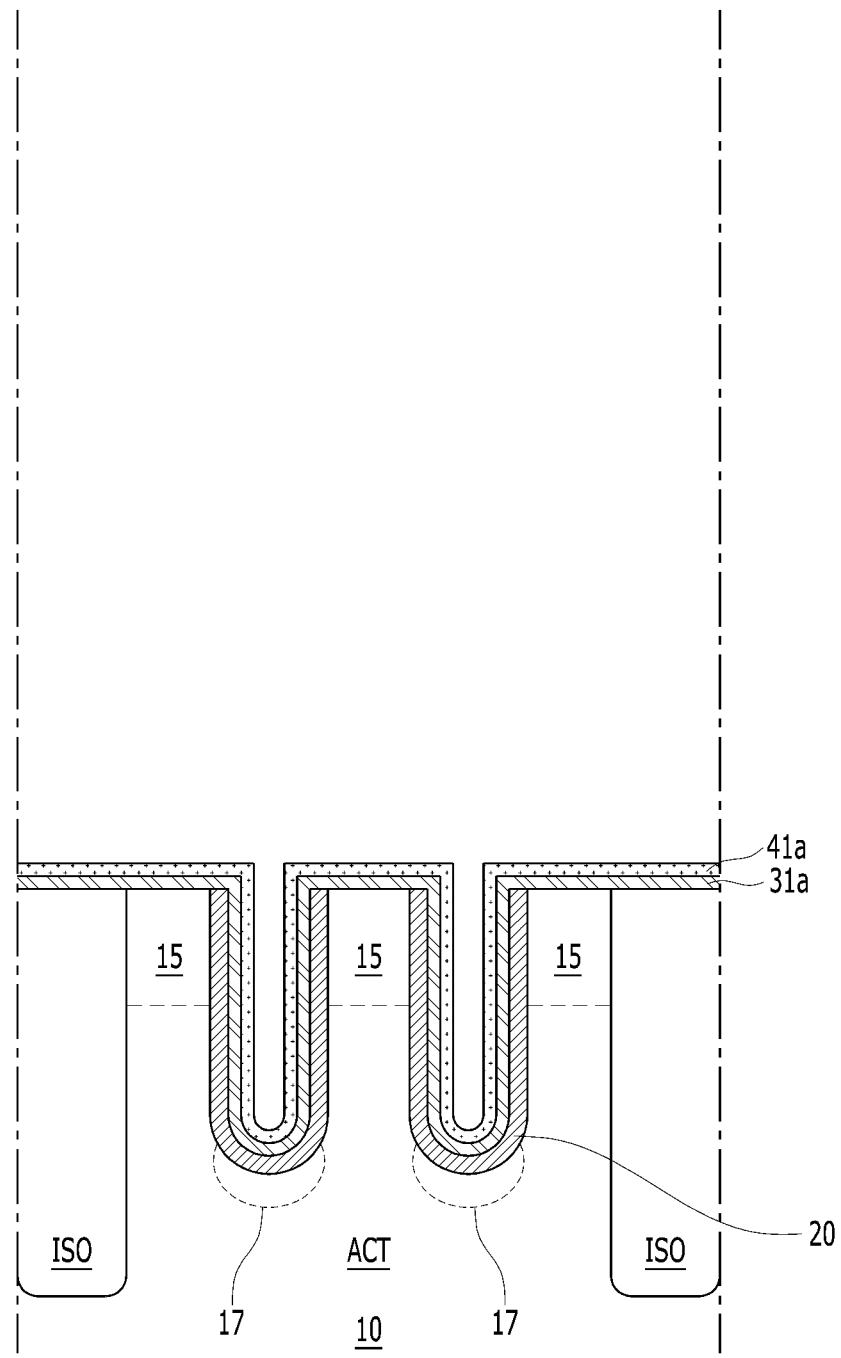

Referring to FIG. 7A, the method may include forming an isolation region ISO that defines an active region ACT in a substrate 10, forming a source/drain region 15, forming a gate trench Tg, forming an ion implantation region 17, forming a gate dielectric layer 20, conformally forming a lower gate electrode material layer 31a in a lining-like shape on the gate dielectric layer 20, and conformally forming an intermediate gate electrode material layer 41a as a lining on the lower gate electrode material layer 31, through the series of processes described above with reference to FIGS. 2A to 2E and 5A. The lower gate electrode material layer 31a may include a conductor having a relatively low work function. For example, the lower gate electrode material layer 31a may include polysilicon doped with an N-type ion. The intermediate gate electrode material layer 41a may include a conductor having a relatively higher work function than the lower gate electrode material layer 31a. For example, the intermediate gate electrode material layer 41a may include a conductor capable of forming an ohmic contact with the lower gate electrode material layer 31a. For example, the intermediate gate electrode material layer 41a may include a barrier metal. Specifically, the intermediate gate electrode material layer 41a may include a titanium nitride (TiN) as an example.

Figure 7B:
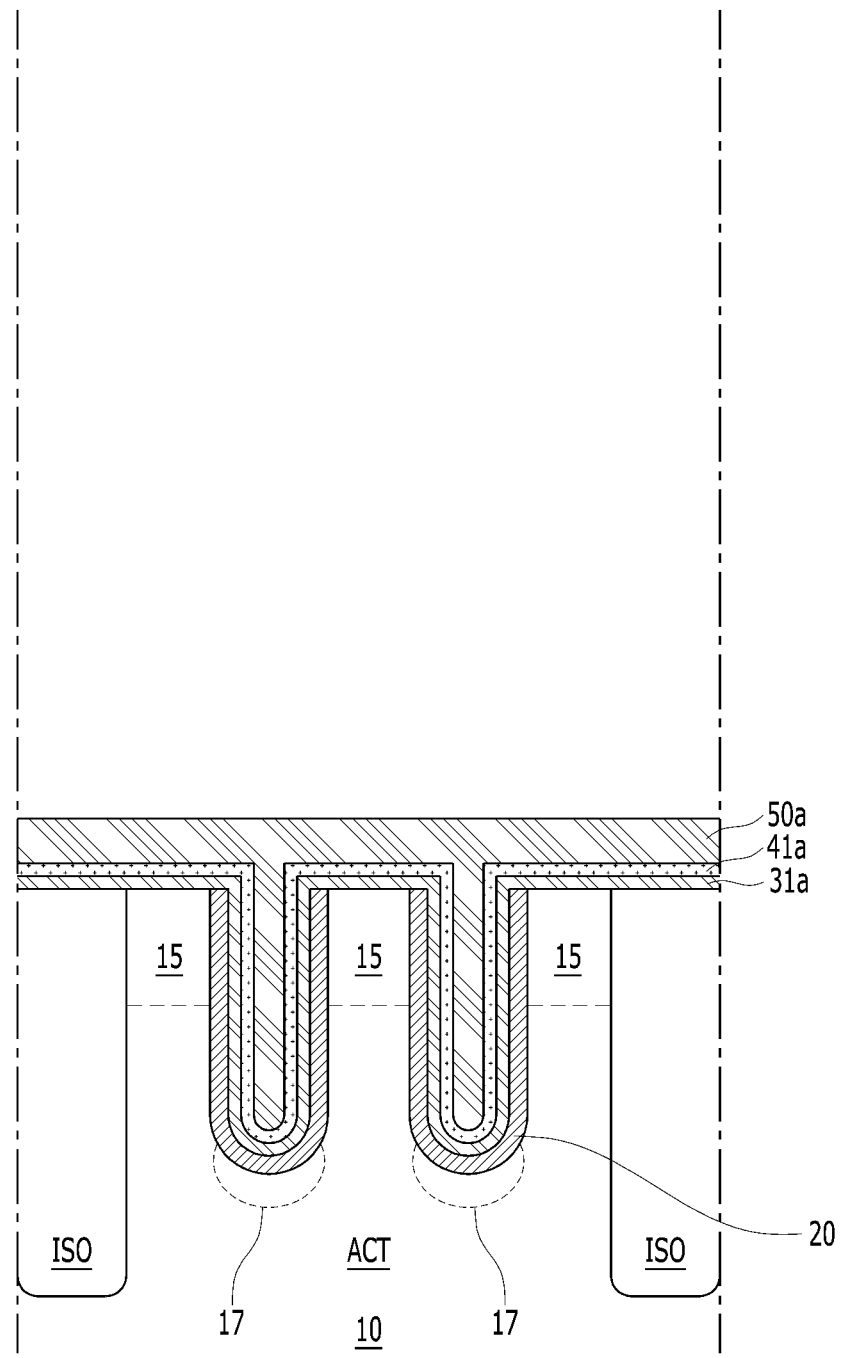

Referring to FIG. 7B, the method device may include forming an upper gate electrode material layer 50a on the intermediate gate electrode material layer 41a to fill the gate trench Tg. The upper gate electrode material layer 50a may include a conductor having a higher work function than the intermediate gate electrode material layer 41a. The upper gate electrode material layer 50a may include a metal, a metal compound, or a metal alloy. Specifically, the upper gate electrode material layer 50a may include tungsten (W), for example.

Figure 7C:
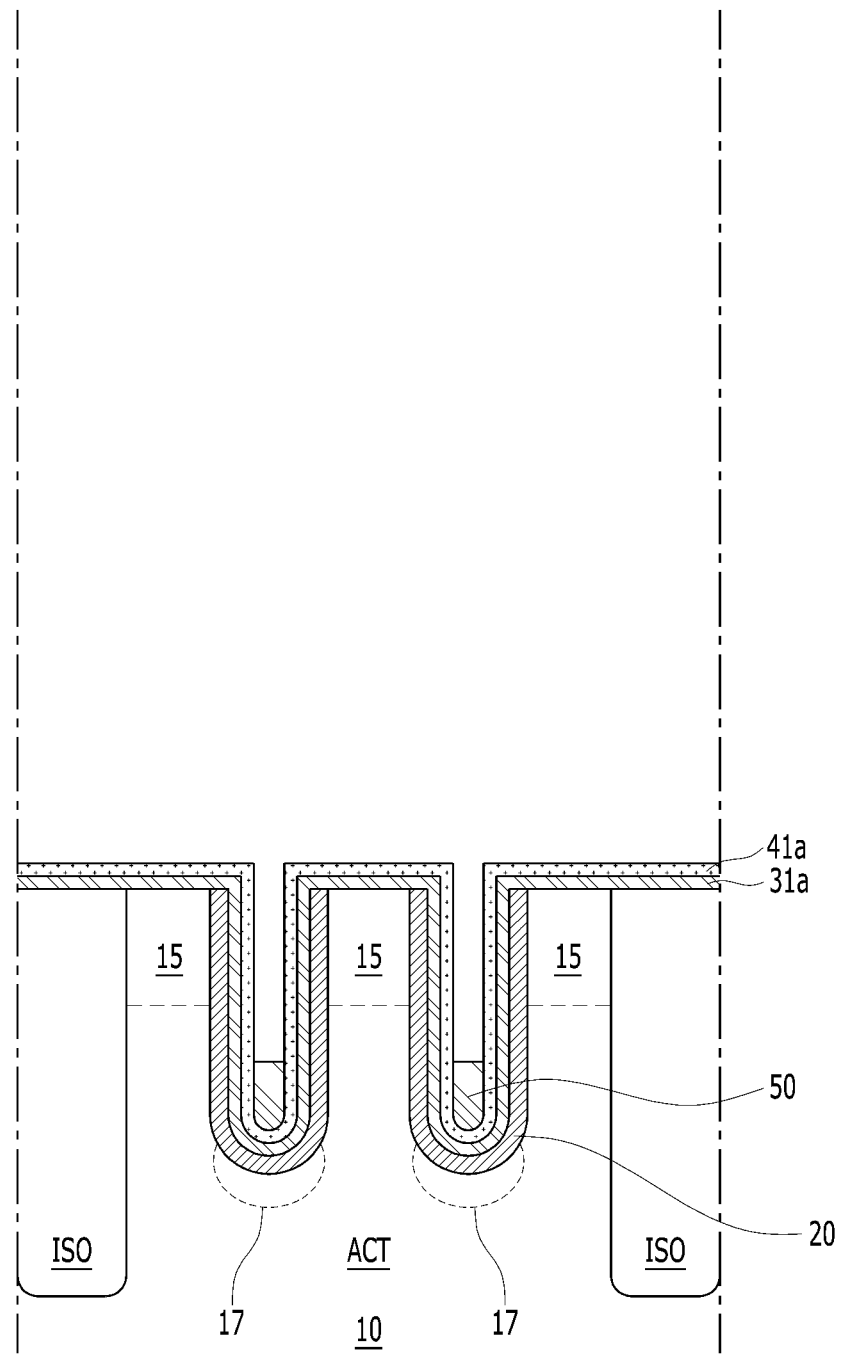

Referring to FIG. 7C, the method may include forming an upper gate electrode 50 in the gate trench Tg by removing the upper portion of the upper gate electrode material layer 50a through an etch-back process. The upper portion of the upper gate electrode material layer 50a is removed so that the upper surface of the upper gate electrode 50 may be located in the gate trench Tg. The upper surface of the upper gate electrode 50 may be located at a lower level than or below the source/drain region 15.

Figure 7D:
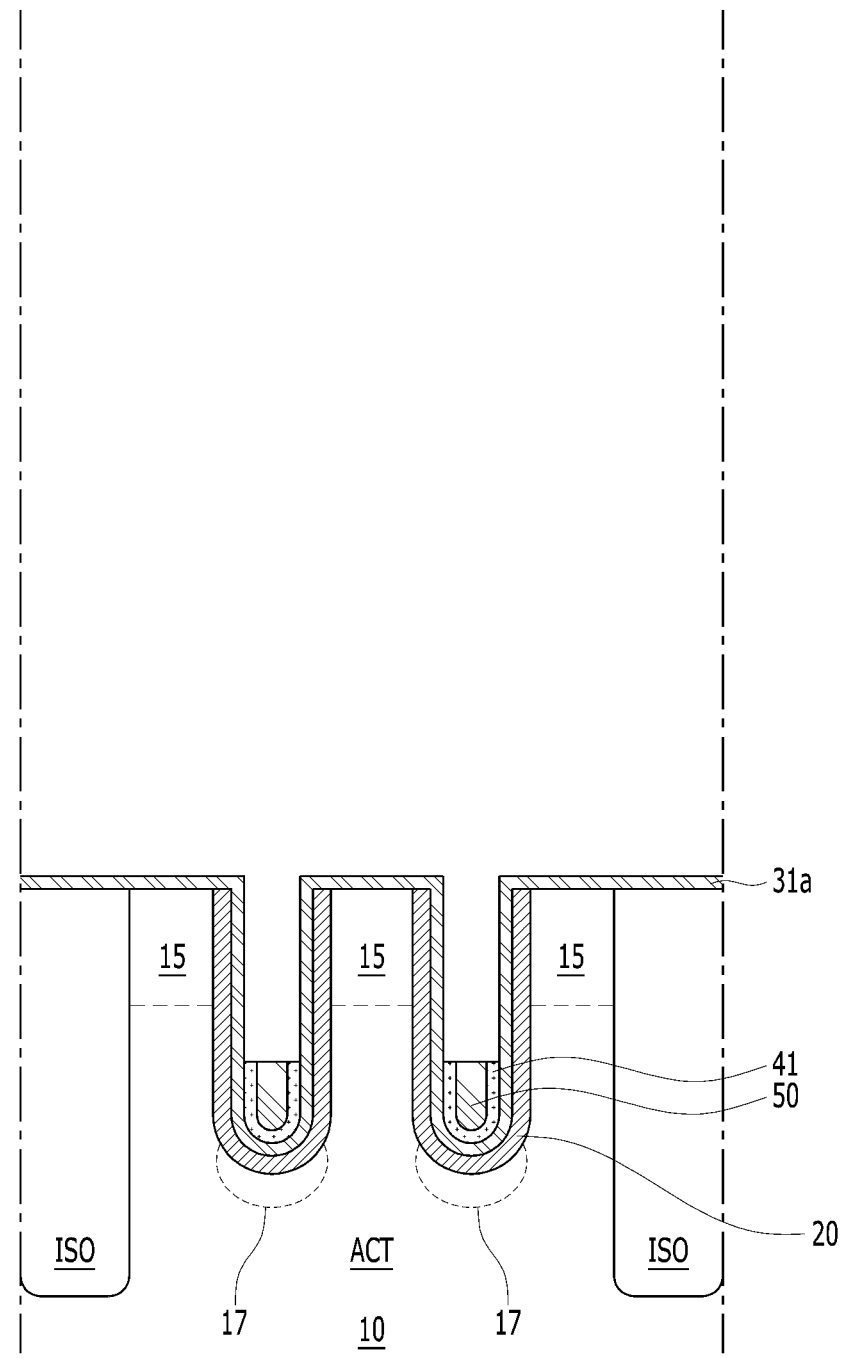

Referring to FIG. 7D, the method may include forming a cup-like shaped intermediate gate electrode 41 to surround the bottom and the side surfaces of the upper gate electrode 50 by removing the upper portion of the intermediate gate electrode material layer 41a through an etch-back process. The upper surface of the intermediate gate electrode 41 may be located at a substantially similar level as the upper surface of the upper gate electrode 50.

Figure 7E:
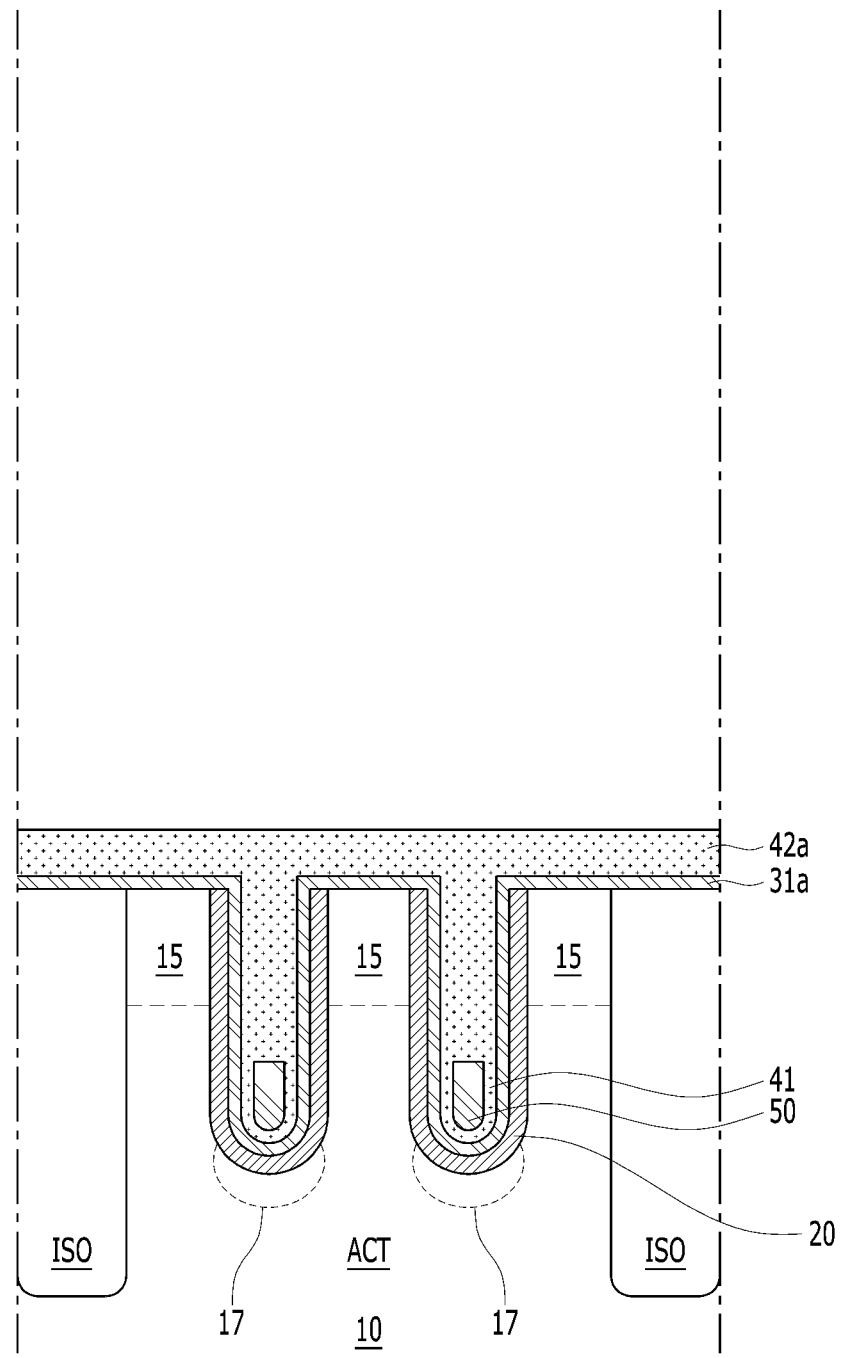

Referring to FIG. 7E, the method may include forming a lower capping gate electrode material layer 42a on the lower gate electrode material layer 31a, the intermediate gate electrode 41 and the upper gate electrode 50 to fill the gate trench Tg. The lower capping gate electrode material layer 42a may include the same material as the intermediate gate electrode 41.

Figure 7F:
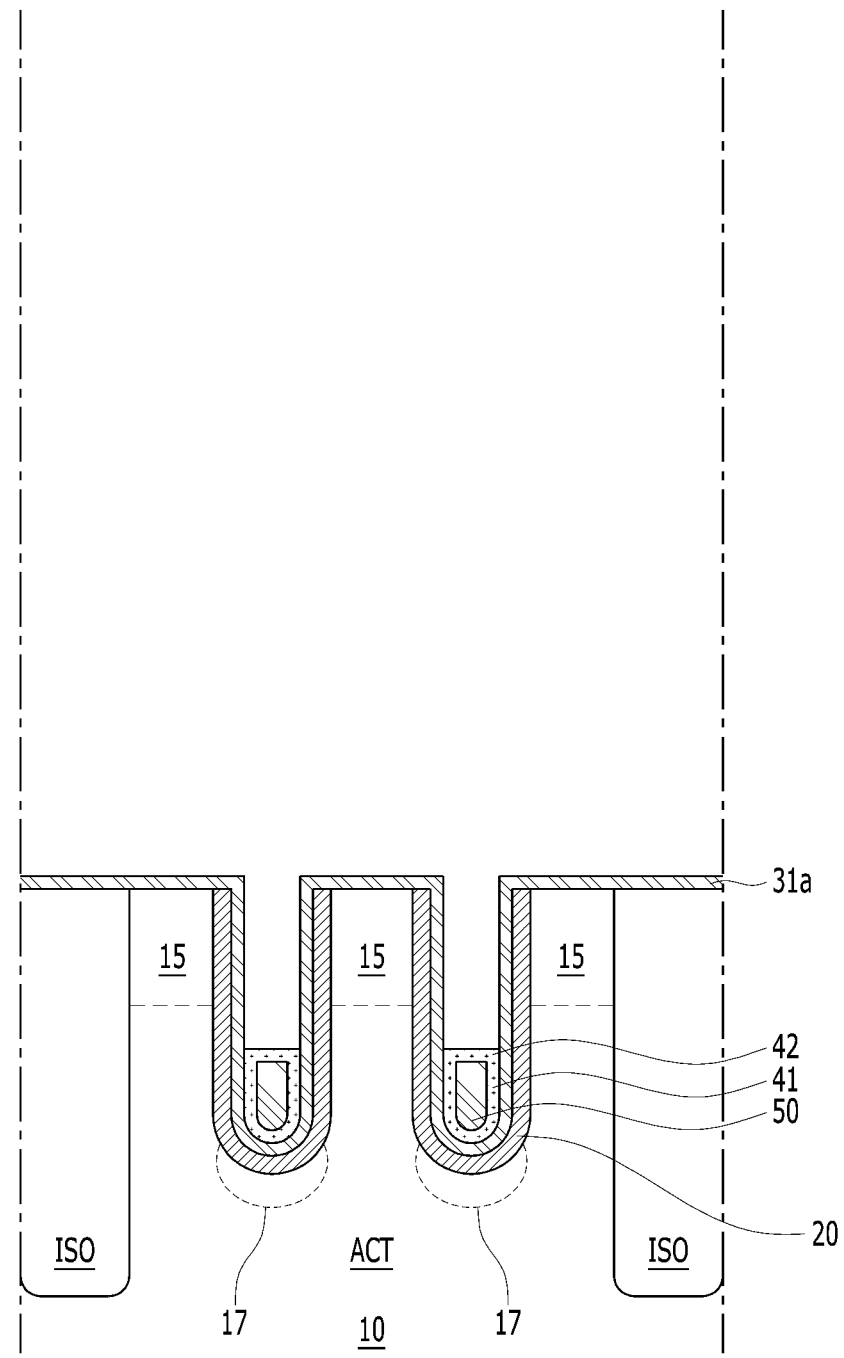

Referring to FIG. 7F, the method may include forming a lower capping gate electrode 42 to cover the upper surface of the upper gate electrode 50 by removing the upper portion of the lower capping gate electrode material layer 42a through an etch-back process. The bottom and side surfaces of the upper gate electrode 50 may be surrounded by the intermediate gate electrode 41, and the upper surface of the upper gate electrode 50 may be covered by the lower capping gate electrode 42. The upper surface of the lower capping gate electrode 42 may be located at a lower level than or below the source/drain region 15.

Figure 7G:
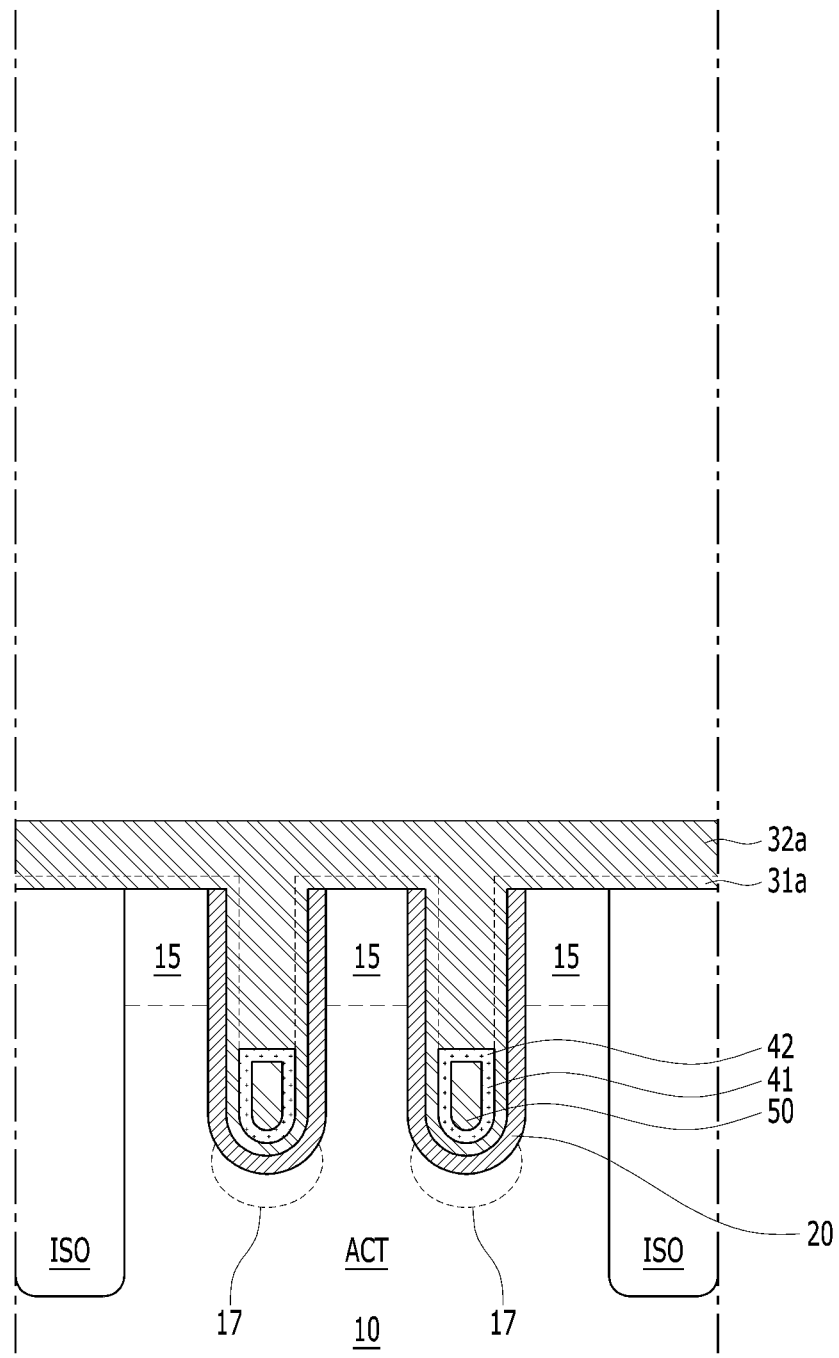

Referring to FIG. 7G, the method may include forming an upper capping gate electrode material layer 32a on the lower gate electrode material layer 31a and the lower capping gate electrode 42 to fill the gate trench Tg. The upper capping gate electrode material layer 32a may include the same material as the lower gate electrode material layer 31a. When the lower gate electrode material layer 31a and the upper capping gate electrode material layer 32a include the same material, an interface between the lower gate electrode material layer 31a and the upper capping gate electrode material layer 32a may be virtually present. Accordingly, the interface between the lower gate electrode material layer 31a and the upper capping gate electrode material layer 32a is indicated by a dotted line in the drawing FIG. 7G.

Figure 7H:
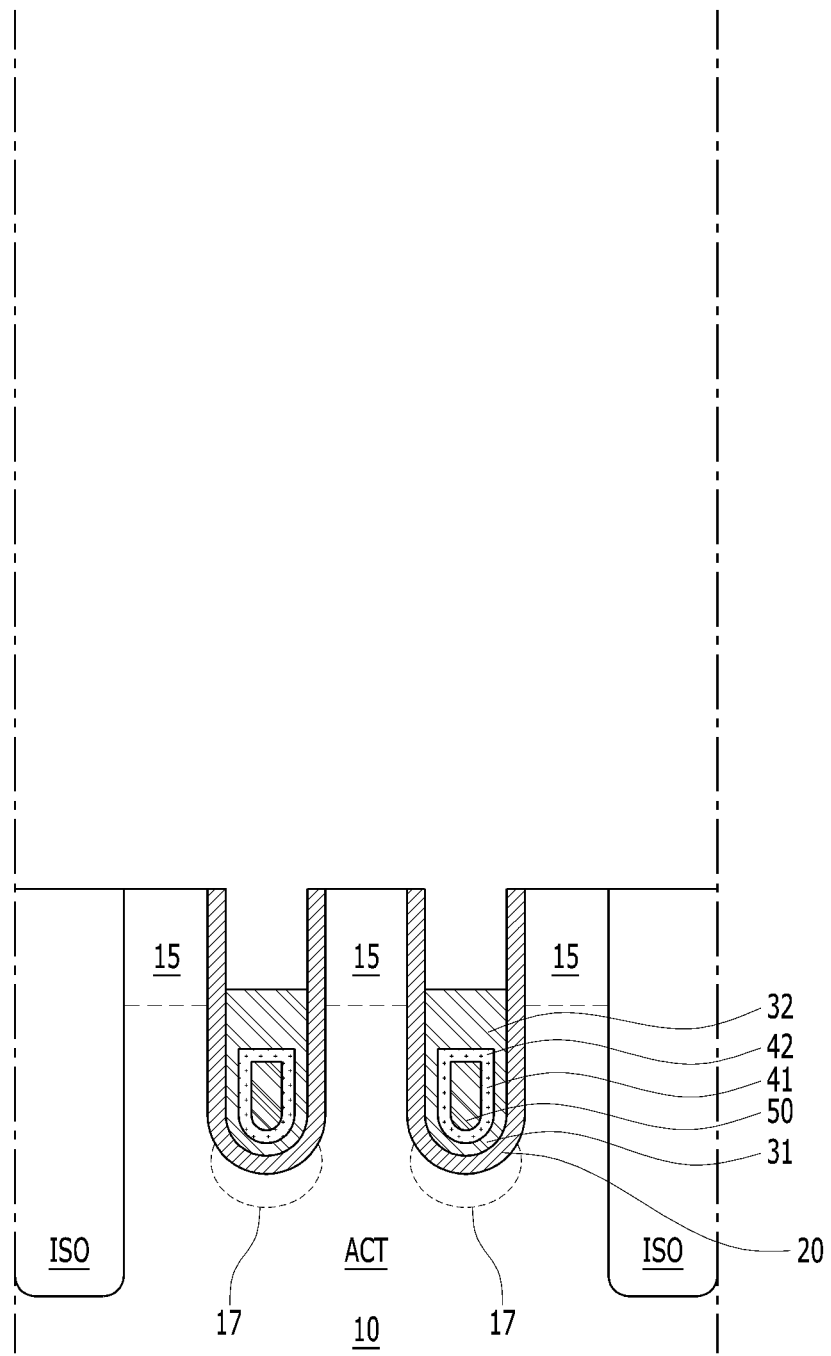

Referring to FIG. 7H, the method may include forming an upper capping gate electrode 32 and a lower gate electrode 31 in the gate trench Tg by removing the upper portions of the upper capping gate electrode material layer 32a and the lower gate electrode material layer 31a, respectively, through an etch-back process. The upper capping gate electrode 32 may cover the upper surface of the lower capping gate electrode 42. The upper surface of the upper capping gate electrode 32 may be located at a higher level than or above the bottom surface or lowermost region of the source/drain region 15.

Figure 7I:
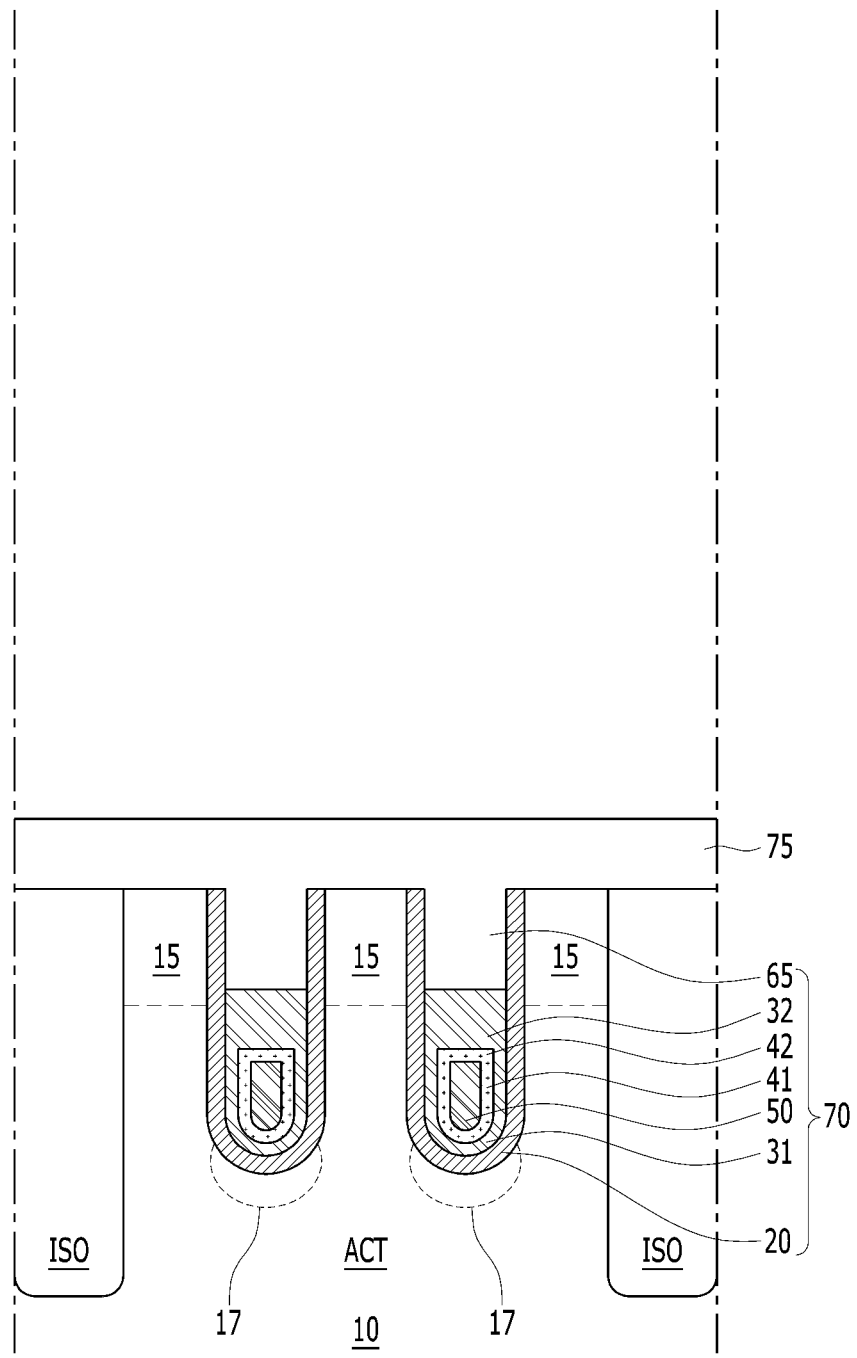

Referring to FIG. 7I, the method may include forming a gate structure 70 by forming a dielectric gate capping layer 65 to fill the gate trench Tg through a deposition process, and forming a lower interlayer dielectric layer 75 to be stacked on the upper surface of the substrate 10. The gate structure 70 may include the gate dielectric layer 20, the cup-like shaped lower gate electrode 31, the cup-shaped intermediate gate electrode 41, the upper gate electrode 50, the lower capping gate electrode 42, the upper capping gate electrode 32, and the gate capping layer 65.

Subsequently, the method may include forming a bit line stack 80, forming an intermediate interlayer dielectric layer 89, and forming a storage structure 90, through the series of processes described above and with reference to FIGS. 2K to 2Q. Referring back to FIG. 1F, the method may further include forming an upper interlayer dielectric layer 99 on the storage structure 90.

Figure 8A:
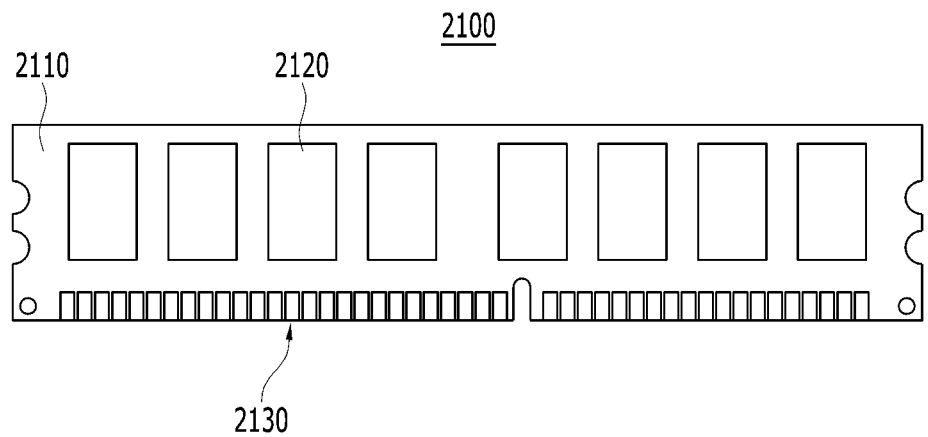
FIG. 8A is a diagram conceptually illustrating a memory module in accordance with an embodiment.

FIG. 8A is a diagram conceptually illustrating a memory module 2100 including the cryogenic semiconductor devices in accordance with the various embodiments.

Referring to FIG. 8A, the memory module 2100 in accordance with an embodiment may include a module substrate 2110, a plurality of cryogenic semiconductor devices 2120 disposed on the module substrate 2110, and a plurality of terminals 2130 arranged on one side of the module substrate 2110. The module substrate 2110 may include a printed circuit board (PCB). The cryogenic semiconductor devices 2120 may include at least one of the cryogenic semiconductor devices 100A to 100F in accordance with the various embodiments based on the inventive concepts of the present disclosure. The plurality of terminals 2130 may include a metal such as copper. Each of the terminals may be electrically coupled to each of the cryogenic semiconductor devices 2120.

Figure 8B:
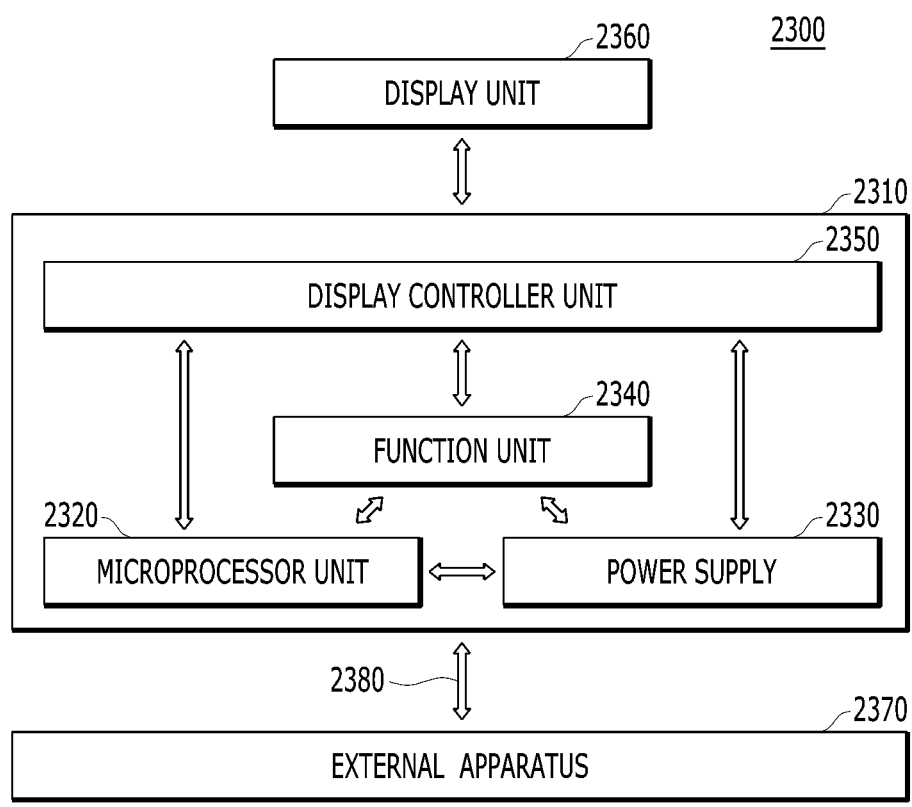
FIGS. 8B and 8C are block diagrams conceptually illustrating electronic systems in accordance with embodiments of the disclosure.

FIG. 8B is a block diagram conceptually illustrating an electronic system 2300 in accordance with an embodiment.

Referring to FIG. 8B, the electronic system 2300 in accordance with the present embodiment may include a body 2310, a display unit 2360, and an external apparatus 2370. The body 2310 may include a microprocessor unit 2320, a power supply unit 2330, a function unit 2340, and/or a display controller unit 2350. The body 2310 may include a system board or mother board having a PCB, and/or a case. The microprocessor unit 2320, the power supply unit 2330, the function unit 2340 and the display controller unit 2350 may be mounted or disposed on or in the body 2310. The display unit 2360 may be disposed on the upper surface of the body 2310 or inside or outside the body 2310. The display unit 2360 may display an image processed by the display controller unit 2350. For example, the display unit 2360 may include a liquid crystal display (LCD), an active matrix organic light emitting diodes (AMOLED), or various display panels. The display unit 2360 may include a touch screen. Accordingly, the display unit 2360 may have an input/output function. The power supply unit 2330 may provide a current or a voltage to the microprocessor unit 2320, the function unit 2340, the display controller unit 2350 and so forth. The power supply unit 2330 may include a chargeable battery, a socket for battery, or a voltage/current converter. The microprocessor unit 2320 may receive a voltage from the power supply unit 2330 to control the function unit 2340 and the display unit 2360. For example, the microprocessor unit 2320 may include a central processing unit (CPU) or an application processor (AP). The function unit 2340 may include a touch pad, a touch screen, volatile/non-volatile memories, a memory card controller, a camera, a light, audio and video playing processors, a wireless transmitting/receiving antenna, a speaker, a microphone, a universal serial bus (USB) port, and other units having various functions. The microprocessor unit 2320 or the function unit 2340 may include at least one of the cryogenic semiconductor devices 100A to 100F in accordance with the various embodiments.

Figure 8C:
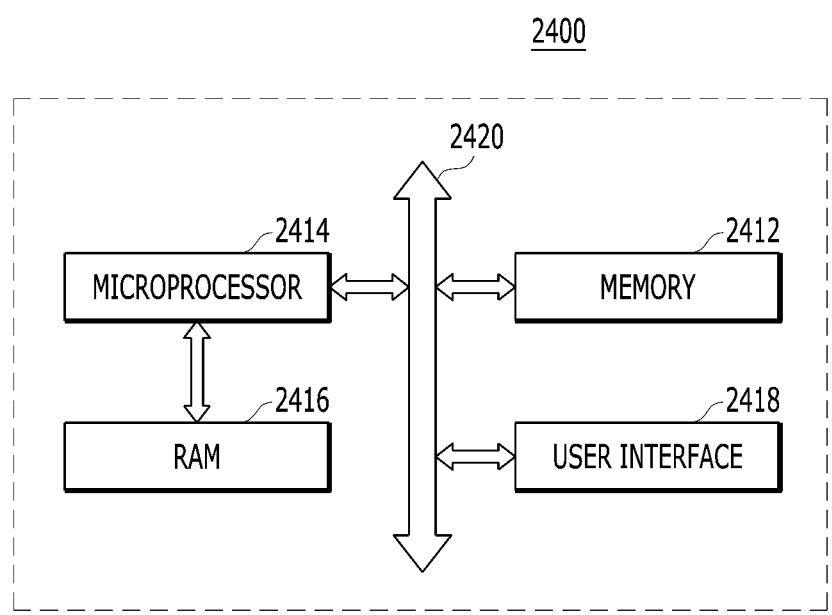

FIG. 8C is a block diagram conceptually illustrating an electronic system 2400 in accordance with an embodiment.

Referring to FIG. 8C, the electronic system 2400 in accordance with the present embodiment may include a microprocessor 2414, a memory system 2412, and a user interface 2418, each performing data communications with one another via an internal bus 2420. The microprocessor 2414 may include a CPU or an AP. The electronic system 2400 may further include a random access memory (RAM) 2416 that directly communicates with the microprocessor 2414. The microprocessor 2414 and/or the RAM 2416 may be assembled in a single package. The user interface 2418 may be used to input or output information to or from the electronic system 2400. For example, the user interface 2418 may include a touch pad, a touch screen, a keyboard, a mouse, a scanner, a voice detector, a cathode ray tube (CRT) monitor, an LCD, an AMOLED, a plasma display panel (PDP), a printer, a light, or various other input/output devices. The memory system 2412 may store operational codes of the microprocessor 2414, data processed by the microprocessor 2414, or external input data. The memory system 2412 may include a memory controller, a hard disk, or a solid state drive (SSD). The microprocessor 2414, the RAM 2416 and/or the memory system 2412 may include at least one of the cryogenic semiconductor devices 100A to 100F in accordance with the various embodiments based on the technical idea of the present disclosure.

The cryogenic semiconductor devices in accordance with the above-described embodiments include the gate electrodes having low work functions for decreasing a threshold voltage, and the ion implantation regions for increasing the threshold voltage. Accordingly, each of the cryogenic semiconductor devices may have a threshold voltage that is appropriately adjusted to have a good operational performance in a cryogenic region.

The cryogenic semiconductor devices in accordance with the above-described embodiments can more excellently operate at a pseudo cryogenic range. The pseudo cryogenic range can be defined at about 77° K+/−7° K. The pseudo cryogenic range man be implemented or established using liquid nitrogen as a relatively cheaper refrigerant.

While the present disclosure has been described with respect to the specific embodiments, it should be noted that the embodiments are for describing, not limiting, the present disclosure. Further, it should be noted that the present disclosure may be achieved in various ways through substitution, change, and modification, by those skilled in the art without departing from the scope of the present disclosure as defined by the following claims.

What is claimed is:

1. A cryogenic semiconductor device comprising:
   isolation regions defining an active region having a first P-type ion concentration in a substrate;
   a gate structure disposed in the substrate; and
   an ion implantation region having a second P-type ion concentration in the active region below the gate structure to increase a threshold voltage of a channel region of the gate structure, wherein the gate structure comprises:
a gate dielectric layer conformally disposed on inner sidewalls of a gate trench;
a lower gate electrode directly disposed on the gate dielectric layer, and an upper gate electrode directly disposed on the lower gate electrode,
wherein:
the lower gate electrode has a relatively lower work function than the upper gate electrode,
the lower gate electrode includes polysilicon doped with an N-type ion for lowering the threshold voltage of the channel region of the gate structure,
the upper gate electrode includes titanium nitride, and
the lower gate electrode has a relatively higher resistance than the upper gate electrode.

2. The cryogenic semiconductor device of claim 1, wherein the lower gate electrode is conformally disposed on the gate dielectric layer in a lining shape.

3. The cryogenic semiconductor device of claim 1, wherein the upper gate electrode fills the gate trench and has a rail-like shape,
wherein side surfaces of the upper gate electrode are directly surrounded by the gate dielectric layer.

4. The cryogenic semiconductor device of claim 1, further comprising a capping gate electrode covering an upper surface of the upper gate electrode,
wherein the capping gate electrode is a conductor and portions of side surfaces of the gate capping layer are directly surrounded by the gate dielectric layer.

5. The cryogenic semiconductor device of claim 4, wherein the capping gate electrode includes a lower capping gate electrode and an upper capping gate electrode disposed on the lower capping gate electrode.

6. The cryogenic semiconductor device of claim 5, wherein the lower capping gate electrode includes a barrier metal, and the upper capping gate electrode includes polysilicon doped with an N-type ion.

7. A cryogenic semiconductor device comprising:
isolation regions defining an active region in a substrate;
a gate structure disposed in the substrate; and
an ion implantation region in the active region below the gate structure to increase a threshold voltage of a channel region of the gate structure,
wherein the gate structure comprises:
a gate dielectric layer conformally disposed on inner sidewalls of a gate trench; and
a lower gate electrode directly disposed on the gate dielectric layer; an intermediate gate electrode directly disposed on the lower gate electrode and an upper gate electrode directly disposed on the intermediate gate electrode,
wherein the lower gate electrode has a relatively lower work function than the intermediate gate electrode,
the intermediate gate electrode has a relatively lower work function than the upper gate electrode, and
the lower gate electrode has a relatively higher resistance than the intermediate gate electrode,
the intermediate gate electrode has a relatively higher resistance than the upper gate electrode,
the lower gate electrode includes polysilicon doped with an N-type ion for lowering the threshold voltage of the channel region of the gate structure,
the intermediate gate electrode includes titanium nitride, and
wherein the upper gate electrode includes a metal.

8. The cryogenic semiconductor device of claim 7, wherein the active region has a relatively low P-type ion concentration, and the ion implantation region has a relatively high P-type ion concentration.

9. The cryogenic semiconductor device of claim 7, wherein the lower gate electrode is conformally disposed to surround a bottom surface and side surfaces of the intermediate gate electrode in a lining shape.

10. The cryogenic semiconductor device of claim 9, wherein the intermediate gate electrode is conformally disposed to surround a bottom surface and side surfaces of the upper gate electrode in a lining shape.

11. The cryogenic semiconductor device of claim 7, further comprising an upper capping gate electrode covering an upper surface of the upper gate electrode,
wherein the upper capping gate electrode and the lower gate electrode include a same material.

12. The cryogenic semiconductor device of claim 11, further comprising a lower capping gate electrode disposed between the upper surface of the upper gate electrode and the upper capping gate electrode,
wherein the lower capping gate electrode includes the same material as the intermediate gate electrode.

13. A cryogenic semiconductor device comprising:
isolation regions defining an active region having a first P-type ion concentration in a substrate;
a gate structure disposed in the substrate; and
an ion implantation region having a second P-type ion concentration in the active region below the gate structure, wherein the ion implantation region increases a threshold voltage of a channel region of the gate structure,
wherein the gate structure comprises:
a gate dielectric layer conformally disposed on inner sidewalls of a gate trench; and
a lower gate electrode directly disposed on the gate dielectric layer;
an upper gate electrode disposed on the lower gate electrode; and
a capping gate electrode disposed on the upper gate electrode,
wherein the lower gate electrode, the upper gate electrode, and the capping gate electrode are conductors.

14. The cryogenic semiconductor device of claim 13, wherein:
the lower gate electrode includes polysilicon doped with and N-type ion, and
the upper gate electrode includes one of a metal, a metal alloy, or a metal compound.

15. The cryogenic semiconductor device of claim 13, wherein the capping gate electrode includes polysilicon doped with an N-type ion.

16. The cryogenic semiconductor device of claim 13,
wherein the capping gate electrode includes a lower capping gate electrode on the upper gate electrode and an upper capping gate electrode on the lower capping gate electrode.

17. The cryogenic semiconductor device of claim 13, wherein:
the lower capping gate electrode includes polysilicon doped with an N-type ion, and
the upper capping gate electrode includes a barrier metal.

18. The cryogenic semiconductor device of claim 13, further comprising an intermediate gate electrode between the lower gate electrode and the upper gate electrode, wherein the intermediate gate electrode includes a barrier metal and the upper gate electrode includes a metal.

19. The cryogenic semiconductor device of claim 13, wherein:

the lower gate electrode decreases the threshold voltage of the channel region of the gate structure.

20. The cryogenic semiconductor device of claim 13, wherein:
the lower gate electrode and the capping gate electrode have relatively higher resistance and work functions the than the upper gate electrode.

* * * * *